US012701758B2

(12) United States Patent
Cha et al.

(10) Patent No.: US 12,701,758 B2
(45) Date of Patent: Aug. 4, 2026

(54) SEMICONDUCTOR DEVICE INCLUDING A FIELD EFFECT TRANSISTOR

(71) Applicant: SAMSUNG ELECTRONICS CO., LTD., Suwon-si (KR)

(72) Inventors: Seungmin Cha, Suwon-si (KR); Jinkyu Kim, Suwon-si (KR); Yunsuk Nam, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 433 days.

(21) Appl. No.: 18/380,711

(22) Filed: Oct. 17, 2023

(65) Prior Publication Data

US 2024/0332358 A1       Oct. 3, 2024

(30) Foreign Application Priority Data

Mar. 31, 2023     (KR) ........................ 10-2023-0042611

(51) Int. Cl.

| | |
|---|---|
| *H10D 62/10* | (2025.01) |
| *H10D 30/43* | (2025.01) |
| *H10D 30/67* | (2025.01) |
| *H10D 62/13* | (2025.01) |
| *H10D 84/85* | (2025.01) |
| *H10W 20/20* | (2026.01) |

(52) U.S. Cl.
CPC ........... *H10D 62/121* (2025.01); *H10D 30/43* (2025.01); *H10D 30/6729* (2025.01); *H10D 30/6735* (2025.01); *H10D 30/6757* (2025.01); *H10D 62/151* (2025.01); *H10D 84/85* (2025.01); *H10W 20/20* (2026.01)

(58) Field of Classification Search
CPC ...... H10D 30/43; H10D 62/151; H10D 84/85; H10D 30/6757; H10D 64/254; H10W 20/20; H10W 20/40; H10W 20/42
USPC ......................................................... 257/288
See application file for complete search history.

(56) References Cited

U.S. PATENT DOCUMENTS

| | | | |
|---|---|---|---|
| 10,700,207 B2 | 6/2020 | Chen et al. | |
| 11,239,208 B2 | 2/2022 | Chuang et al. | |
| 2018/0151576 A1* | 5/2018 | Lee ........................ | H10B 20/34 |
| 2019/0057950 A1 | 2/2019 | Mueller et al. | |
| 2019/0371681 A1 | 12/2019 | Morein | |
| 2021/0391320 A1 | 12/2021 | Wang et al. | |

(Continued)

*Primary Examiner* — Eliseo Ramos Feliciano
*Assistant Examiner* — Mikka Liu
(74) *Attorney, Agent, or Firm* — Morgan, Lewis & Bockius LLP

(57) ABSTRACT

A semiconductor device includes: a first substrate that includes a first region and a second region; an active pattern disposed on the first region; a source/drain pattern disposed on the active pattern; a through contact disposed on the second region; a first metal layer disposed on the through contact; a second substrate disposed on the first metal layer, wherein the second substrate includes an impurity region; a lower bonding pad disposed between the first metal layer and the second substrate; an upper bonding pad disposed on the lower bonding pad; and a power delivery network layer disposed on a bottom surface of the first substrate, wherein the lower bonding pad and the upper bonding pad are in contact with each other, wherein the through contact is connected to the lower bonding pad, and wherein the impurity region is connected to the upper bonding pad.

20 Claims, 54 Drawing Sheets

(56) References Cited

U.S. PATENT DOCUMENTS

| 2022/0113199 A1 | 4/2022 | Su et al. |
| 2022/0293534 A1 | 9/2022 | Hung et al. |
| 2023/0012147 A1* | 1/2023 | Chu ..................... H10D 64/258 |

* cited by examiner

SEMICONDUCTOR DEVICE INCLUDING A FIELD EFFECT TRANSISTOR

CROSS-REFERENCE TO RELATED APPLICATION

This U.S. nonprovisional application claims priority under 35 U.S.C. § 119 to Korean Patent Application No. 10-2023-0042611 filed on Mar. 31, 2023 in the Korean Intellectual Property Office, the disclosure of which is incorporated by reference herein in its entirety.

TECHNICAL FIELD

The present inventive concept relate to a semiconductor device and a method of fabricating the same, and more particularly, to a semiconductor device including a field effect transistor and a method of fabricating the same.

DISCUSSION OF THE RELATED ART

A semiconductor device typically includes an integrated circuit including, for example, metal oxide semiconductor field effect transistors (MOSFETs). As sizes and design rules of the semiconductor device are gradually decreased, sizes of the MOSFETs are also increasingly scaled down. The scale down of MOSFETs may deteriorate operating characteristics of the semiconductor device. Accordingly, methods of fabricating semiconductor devices having increased performance while overcoming limitations caused by relatively high integration of the semiconductor devices have been under development.

SUMMARY

According to an embodiment of the present inventive concept, a semiconductor device includes: a first substrate that includes a first region and a second region; an active pattern disposed on the first region; a source/drain pattern disposed on the active pattern; a through contact disposed on the second region; a first metal layer disposed on the through contact; a second substrate disposed on the first metal layer, wherein the second substrate includes an impurity region; a lower bonding pad disposed between the first metal layer and the second substrate; an upper bonding pad disposed on the lower bonding pad; and a power delivery network layer disposed on a bottom surface of the first substrate, wherein the lower bonding pad and the upper bonding pad are in contact with each other, wherein the through contact is connected to the lower bonding pad, and wherein the impurity region is connected to the upper bonding pad.

According to an embodiment of the present inventive concept, a semiconductor device includes: a first substrate that includes a first region and a second region; an active pattern disposed on the first region; a source/drain pattern disposed on the active pattern; a first through contact and a second through contact disposed on the second region, wherein the first through contact and the second through contact are spaced apart from each other; a first metal layer disposed on the first and second through contacts; a second substrate disposed on the first metal layer, wherein the second substrate includes a first impurity region and a second impurity region, wherein the first impurity region includes impurities having a first conductivity type, and the second impurity region includes impurities having a second conductivity type; a plurality of lower bonding pads disposed between the first metal layer and the second substrate;

a plurality of upper bonding pads disposed on the lower bonding pads; and a power delivery network layer disposed on a bottom surface of the first substrate, wherein the first and second through contacts are electrically connected to the first and second impurity regions, respectively, and wherein the impurities having the first conductivity type are different from the impurities having the second conductivity type.

According to an embodiment of the present inventive concept, a semiconductor device includes: a first power line and a second power line disposed on a first substrate and spaced apart from each other in a first direction, wherein the first and second power lines extend parallel to each other in a second direction; a logic cell and a passive element cell disposed between the first and second power lines and spaced apart from each other in the second direction; a first active pattern and a second active pattern disposed on the logic cell and spaced apart from each other in the first direction; a first channel pattern and a first source/drain pattern disposed on the first active pattern; a second channel pattern and a second source/drain pattern disposed on the second active pattern, wherein the second source/drain pattern has a conductivity type different from a conductivity type of the first source/drain pattern; a gate electrode disposed on the first and second channel patterns; a gate dielectric layer disposed between the gate electrode and the first and second channel patterns; a gate spacer disposed on a sidewall of the gate electrode; a gate capping pattern disposed on the gate electrode; an interlayer dielectric layer that covers the first and second source/drain patterns and the gate capping pattern; an active contact that penetrates the interlayer dielectric layer and are electrically connected to a corresponding one of the first and second source/drain patterns; a gate contact that penetrates the interlayer dielectric layer and the gate capping pattern and is electrically connected to the gate electrode; a first through contact and a second through contact disposed on the passive element cell and respectively connected to the first and second power lines; a second substrate disposed on the first and second through contacts, wherein the second substrate includes a first impurity region and a second impurity region that have different conductivity types from each other; a plurality of lower bonding pads disposed between the second substrate and the first and second through contacts and a plurality of upper bonding pads disposed on the lower bonding pads; and a power delivery network layer disposed on the first substrate, wherein the lower bonding pads are correspondingly in contact with the upper bonding pads, and wherein the first and second through contacts are electrically connected to the first and second impurity regions, respectively, through the lower and upper bonding pads.

BRIEF DESCRIPTION OF DRAWINGS

FIG. 6 illustrates a plan view showing a semiconductor device according to some embodiments of the present inventive concept.

FIGS. 9A, 9B, 9C, 9D, 10A, 10B, 10C, 11A, 11B, 11C, 12A, 12B, 12C, 13A, 13B, 13C, 13D, 13E, 14A, 14B, 14C, 14D, 14E, 15A, 15B, 15C, 15D, 15E, 15F, 16A, 16B, 16C, 16D, 16E, 16F, 17A, and 17B illustrate cross-sectional views showing a method of fabricating a semiconductor device according to some embodiments of the present inventive concept.

DETAILED DESCRIPTION OF EMBODIMENTS

The following will now describe some embodiments of the present inventive concept in conjunction with the accompanying drawings.

Figure 1:
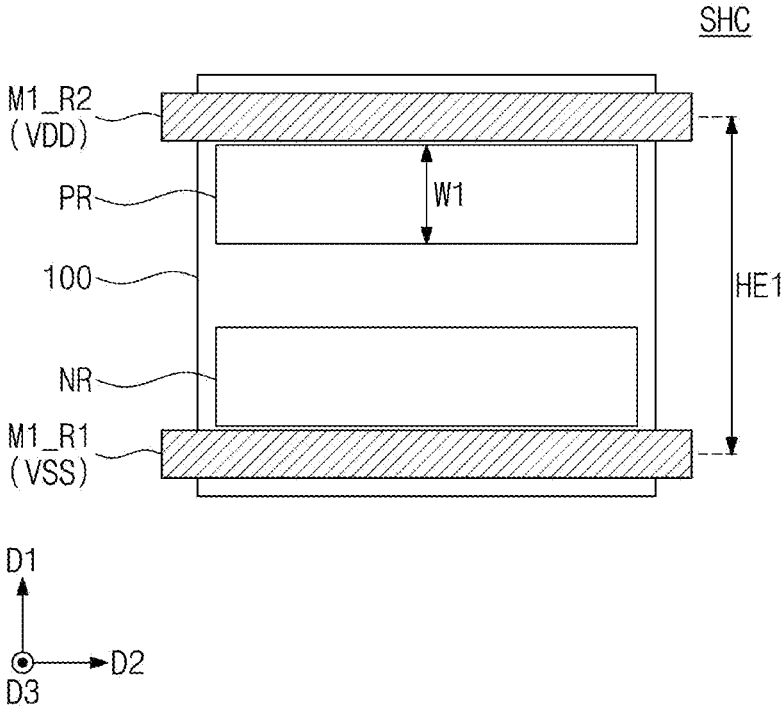
FIGS. 1, 2 and 3 illustrate conceptual diagrams showing logic cells of a semiconductor device according to some embodiments of the present inventive concept.
Figure 2:
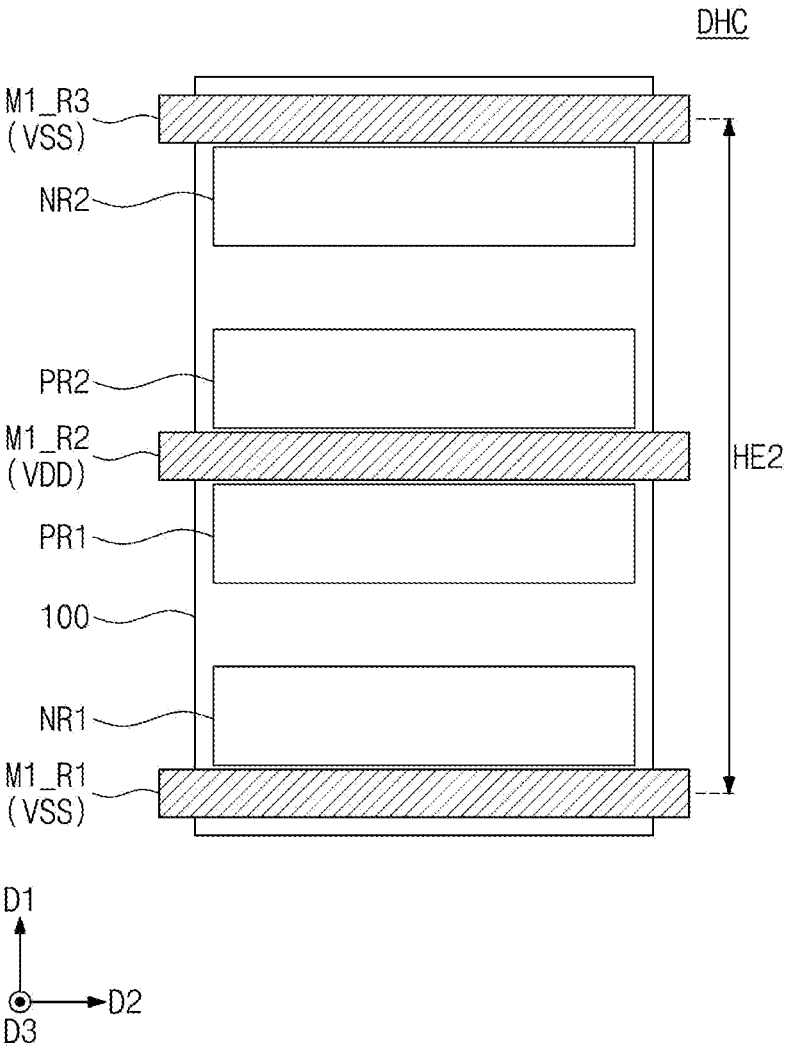
Figure 3:
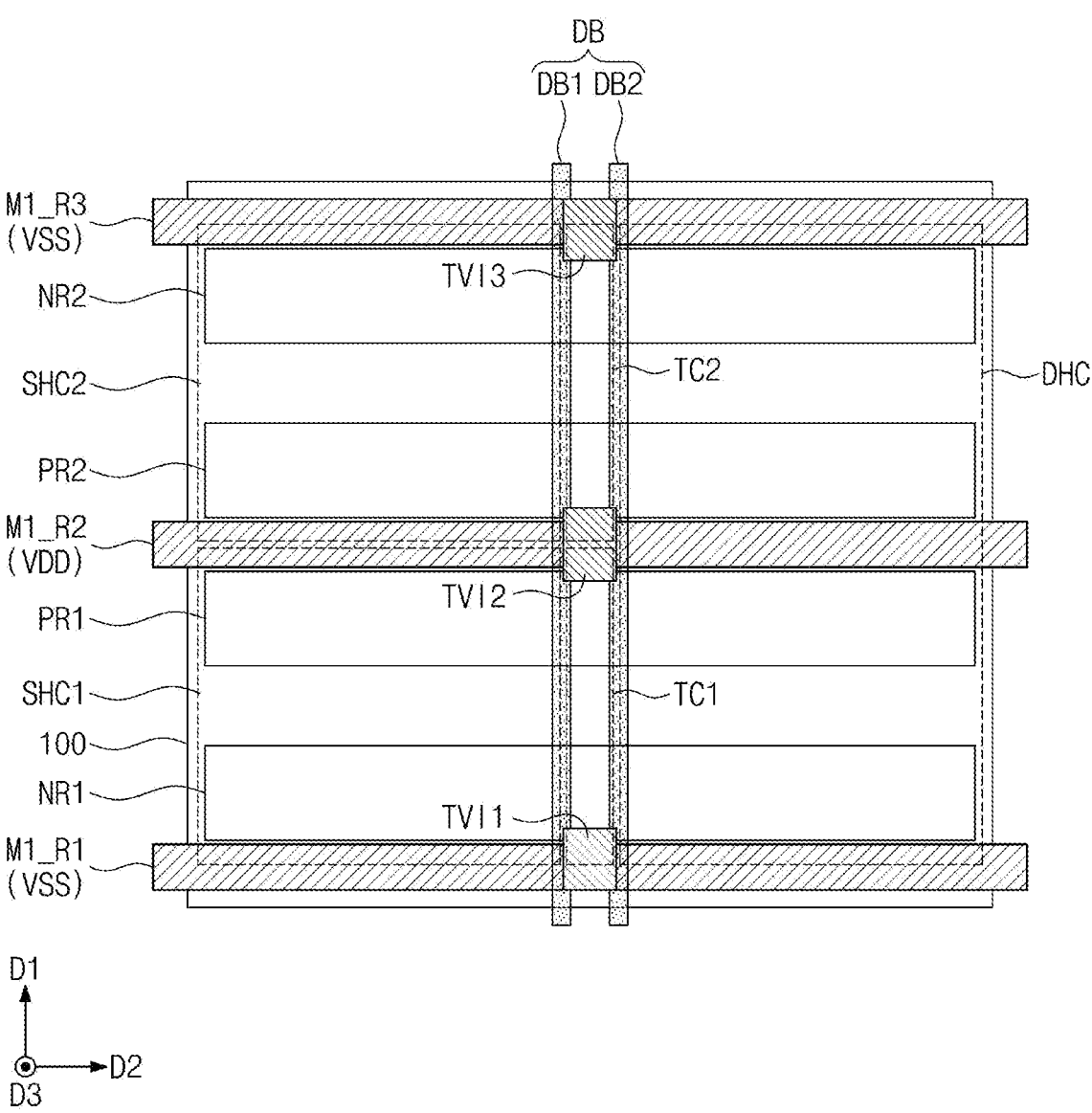

FIGS. 1 to 3 illustrate diagrams showing logic cells of a semiconductor device according to some embodiments of the present inventive concept.

Referring to FIG. 1, a single height cell SHC may be provided. For example, a first power line M1_R1 and a second power line M1_R2 may be provided on a first substrate 100. The first power line M1_R1 may be a path for providing a source voltage VSS, for example, a ground voltage. The second power line M1_R2 may be a path for providing a drain voltage VDD, for example, a power voltage.

The single height cell SHC may be defined between the first power line M1_R1 and the second power line M1_R2. The single height cell SHC may include one PMOSFET region PR and one NMOSFET region NR. For example, the single height cell SHC may have a complementary metal oxide semiconductor (CMOS) structure provided between the first power line M1_R1 and the second power line M1_R2.

Each of the PMOSFET and NMOSFET regions PR and NR may have a first width W1 in a first direction D1. A first height HE1 may be defined to indicate a length in the first direction D1 of the single height cell SHC. The first height HE1 may be substantially the same as a distance (e.g., pitch) between the first power line M1_R1 and the second power line M1_R2.

The single height cell SHC may be one logic cell. In this description, the logic cell may be a logic device, such as AND, OR, XOR, XNOR, and inverter, that performs a specific function. For example, the logic cell may include transistors for forming a logic device, and may also include wiring lines that connect the transistors to each other.

Referring to FIG. 2, a double height cell DHC may be provided. For example, a first substrate 100 may be included in the double height cell DHC with a first power line M1_R1, a second power line M1_R2, and a third power line M1_R3. The second power line M1_R2 may be located between the first power line M1_R1 and the third power line M1_R3. The third power line M1_R3 may be a path for providing a source voltage VSS.

The double height cell DHC may be defined between the first power line M1_R1 and the third power line M1_R3. The double height cell DHC may include a first PMOSFET region PR1, a second PMOSFET region PR2, a first NMOSFET region NR1, and a second NMOSFET region NR2.

The first NMOSFET region NR1 may be closer than the first PMOSFET region PR1 to the first power line M1_R1. The second NMOSFET region NR2 may be closer than the second PMOSFET region PR2 to the third power line M1_R3. The first and second PMOSFET regions PR1 and PR2 may be respectively closer than the first and second NMOSFET regions NR1 and NR2 to the second power line M1_R2. When viewed in plan, the second power line M1_R2 may be disposed between the first and second PMOSFET regions PR1 and PR2.

A second height HE2 may be indicate a length in the first direction D1 of the double height cell DHC. The second height HE2 may be about twice the first height HE1 of FIG. 1. The first and second PMOSFET regions PR1 and PR2 of the double height cell DHC may collectively operate as a single PMOSFET region. Therefore, the double height cell DHC may have a PMOS transistor whose channel size is greater than that of a PMOS transistor included in the single height cell SHC discussed above in FIG. 1.

For example, the channel size of the PMOS transistor included in the double height cell DHC may be about twice that of the PMOS transistor included in the single height cell SHC. In addition, the double height cell DHC may operate at a higher speed than that of the single height cell SHC. In an embodiment of the present inventive concept, the double height cell DHC shown in FIG. 2 may be a multi-height cell. The multi-height cell may include a triple height cell whose cell height is about three times that of the single height cell SHC.

Referring to FIG. 3, a first substrate 100 may be provided thereon with a first single height cell SHC1, a second single height cell SHC2, and a double height cell DHC that are two-dimensionally disposed. The first single height cell SHC1 may be disposed between a first power line M1_R1 and a second power line M1_R2. The second single height cell SHC2 may be disposed between the second power line M1_R2 and a third power line M1_R3. The second single height cell SHC2 may be adjacent in a first direction D1 to the first single height cell SHC1.

The double height cell DHC may be disposed between the first power line M1_R1 and the third power line M1_R3. The double height cell DHC may be adjacent in a second direction D2 to the first and second single height cells SHC1 and SHC2.

A first tap cell TC1 may be provided between the first single height cell SHC1 and the double height cell DHC. A second tap cell TC2 may be provided between the second single height cell SHC2 and the double height cell DHC. The first tap cell TC1 and the second tap cell TC2 may be aligned with each other along the first direction D1.

The first and second tap cells TC1 and TC2 may be cells for applying voltages to the power lines M1_R3 to M1_R3 from a power delivery network which will be discussed below. Unlike a logic cell, a tap cell might not include a logic device. For example, a tap cell may be a kind of dummy cell that performs a function of applying a voltage to a power line and does not perform a circuit function.

As shown in FIG. 3, the first and second tap cells TC1 and TC2 may be disposed between logic cells SHC1, SHC2, and DHC in a cell region on which the logic cells SHC1, SHC2, and DHC are disposed. FIG. 3 depicts by way of example an arrangement relation between the first and second tap cell TC1 and TC2 and the logic cells SHC1, SHC2, and DHC, but the arrangement relation between the tap and logic cells may be variously changed.

In an embodiment of the present inventive concept, a first separation structure DB1 may be provided between the first tap cell TC1 and the first single height cell SHC1 and between the second tap cell TC2 and the second single height cell SHC2. A second separation structure DB2 may be provided between the first tap cell TC1 and the double height cell DHC and between the second tap cell TC2 and the double height cell DHC. The first and second separation structures DB1 and DB2, or a separation structure DB, may electrically separate an active region of the logic cell SHC1, SHC2, or DHC from an active region of the tap cell TC1 or TC2.

The first and second tap cells TC1 and TC2 may include first, second, and third through vias TVI1, TVI2, and TVI3 that are connected to the first, second, and third power lines M1_R1, M1_R2, and M1_R3, respectively. The first, second, and third power lines M1_R1, M1_R2, and M1_R3 may be electrically connected through the first, second, and third through vias TVI1, TVI2, and TVI3, respectively, to a power delivery network below the first substrate 100.

Figure 4:
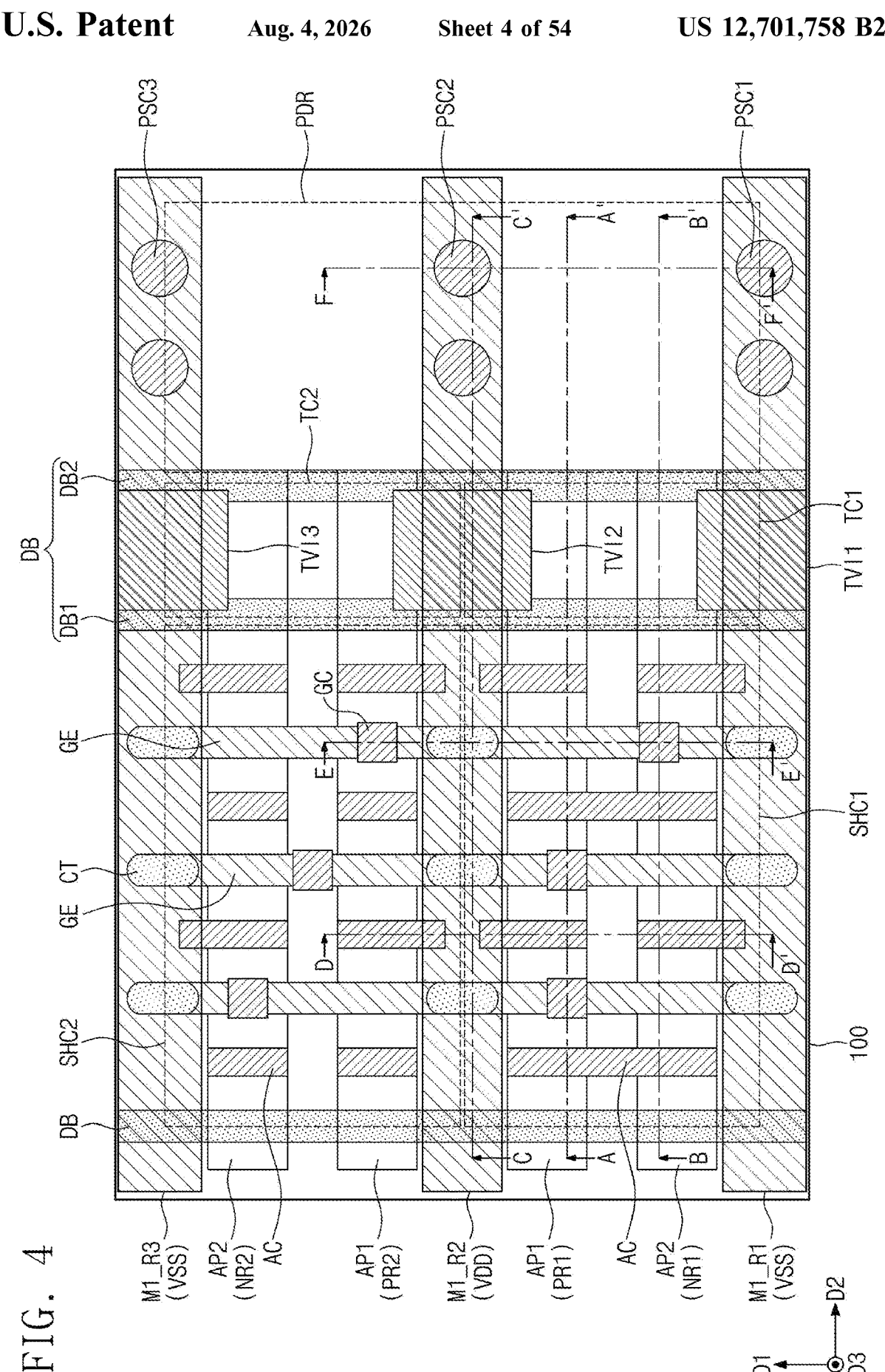
FIG. 4 illustrates a plan view showing a semiconductor device according to some embodiments of the present inventive concept.

FIG. 4 illustrates a plan view showing a semiconductor device according to some embodiments of the present inventive concept. FIGS. 5A, 5B, 5C, 5D, 5E, and 5F illustrate cross-sectional views respectively taken along lines A-A', B-B', C-C', D-D', E-E', and F-F' of FIG. 4. A semiconductor device depicted in FIGS. 4 and 5A to 5F may be an example of the first and second single height cells SHC1 and SHC2 and the first and second tap cells TC1 and TC2 depicted in FIG. 3.

Referring to FIGS. 4 and 5A to 5F, a first substrate 100 may be provided with first and second single height cells SHC1 and SHC2, first and second tap cells TC1 and TC2, and a passive element cell PDR. Each of the first and second single height cells SHC1 and SHC2 may include logic transistors included in a logic circuit. Each of the first and second tap cells TC1 and TC2 may include dummy transistors. The passive element cell PDR may include passive elements. For example, the passive element cell PDR may include a passive element such as a resistor, a capacitor, or an inductor. The passive element cell PDR may include a zone on which are provided through contacts PSC1 to PSC3 and first and second impurity regions HIR1 and HIR2. The first substrate 100 may be, for example, a compound semiconductor substrate or a semiconductor substrate including silicon, germanium, silicon-germanium, etc. For example, the first substrate 100 may be a silicon substrate.

The first substrate 100 may have a first PMOSFET region PR1, a second PMOSFET region PR2, a first NMOSFET region NR1, and a second NMOSFET region NR2. Each of the first PMOSFET region PRI1, the second PMOSFET region PR2, the first NMOSFET region NR1, and the second NMOSFET region NR2 may extend in a second direction D2. The first single height cell SHC1 may include the first NMOSFET region NR1 and the first PMOSFET region PR1, and the second single height cell SHC2 may include the second PMOSFET region PR2 and the second NMOSFET region NR2.

A first active pattern AP1 and a second active pattern AP2 may be defined by a trench TR formed on an upper portion of the first substrate 100. The first active pattern AP1 may be provided on each of the first and second PMOSFET regions PR1 and PR2. The second active pattern AP2 may be provided on each of the first and second NMOSFET regions NR1 and NR2. The first and second active patterns AP1 and AP2 may extend in the second direction D2. The first and second active patterns AP1 and AP2 may be vertically protruding portions of the first substrate 100.

The trench TR may be filled with a device isolation layer ST. The device isolation layer ST may include, for example, a silicon oxide layer. The device isolation layer ST might not cover any of first and second channel patterns CH1 and CH2 which will be discussed below. The device isolation layer ST may extend in the second direction D2 to cover a top surface of the first substrate 100 on the passive element cell PDR.

A first channel pattern CH1 may be provided on the first active pattern AP1. A second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3 that are sequentially stacked. The first, second, and third semiconductor patterns SP1, SP2, and SP3 may be spaced apart from each other in a vertical direction (or, e.g., a third direction D3).

Each of the first, second, and third semiconductor patterns SP1, SP2, and SP3 may include, for example, silicon (Si), germanium (Ge), or silicon-germanium (SiGe). For example, each of the first, second, and third semiconductor patterns SP1, SP2, and SP3 may include crystalline silicon. Each of the first, second, and third semiconductor patterns SP1, SP2, and SP3 may be a nano-sheet.

A plurality of first source/drain patterns SD1 may be provided on the first active pattern AP1. A plurality of first recesses RS1 may be formed on an upper portion of the first active pattern AP1. The first source/drain patterns SD1 may be correspondingly provided in the first recesses RS1. The first source/drain patterns SD1 may be impurity regions having a first conductivity type (e.g., p-type). The first channel pattern CH1 may be interposed between a pair of first source/drain patterns SD1. For example, the pair of first source/drain patterns SD1 may be connected to each other through the stacked first, second, and third semiconductor patterns SP1, SP2, and SP3.

A plurality of second source/drain patterns SD2 may be provided on the second active pattern AP2. A plurality of second recesses RS2 may be formed on an upper portion of the second active pattern AP2. The second source/drain patterns SD2 may be correspondingly provided in the second recesses RS2. The second source/drain patterns SD2 may be impurity regions having a second conductivity type (e.g., n-type). The second channel pattern CH2 may be interposed between a pair of second source/drain patterns SD2. For example, the pair of second source/drain patterns SD2 may be connected to each other through the stacked first, second, and third semiconductor patterns SP1, SP2, and SP3.

The first and second source/drain patterns SD1 and SD2 may be epitaxial patterns formed by a selective epitaxial growth (SEG) process. For example, each of the first and second source/drain patterns SD1 and SD2 may have a top surface located at a level substantially the same as that of a top surface of the third semiconductor pattern SP3. For another example, each of the first and second source/drain patterns SD1 and SD2 may have a top surface located at a higher level than that of a top surface of the third semiconductor pattern SP3.

The first source/drain patterns SD1 may include a semiconductor element (e.g., SiGe) whose lattice constant is greater than that of a semiconductor element of the first substrate 100. Therefore, a pair of first source/drain patterns SD1 may provide the first channel pattern CH1 with compressive stress. The second source/drain patterns SD2 may include the same semiconductor element as that of the first substrate 100.

Each of the first source/drain patterns SD1 may include a buffer layer BFL and a main layer MAL disposed on the buffer layer BFL. Referring back to FIG. 5A, the buffer layer BFL may cover an inner wall of the first recess RS1. The buffer layer BFL may have a U shape along a profile of the first recess RS1.

The buffer layer BFL may occupy a portion of the first recess RS1, and the main layer MAL may fill a portion of the first recess RS1 that is not occupied by the buffer layer BFL. The main layer MAL may have a volume greater than that of the buffer layer BFL. Each of the buffer layer BFL and the main layer MAL may include, for example, silicon-germanium (SiGe). For example, the buffer layer BFL may include germanium whose concentration is relatively low. In an embodiment of the present inventive concept, the buffer layer BFL might not include germanium (Ge), but may include only silicon (Si). The germanium concentration of the buffer layer BFL may range from about 0 at % to about 10 at %.

The main layer MAL may include germanium (Ge) whose concentration is relatively high. For example, the germanium concentration of the main layer MAL may range from about 30 at % to about 70 at %. The germanium concentration of the main layer MAL may increase in the third direction D3. For example, the main layer MAL adjacent to the buffer layer BFL may have a germanium concentration of about 40 at %, and an upper portion of the main layer MAL may have a germanium concentration of about 60 at %.

Each of the buffer layer BFL and the main layer MAL may include impurities (e.g., boron, gallium, or indium) that cause the first source/drain pattern SD1 to have a p-type conductivity. Each of the buffer layer BFL and the main layer MAL may have an impurity concentration of about 1E18 atoms/cm3 to about 5E22 atoms/cm3. The impurity concentration of the main layer MAL may be greater than that of the buffer layer BFL.

The buffer layer BFL may prevent stacking faults between the main layer MAL and the first substrate 100 (or the first active pattern AP1) and between the main layer MAL and the first, second, and third semiconductor patterns SP1, SP2, and SP3. The occurrence of stacking faults may increase a channel resistance. The buffer layer BFL may protect the main layer MAL while second semiconductor layers SAL are replaced with first, second, and third inner electrodes PO1, PO2, and PO3 of a gate electrode GE which will be discussed below. For example, the buffer layer BFL may prevent the main layer MAL from being etched with an etching material that removes the second semiconductor layers SAL.

Each of the second source/drain patterns SD2 may include, for example, silicon (Si). The second source/drain pattern SD2 may further include impurities (e.g., phosphorus, arsenic, or antimony) that cause the second source/drain pattern SD2 to have n-type conductivity. The second source/drain pattern SD2 may have an impurity concentration of about 1E18 atoms/cm3 to about 5E22 atoms/cm3.

Gate electrodes GE may be provided to extend in a first direction D1, while running across the first and second channel patterns CH1 and CH2. The gate electrodes GE may be arranged at a first pitch in the second direction D2. Each of the gate electrodes GE may vertically overlap the first and second channel patterns CH1 and CH2.

The gate electrode GE may include a first inner electrode PO1, which is interposed between the first semiconductor pattern SP1 and the active pattern AP1 or AP2, a second inner electrode PO2, which is interposed between the first semiconductor pattern SP1 and the second semiconductor pattern SP2, a third inner electrode PO3, which is interposed between the second semiconductor pattern SP2 and the third semiconductor pattern SP3, and an outer electrode PO4 on the third semiconductor pattern SP3.

Referring back to FIG. 5E, the gate electrode GE may be provided on a top surface TS, a bottom surface BS, and opposite sidewalls SW of each of the first, second, and third semiconductor patterns SP1, SP2, and SP3. For example, a transistor according to the present embodiment may be a three-dimensional field effect transistor (e.g., MBCFET or GAAFET) in which the gate electrode GE three-dimensionally surrounds the first and second channel patterns CH1 and CH2.

Gate cutting patterns CT may be provided on a boundary between the first and second single height cells SHC1 and SHC2. The gate cutting patterns CT may be arranged at the first pitch along the boundary between the first and second single height cells SHC1 and SHC2. When viewed in plan, the gate cutting patterns CT may be disposed to correspondingly overlap the gate electrodes GE. The gate cutting patterns CT may include a dielectric material, such as a silicon oxide layer, a silicon nitride layer, or a combination thereof.

The gate cutting pattern CT may separate the gate electrode GE that is disposed on the first single height cell SHC1 from the gate electrode GE that is disposed on the second single height cell SHC2. The gate cutting pattern CT may be interposed between the gate electrode GE that is disposed on the first single height cell SHC1 and the gate electrode GE that is disposed on the second single height cell SHC2, and the gate electrodes GE may be aligned with each other in the first direction D1. For example, the gate cutting patterns CT may divide the gate electrode GE, which extends in the first direction D1, into a plurality of gate electrodes GE.

Referring back to FIGS. 4 and 5A to 5F, a pair of gate spacers GS may be provided on opposite sidewalls of the outer electrode PO4 of the gate electrode GE. The gate spacers GS may extend in the first direction D1 along the gate electrode GE. The gate spacers GS may have their top surfaces higher than that of the gate electrode GE. The top surfaces of the gate spacers GS may be substantially coplanar with that of a first interlayer dielectric layer 110 which will be discussed below. The gate spacers GS may include at least one of, for example, SiCN, SiCON, and/or SiN. In addition, the gate spacers GS may each include a multiple layer formed of at least two of, for example, SiCN, SiCON, and/or SiN.

A gate capping pattern GP may be provided on the gate electrode GE. The gate capping pattern GP may extend in the first direction D1 along the gate electrode GE. The gate capping pattern GP may include a material having an etch selectivity with respect to first and second interlayer dielectric layers 110 and 120 which will be discussed below. For example, the gate capping pattern GP may include at least one of SiON, SiCN, SiCON, and/or SiN.

A gate dielectric layer GI may be interposed between the gate electrode GE and the first channel pattern CH1 and between the gate electrode GE and the second channel pattern CH2. The gate dielectric layer GI may cover the top surface TS, the bottom surface BS, and the opposite sidewalls SW of each of the first, second, and third semiconductor patterns SP1, SP2, and SP3. The gate dielectric layer GI may cover a top surface of the device isolation layer ST that is below the gate electrode GE.

In an embodiment of the present inventive concept, the gate dielectric layer GI may include one or more of a silicon oxide layer, a silicon oxynitride layer, and a high-k dielectric layer. The high-k dielectric layer may include a high-k dielectric material whose dielectric constant is greater than that of a silicon oxide layer. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and/or lead zinc niobate.

The gate electrode GE may include a first electrode pattern and a second electrode pattern that is disposed on the first electrode pattern. The first electrode pattern may be provided on the gate dielectric layer GI to be adjacent to the first, second, and third semiconductor patterns SP1, SP2, and SP3. The first electrode pattern may include a work-function metal that adjusts a threshold voltage of a transistor. A thickness and composition of the first electrode pattern may be adjusted to achieve a desired threshold voltage of a transistor. For example, the first, second, and third inner electrodes PO1, PO2, and PO3 of the gate electrode GE may be formed of the first electrode pattern or a work-function metal.

The first electrode pattern may include a metal nitride layer. For example, the first electrode pattern may include nitrogen (N) and at least one of titanium (Ti), tantalum (Ta), aluminum (Al), tungsten (W), and molybdenum (Mo). In addition, the first electrode pattern may further include carbon (C). The first electrode pattern may include a plurality of stacked work-function metal layers.

The second electrode pattern may include metal whose resistance is less than that of the first electrode pattern. For example, the second electrode patterns may include at least one of tungsten (W), aluminum (Al), titanium (Ti) and tantalum (Ta). For example, the outer electrode PO4 of the gate electrode GE may include a first electrode pattern and a second electrode pattern that is disposed on the first electrode pattern.

Figure 5A:
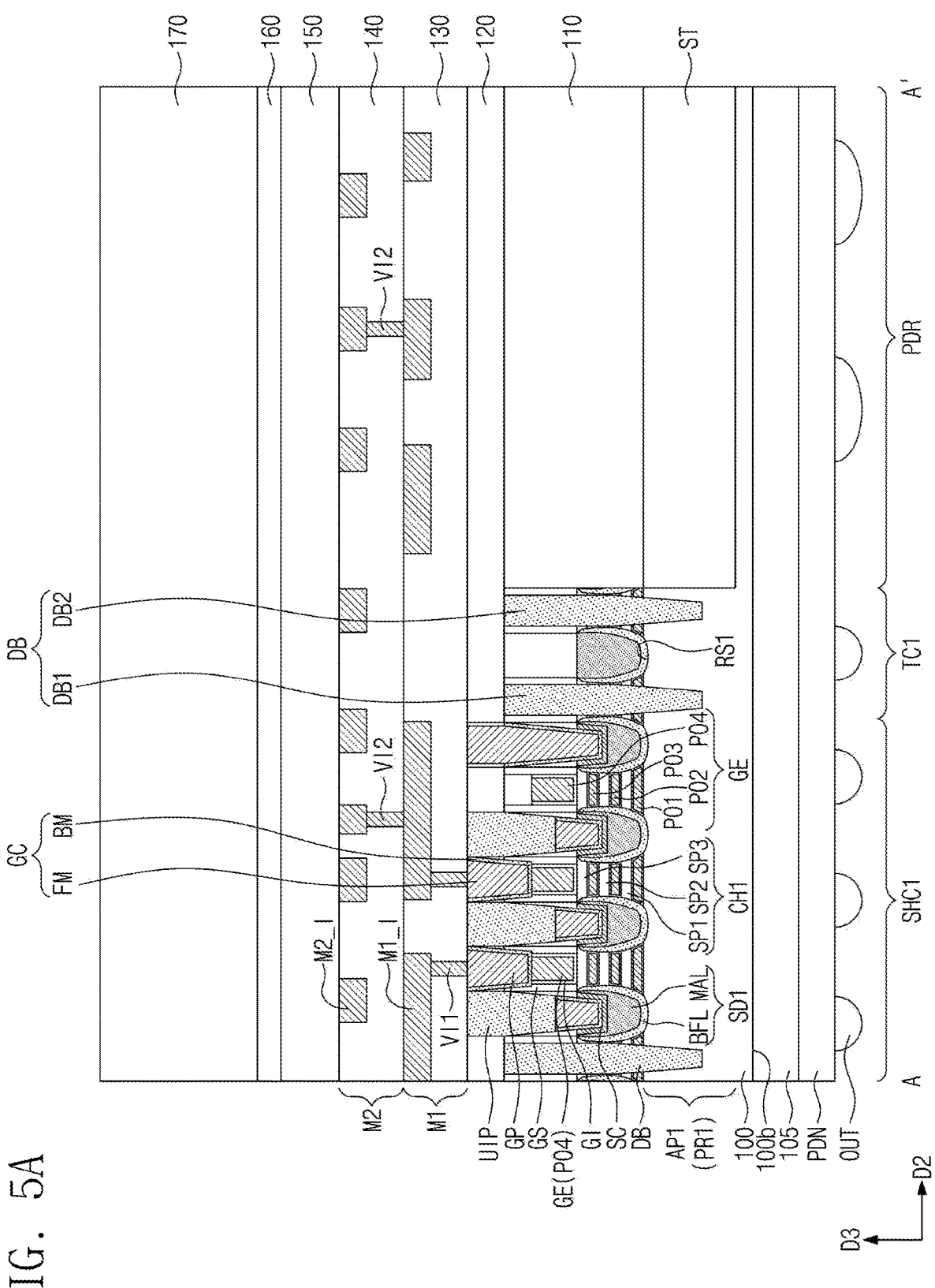
FIGS. 5A, 5B, 5C, 5D, 5E, and 5F illustrate cross-sectional views respectively taken along lines A-A', B-B', C-C', D-D', E-E', and F-F' of FIG. 4.
Figure 5B:
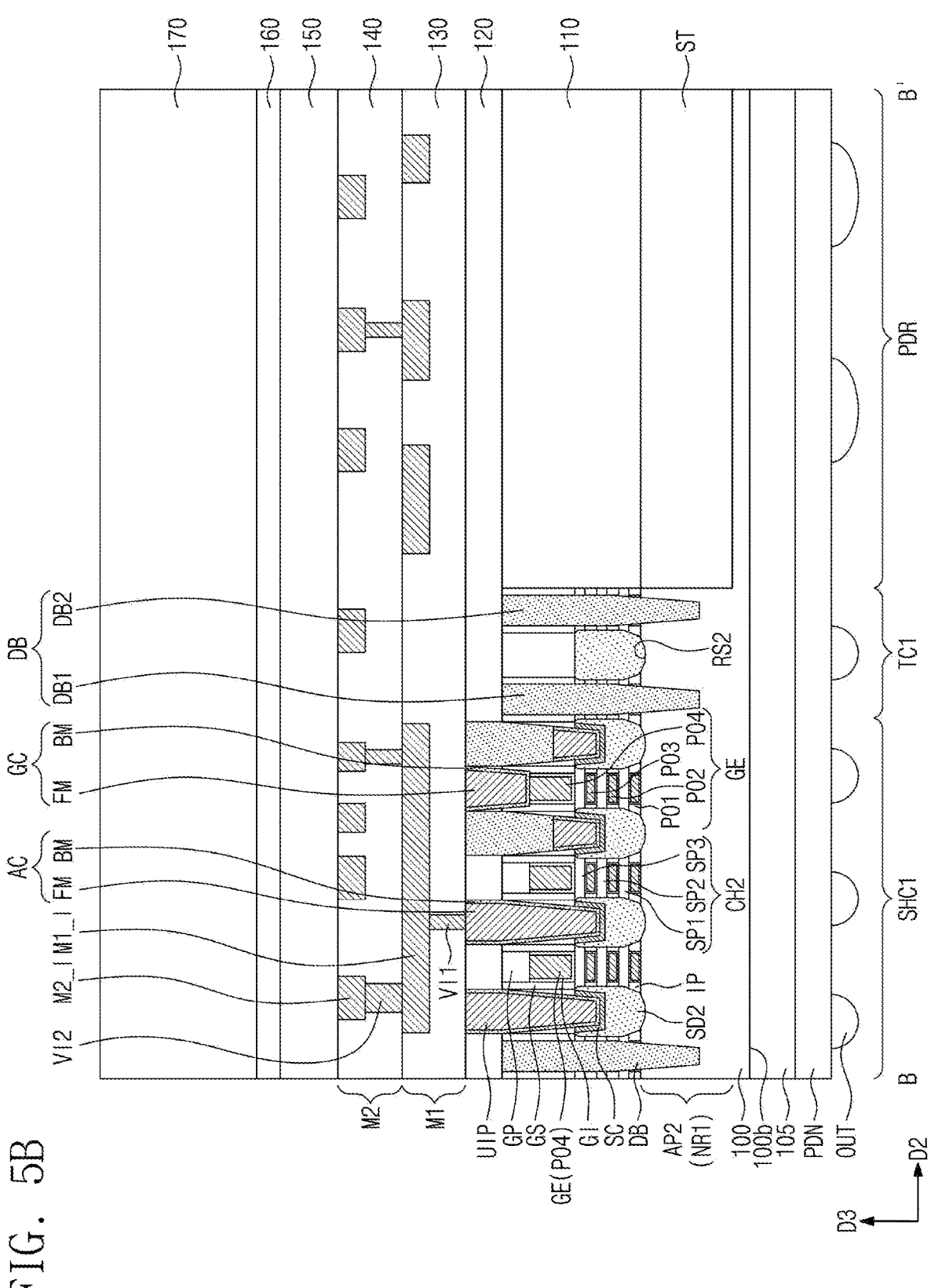

Referring to FIG. 5B, inner spacers IP may be provided on the first and second NMOSFET regions NR1 and NR2. For example, the inner spacers IP may be provided on the second active pattern AP2. The inner spacers IP may be correspondingly interposed between the second source/drain pattern SD2 and the first, second, and third inner electrodes PO1, PO2, and PO3 of the gate electrode GE. For example, the inner spacers IP may be in direct contact with the second source/drain pattern SD2. The inner spacer IP may separate the second source/drain pattern SD2 from each of the first, second, and third inner electrodes PO1, PO2, and PO3 of the gate electrode GE.

A first interlayer dielectric layer 110 may be provided on the first substrate 100. The first interlayer dielectric layer 110 may cover the gate spacers GS and the first and second source/drain patterns SD1 and SD2. The first interlayer dielectric layer 110 may have a top surface that is substantially coplanar with that of the gate capping pattern GP and that of the gate spacer GS. The first interlayer dielectric layer 110 may extend in the second direction D2 to cover the top surface of the device isolation layer ST on the passive element cell PDR.

The first interlayer dielectric layer 110 may be provided with a second interlayer dielectric layer 120 that covers the gate capping pattern GP. A third interlayer dielectric layer 130 may be provided on the second interlayer dielectric layer 120. A fourth interlayer dielectric layer 140 may be provided on the third interlayer dielectric layer 130. The second, third, and fourth interlayer dielectric layers 120, 130, and 140 may extend in the second direction D2 to preside on the passive element cell PDR. For example, the first to fourth interlayer dielectric layers 110 to 140 may include a silicon oxide layer.

Separation structures DB may be correspondingly provided on boundaries between cells. For example, a first separation structure DB1 may be provided between the first single height cells SHC1 and the first tap cells TC1 and between the second single height cells SHC2 and the second tap cells TC2. A second separation structure DB2 may be provided between the passive element cell PDR and the first and second tap cells TC1 and TC2. Each of the first and second tap cells TC1 and TC2 may be provided between a pair of separation structures DB1 and DB2.

The first and second separation structures DB1 and DB2, or a separation structure DB, may extend in the first direction D1 parallel to the gate electrodes GE. A pitch between the separation structure DB and its adjacent gate electrode GE may be the same as the first pitch. In an embodiment of the present inventive concept, a width in the second direction D2 of each of the first and second tap cells TC1 and TC2 may be substantially the same as the first pitch.

The separation structure DB may penetrate the gate capping pattern GP and the gate electrode GE to extend into the first and second active patterns AP1 and AP2. The separation structure DB may penetrate an upper portion of each of the first and second active patterns AP1 and AP2. The separation structure DB may electrically separate an active region of one cell from an active region of another cell adjacent to the one cell.

Active contacts AC may be provided to penetrate the first and second interlayer dielectric layers 110 and 120 to come into electrical connection with the first and second source/drain patterns SD1 and SD2. A pair of active contacts AC may be correspondingly provided on opposite sides of the gate electrode GE. When viewed in plan, the active contact AC may have a bar shape or rectangular shape that extends in the first direction D1.

The active contact AC may be a self-aligned contact. For example, the gate capping pattern GP and the gate spacer GS may be used to form the active contact AC in a self-alignment manner. The active contact AC may cover, for example, at least a portion of a sidewall of the gate spacer GS. The active contact AC may cover a portion of the top surface of the gate capping pattern GP.

A metal-semiconductor compound layer SC, such as a silicide layer, may be interposed between the active contact AC and the first source/drain pattern SD1 and between the active contact AC and the second source/drain pattern SD2. The active contact AC may be electrically connected through the metal-semiconductor compound layer SC to one of the first and second source/drain patterns SD1 and SD2. For example, the metal-semiconductor compound layer SC may include at least one of, for example, titanium silicide, tantalum silicide, tungsten silicide, nickel silicide, and/or cobalt silicide.

Gate contacts GC may be provided to penetrate the second interlayer dielectric layer 120 and the gate capping pattern GP to come into electrical connection with the gate electrodes GE. When viewed in plan, two gate contacts GC on the first single height cell SHC1 may be disposed to overlap the first PMOSFET region PR1. For example, two gate contacts GC on the first single height cell SHC1 may be provided on the first active pattern AP1 (see FIG. 5A). When viewed in plan, one gate contact GC on the first single height cell SHC1 may be disposed to overlap the first NMOSFET region NR1. For example, one gate contact GC on the first single height cell SHC1 may be provided on the second active pattern AP2 (see FIG. 5B).

The gate contact GC may be freely located with no limitation of position on the gate electrode GE. For example, the gate contacts GC on the second single height cell SHC2 may be correspondingly disposed on the second PMOSFET region PR2, the second NMOSFET region NR2, and the device isolation layer ST that fills the trench TR (see FIG. 4).

Figure 5C:
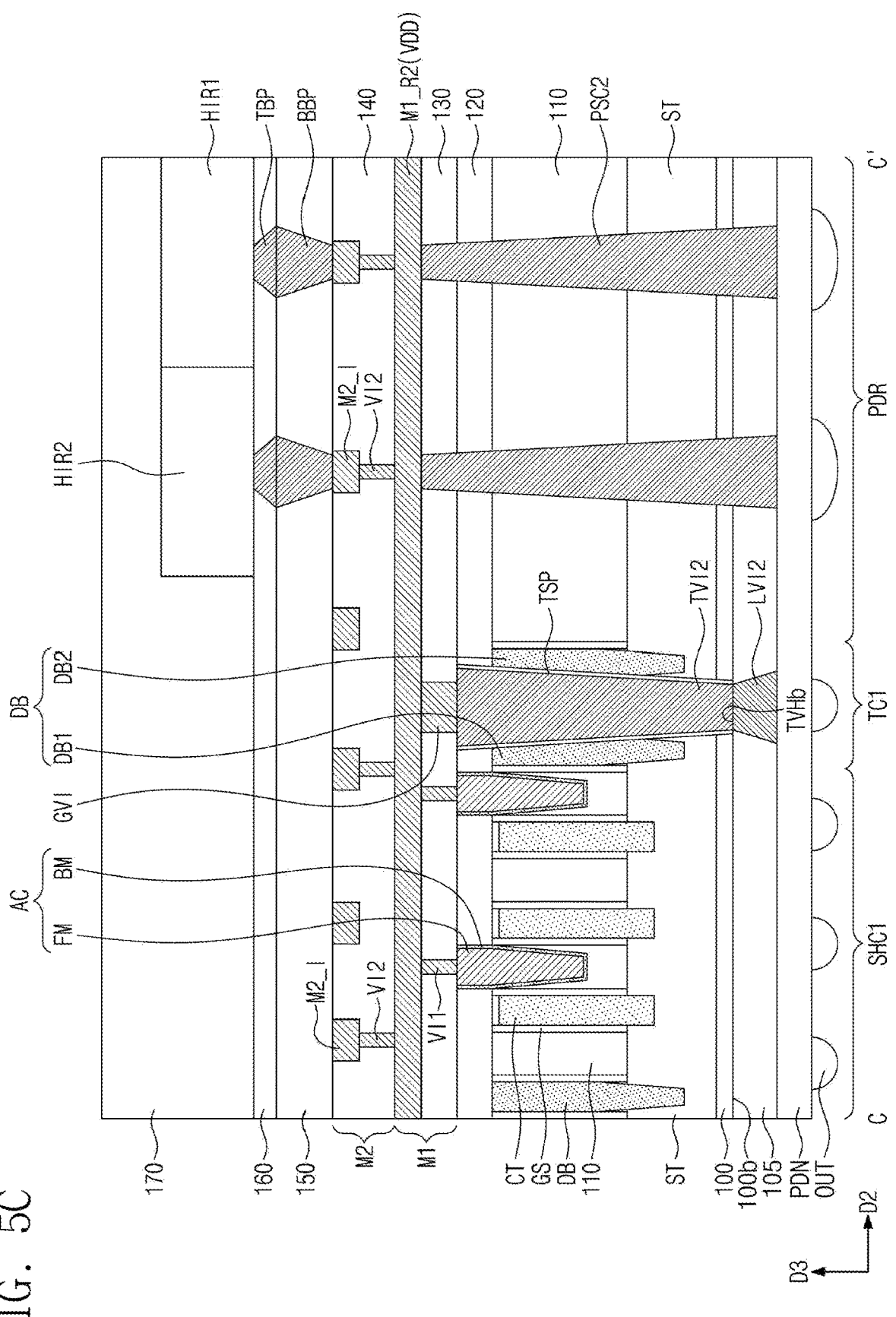
Figure 5D:
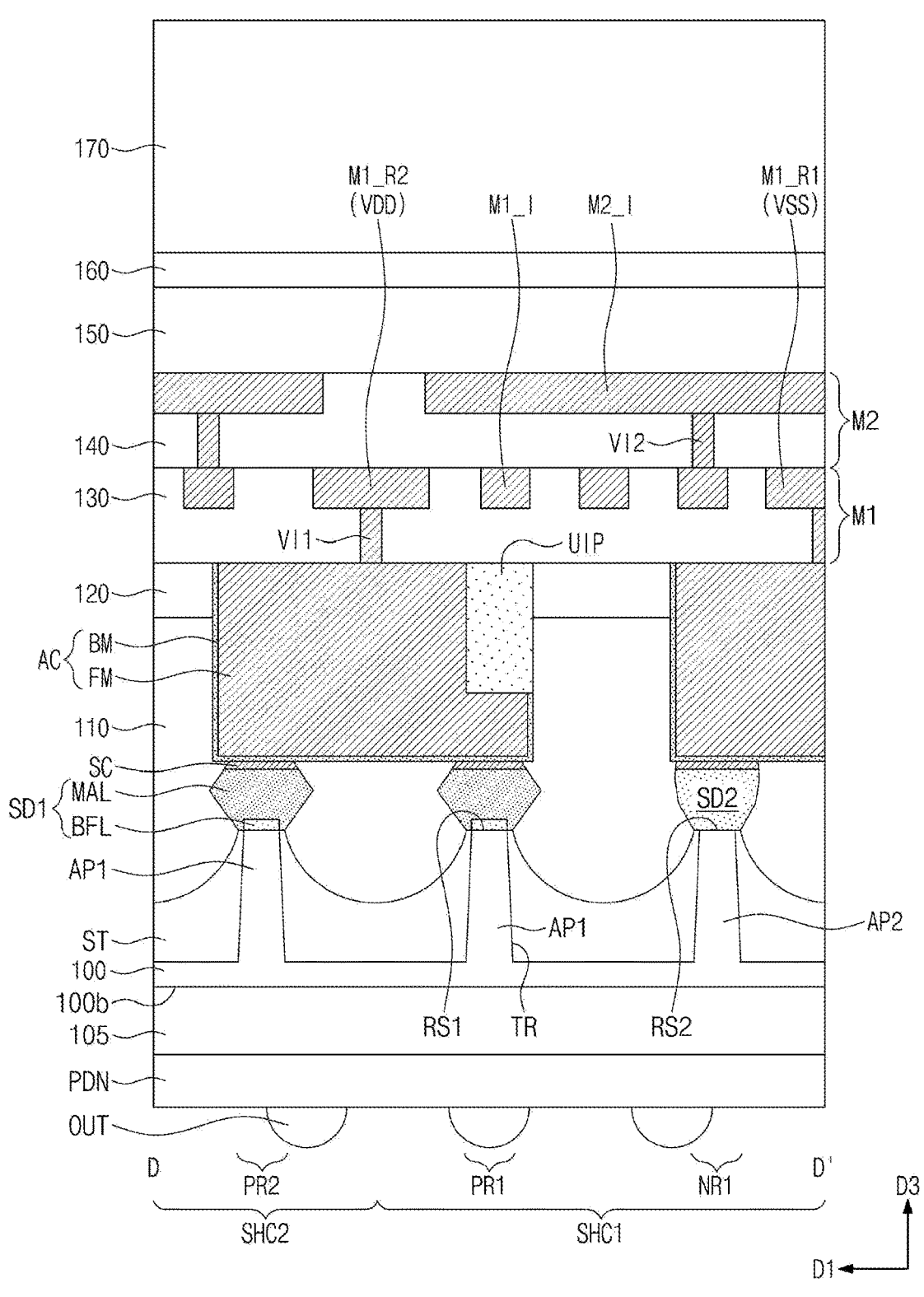
Figure 5E:
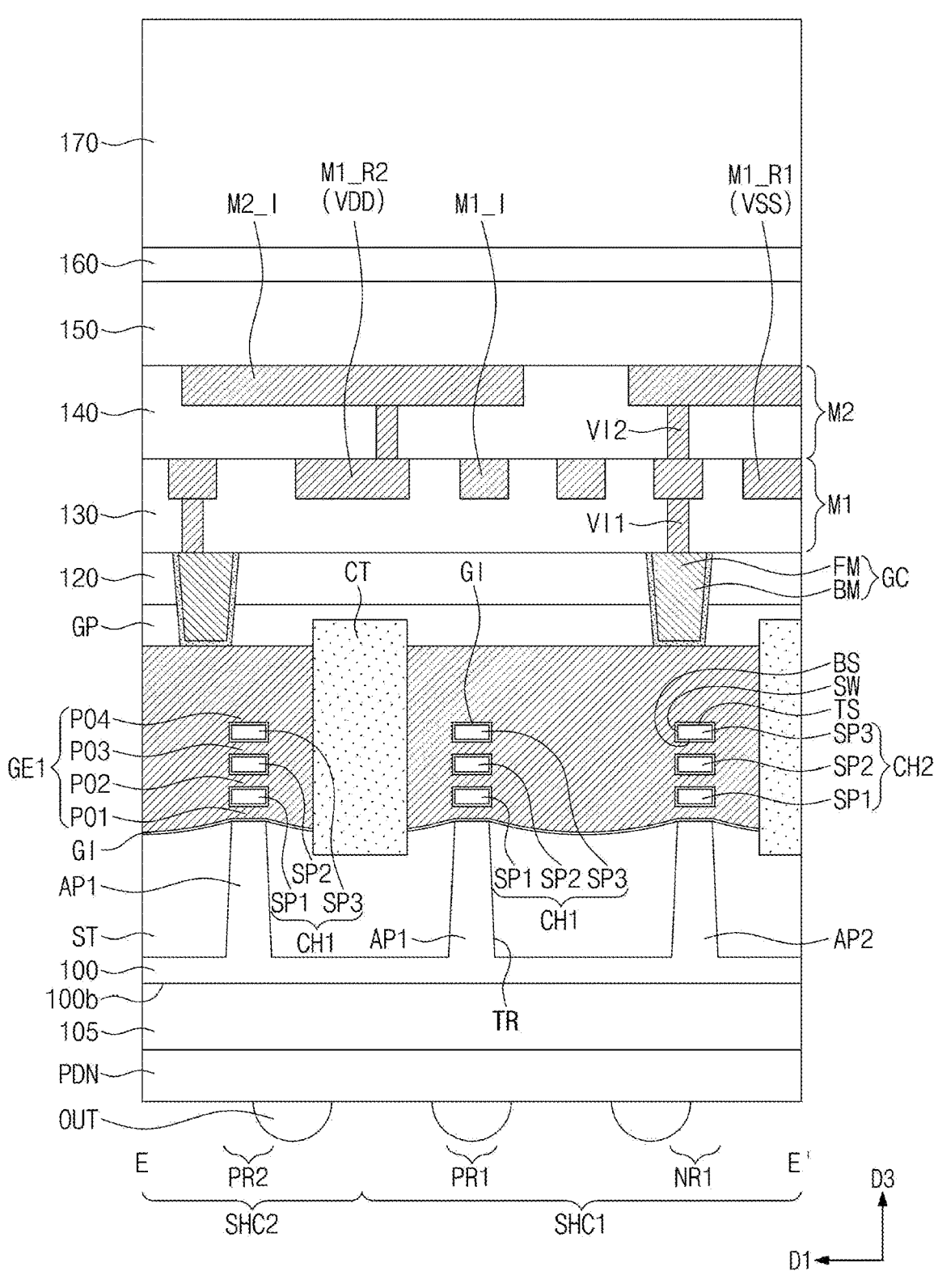

In an example embodiment of the present inventive concept, referring to FIGS. 5A and 5D, an upper dielectric pattern UIP may fill an upper portion of the active contact AC that is adjacent to the gate contact GC. The upper dielectric pattern UIP may have a bottom surface lower than that of the gate contact GC. For example, the upper dielectric pattern UIP may cause the active contact AC that is adjacent to the gate contact GC to have a top surface lower than the bottom surface of the gate contact GC. Therefore, it may be possible to prevent a short-circuit resulting from contact between the gate contact GC and its adjacent active contact AC.

Each of the active contact AC and the gate contact GC may include a conductive pattern FM and a barrier pattern BM that at least partially surrounds the conductive pattern FM. For example, the conductive pattern FM may include at least one of aluminum, copper, tungsten, molybdenum, and/or cobalt. The barrier pattern BM may cover sidewalls and a bottom surface of the conductive pattern FM. The barrier pattern BM may include a metal layer and a metal nitride layer. The metal layer may include at least one of, for example, titanium, tantalum, tungsten, nickel, cobalt, and/or platinum. The metal nitride layer may include at least one of, for example, a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

Figure 5F:
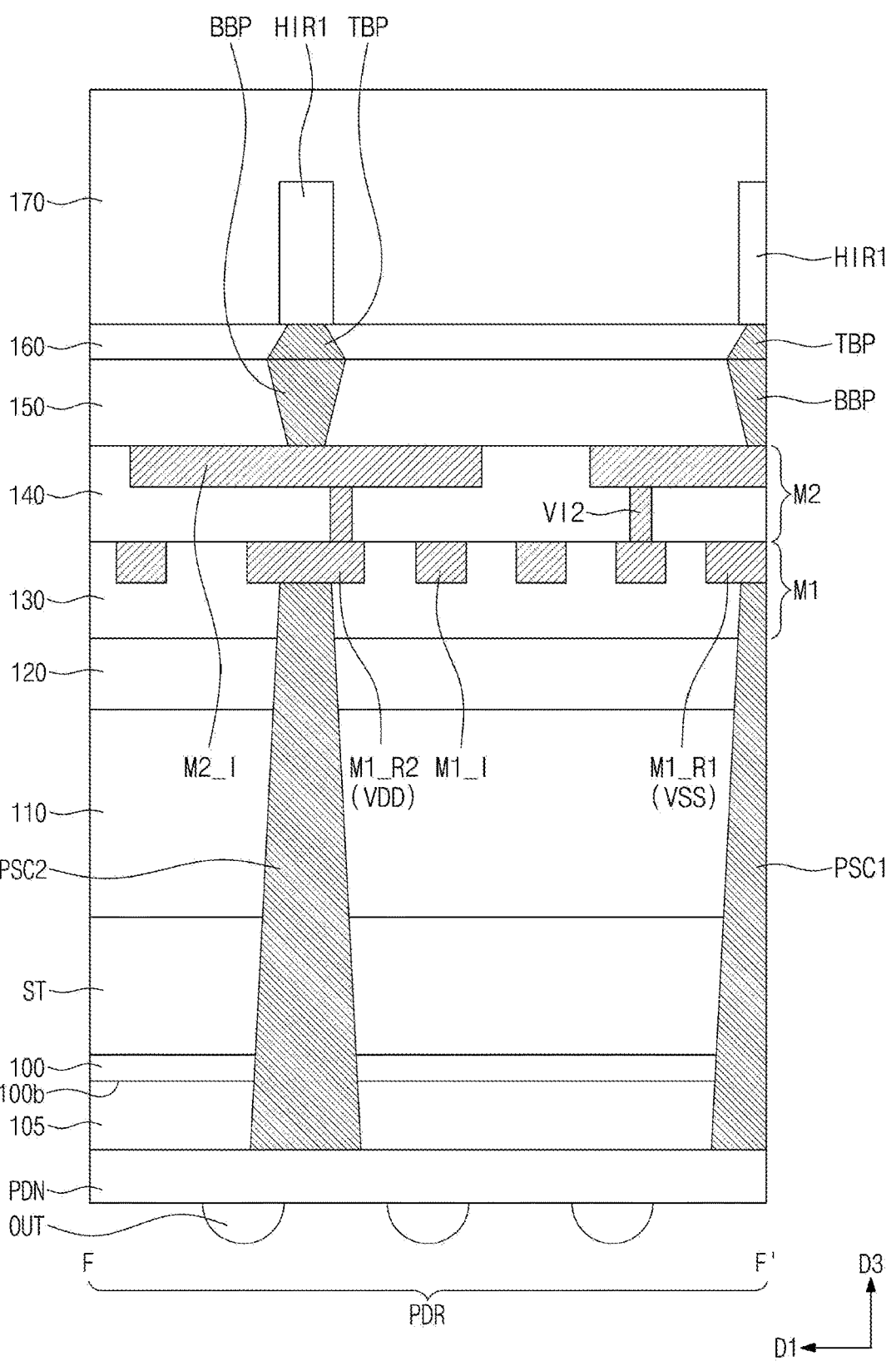

Referring to FIGS. 4, 5C, and 5F, a first metal layer M1 may be provided in the third interlayer dielectric layer 130. The first metal layer M1 may include first, second, and third power lines M1_R1, M1_R2, and M1_R3.

The first, second, and third power lines M1_R1, M1_R2, and M1_R3 may extend in the second direction D2 and parallel to each other. The first power line M1_R1 may be disposed on one boundary of the first single height cell SHC1. The second power line M1_R2 may be disposed on a boundary between the first and second single height cells SHC1 and SHC2. The third power line M1_R3 may be disposed on one boundary of the second single height cell SHC2.

Referring to FIGS. 5C and 5D, representatively, the second power line M1_R2 may be electrically connected to at least one active contact AC. A first via VI1 may be provided between the second power line M1_R2 and the at least one active contact AC.

Referring to FIGS. 4 and 5C, first, second, and third through vias TVI1, TVI2, and TVI3 may be provided in the first and second tap cells TC1 and TC2. The first, second, and third through vias TVI1, TVI2, and TVI3 may be electrically connected to the first, second, and third power lines M1_R1, M1_R2, and M1_R3, respectively.

Representatively, the second through via TVI2 may vertically extend from the second interlayer dielectric layer 120 to a bottom surface 100b of the first substrate 100. The through via TVI2 may have a top surface substantially coplanar with that of the second interlayer dielectric layer 120. In an embodiment of the present inventive concept, the second through via TVI2 may have a bottom surface lower than the bottom surface 100b of the first substrate 100. A giant via GVI may be provided between the second through via TVI2 and the second power line M1_R2. The second through via TVI2 and the second power line M1_R2 may be electrically connected to each other through the giant via GVI. The first, second, and third through vias TVI1, TVI2, and TVI3 may include at least one of, for example, tungsten (W), molybdenum (Mo), ruthenium (Ru), aluminum (Al), titanium (Ti), and/or tantalum (Ta).

A lower dielectric layer 105 may be provided on the bottom surface 100b of the first substrate 100. The lower dielectric layer 105 may be provided therein with first, second, and third lower through vias LVI1, LVI2, and LVI3. The first, second, and third lower through vias LVI1, LVI2, and LVI3 may be respectively connected to the first, second, and third through vias TVI1, TVI2, and TVI3. The first, second, and third lower through vias LVI1, LVI2, and LVI3 may vertically overlap the first, second, and third through vias TVI1, TVI2, and TVI3, respectively. The first, second, and third lower through vias LVI1, LVI2, and LVI3 may have their bottom surfaces substantially coplanar with those of first, second, and third through contacts PSC1, PSC2, and PSC3 which will be discussed below.

A power delivery network layer PDN may be provided below the lower dielectric layer 105. The power delivery network layer PDN may include a plurality of lower wiring lines electrically connected to the first, second, and third lower through vias LVI1, LVI2, and LVI3 and the first, second, and third through contacts PSC1, PSC2, and PSC3. For example, the power delivery network layer PDN may be electrically connected to the first, second, and third power lines M1_R1, M1_R2, and M1_R3.

The power delivery network layer PDN may include a wiring network for applying a source voltage VSS to the first and third power lines M1_R1 and M1_R3. The power delivery network layer PDN may include a wiring network for applying a drain voltage VDD to the second power line M1_R2.

An external connection terminal OUT may be disposed below the power delivery network layer PDN. The external connection terminal OUT may serve to transfer voltages from outside to the power delivery network layer PDN. However, the present inventive concept is not limited thereto, and for example, the external connection terminal OUT may transfer signals to an external device.

The lower through vias LVI1 to LVI3 may vertically extend from the power delivery network layer PDN to the bottom surfaces of the through vias TVI1 to TVI3. For example, the lower through vias LVI1 to LVI3 may have their top surfaces in direct contact with the bottom surfaces of the through vias TVI1 to TVI3. The top surfaces of the lower through vias LVI1 to LVI3 may be lower than the bottom surface 100b of the first substrate 100.

In an embodiment of the present inventive concept, the lower through vias LVI1 to LVI3 may include the same metal as that of the through vias TVI1 to TVI3. For example, the lower through vias LVI1 to LVI3 and the through vias TVI1 to TVI3 may include tungsten (W).

In an embodiment of the present inventive concept, the lower through vias LVI1 to LVI3 may include a different metal from that of the through vias TVI1 to TVI3. For example, the lower through vias LVI1 to LVI3 may include copper (Cu), and the through vias TVI1 to TVI3 may include tungsten (W).

The through vias TVI1 to TVI3 may be aligned with the lower through vias LVI1 to LVI3. For example, central lines of the through vias TVI1 to TVI3 may be aligned with those of the lower through vias LVI1 to LVI3.

The through vias TVI1 to TVI3 may have their widths (or diameters) each of which increases as the corresponding through vias TVI1, TVI2, or TVI3 extends in the third direction D3. For example, the through vias TVI1 to TVI3 may have a tapered shape. For example, the widths of the through vias TVI1 to TVI3 may each decrease with decreasing distance from the power delivery network layer PDN. The lower through vias LVI1 to LVI3 may have their widths (or diameters) each of which increases with decreasing distance from the power delivery network layer PDN. For example, the lower through vias LVI1 to LVI3 may have an inverted tapered shape. Therefore, each of the through vias TVI1 to TVI3 and its corresponding one of the lower through vias LVI1 to LVI3 may be connected to constitute a sandglass shape (e.g., a shape in which the width gradually decreases and gradually increases). However, the present inventive concept is not limited thereto. For example, the through vias TVI1 to TVI3 may have an inverted tapered shape, and the lower through vias LVI1 to LVI3 may have a tapered shape.

An upper spacer TSP may be provided on a sidewall of each of the through vias TVI1 to TVI3. The upper spacer TSP may include, for example, a silicon-based dielectric material (e.g., a silicon oxide layer, a silicon nitride layer, or a silicon oxynitride layer).

Referring back to FIGS. 4 and 5A to 5F, the first metal layer M1 may further include first wiring lines M1_I. The first wiring lines M1_I may parallel extend in the second direction D2.

The first metal layer M1 may further include first vias VI1. The first vias VI1 may be correspondingly provided below the first wiring lines M1_I of the first metal layer M1. The active contact AC may be electrically connected through the first via VI1 to the first wiring line M1_I. The gate contact GC may be electrically connected through the first via VI1 to the first wiring line M1_I.

The first wiring line M1_I and its underlying first via VI1 of the first metal layer M1 may be formed by individual processes. For example, the first wiring line M1_I and the first via VI1 of the first metal layer M1 may each be formed by a single damascene process. A sub-20 nm process may be employed to fabricate a semiconductor device according to the present embodiment.

A second metal layer M2 may be provided in the fourth interlayer dielectric layer 140. The second metal layer M2 may include a plurality of second wiring lines M2_I. The second wiring lines M2_I of the second metal layer M2 may each have a linear, rectangular, or bar shape that extends in the first direction D1. For example, the second wiring lines M2_I may extend in the first direction D1 and parallel to each other.

The second metal layer M2 may further include second vias VI2 that are correspondingly provided below the second wiring lines M2_I. The first wiring line M1_I of the first metal layer M1 may be electrically connected through the second via VI2 to the second wiring line M2_I of the second metal layer M2. For example, a dual damascene process may be employed to simultaneously form the second wiring line M2_I and its underlying second via VI2 of the second metal layer M2.

The first wiring line M1_I of the first metal layer M1 and the second wiring line M2_I of the second metal layer M2 may include the same or different conductive materials from each other. For example, the first wiring line M1_I of the first metal layer M1 and the second wiring line M2_I of the second metal layer M2 may include at least one of, for example, aluminum, copper, tungsten, molybdenum, ruthenium, and cobalt. Other metal layers (e.g., M3, M4, M5, etc.) may be additionally stacked on the fourth interlayer dielectric layer 140. Each of the stacked metal layers may include wiring lines for routing between cells.

The passive element cell PDR may be provided with first, second, and third through contacts PSC1, PSC2, and PSC3. The first, second, and third through contacts PSC1, PSC2, and PSC3 may be electrically connected to the first, second, and third power lines M1_R1, M1_R2, and M1_R3, respectively. The first, second, and third through contacts PSC1, PSC2, and PSC3 may include the same metallic material as that of lower wiring lines of the power delivery network layer PDN. For example, the first, second, and third through contacts PSC1, PSC2, and PSC3 may include copper (Cu).

Referring to FIGS. 4, 5C, and 5F, representatively, the second through contacts PSC2 may vertically extend from the third interlayer dielectric layer 130 to a bottom surface of the lower dielectric layer 105. For example, two second through contacts PSC2 may be provided. The second through contacts PSC2 may have their top surfaces substantially coplanar with that of the third interlayer dielectric layer 130. The top surface of each of the second through contacts PSC2 may be located at a vertical level higher than that of the top surface of the second through via TVI2. The second through contacts PSC2 may be correspondingly connected to the second power lines M1_R2. In addition, the second via VI2 may be provided between the second power line M1_R2 and each of the second through contacts PSC2. This configuration may be changed based on design of a semiconductor device. The second through contacts PSC2 may be electrically connected to lower wiring lines of the power delivery network layer PDN.

A fifth interlayer dielectric layer 150 may be provided on the fourth interlayer dielectric layer 140. Lower bonding pads BBP may be provided in the passive element cell PDR and in the fifth interlayer dielectric layer 150.

The lower bonding pads BBP may be correspondingly connected to the second wiring lines M2_I. The lower bonding pads BBP may be correspondingly electrically connected to the first, second, and third through contacts PSC1, PSC2, and PSC3 through the second wiring lines M2_I, the second vias VI2, and the second power lines M1_R2.

A sixth interlayer dielectric layer 160 may be provided on the fifth interlayer dielectric layer 150. Upper bonding pads TBP may be provided in the passive element cell PDR and in the sixth interlayer dielectric layer 160.

The upper bonding pads TBP may correspondingly and vertically overlap the lower bonding pads BBP. The upper bonding pads TBP may be correspondingly connected to the lower bonding pads BBP. For example, the upper bonding pad TBP and the lower bonding pad BBP may be formed into a single unitary body, and no boundary or interface may be provided between the upper bonding pad TBP and the lower bonding pad BBP. The upper bonding pads TBP may be correspondingly electrically connected to the first, second, and third through contacts PSC1, PSC2, and PSC3 through the lower bonding pads BBP, the second wiring lines M2_I, the second vias VI2, and the second power lines M1_R2.

The lower bonding pads BBP and the upper bonding pads TBP may include at least one of, for example, aluminum, copper, tungsten, molybdenum, and/or cobalt.

A second substrate 170 may be provided on the sixth interlayer dielectric layer 160. For example, the second substrate 170 may be a compound semiconductor substrate or a semiconductor substrate including silicon, germanium, silicon-germanium, etc. For example, the second substrate 170 may be a silicon substrate. The second substrate 170 may be independently manufactured in a space different from that in which the first substrate 100 is formed.

First and second impurity regions HIR1 and HIR2 may be provided in the passive element cell PDR and in the second substrate 170. The first and second impurity regions HIR1 and HIR2 may be impurity regions having impurities that are doped into the second substrate 170.

The first impurity region HIR1 and the second impurity region HIR2 may each be coupled to a corresponding one of the upper bonding pads TBP. For example, when the first impurity region HIR1 is doped with impurities having a first conductivity type (e.g., p-type), the second impurity region HIR2 may be doped with impurities having a second conductivity type (e.g., n-type). The first impurity region HIR1 and the second impurity region HIR2 may be adjacent to constitute a PN junction. The first impurity region HIR1 and the second impurity region HIR2 may each be electrically connected through its corresponding upper bonding pad TBP to the power delivery network layer PDN. The first and second impurity regions HIR1 and HIR2, the upper bonding pads TBP, the lower bonding pads BBP, and the second through contacts PSC2 may be electrically connected to serve as a PN junction diode.

According to the present inventive concepts, the second substrate 170 may be disposed on the second metal layer M2, and the first and second impurity regions HIR1 and HIR2 may be provided in the second substrate 170. The first and second impurity regions HIR1 and HIR2 may serve as a PN junction diode. In this case, the second substrate 170 is provided therein a diode including the first and second impurity regions HIR1 and HIR2, the first substrate 100 may decrease in thickness. Therefore, there may be a reduction in length of the upper spacers TSP that insulate the first substrate 100 from the through via TVI1, TVI2, and TVI3, the through vias TVI1, TVI2, and TVI3 may have their increased widths, which may result in a decrease in resistance of the through vias TVI1, TVI2, and TVI3. As a result, a semiconductor device may improve in electrical properties.

In addition, as the first and second impurity regions HIR1 and HIR2 are provided in the second substrate 170, there may be no limitation imposed on thicknesses (or lengths in the third direction D3) of the first and second impurity regions HIR1 and HIR2. The first and second impurity regions HIR1 and HIR2 included in a passive element may cause a reduction in noise that may be applied to a logic cell. As a result, a semiconductor device may improve in electrical properties.

Figure 6:
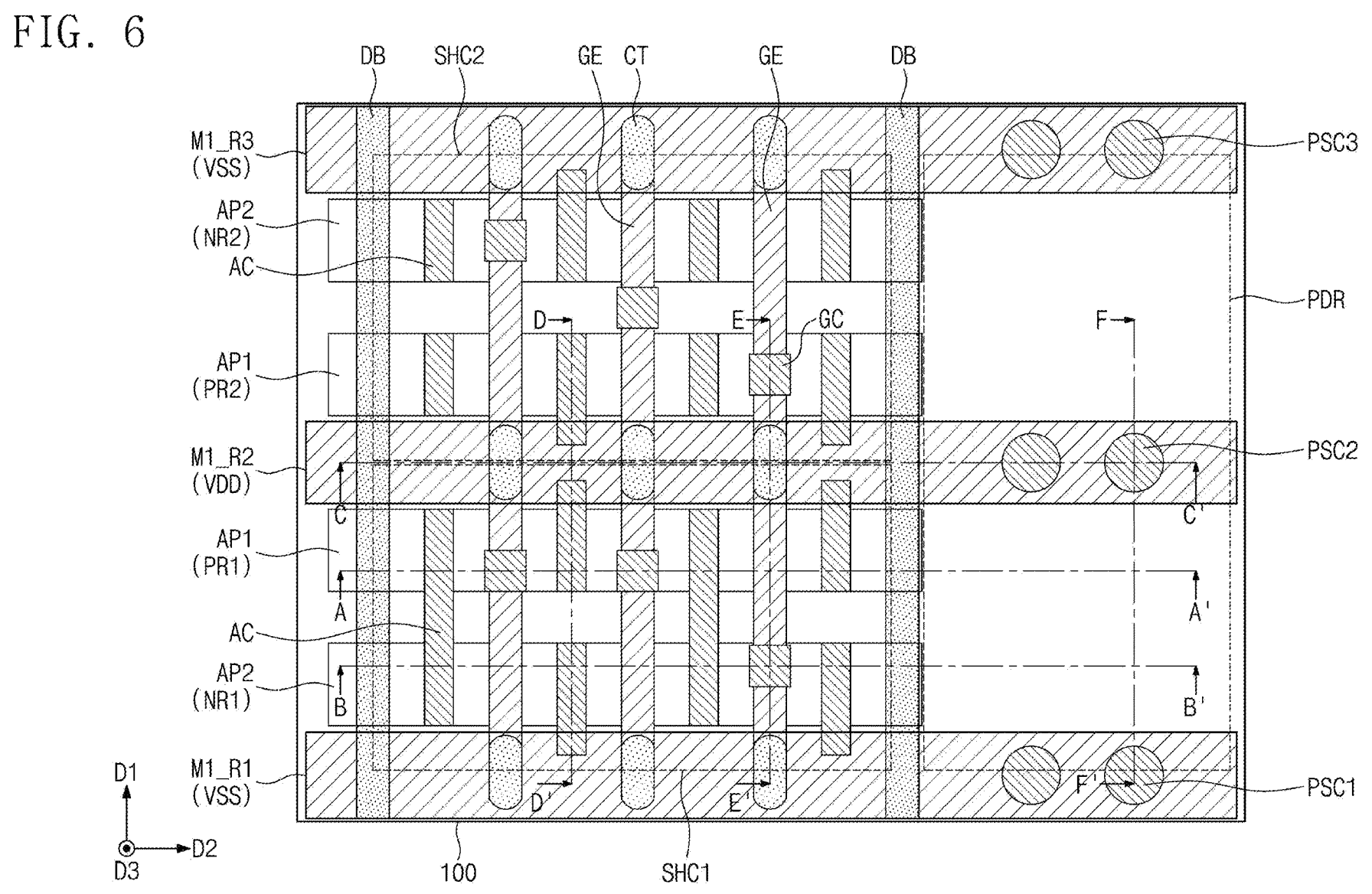

FIG. 6 illustrates a plan view showing a semiconductor device according to some embodiments of the present inventive concept. FIGS. 7A, 7B, 7C, 7D, 7E, and 7F illustrate cross-sectional views respectively taken along lines A-A', B-B', C-C', D-D', E-E', and F-F' of FIG. 6. In the embodiments that follow, a detailed description of technical features that may be repetitive to those discussed above with reference to FIGS. 4 and 5A to 5F may be omitted or briefly discussed, and a difference thereof will be explained in detail.

Referring to FIGS. 6 and 7A to 7F, a first lower power line VPR1, a second lower power line VPR2, and a third lower power line VPR3 may be provided on the bottom surface 100b of the first substrate 100. In this case, the first, second, and third power lines M1_R1, M1_R2, and M1_R3 provided in the first metal layer M1 of FIGS. 5A to 5F may be omitted. The first, second, and third lower power lines VPR1, VPR2, and VPR3 may extend in the second direction D2 and may be parallel to each other. The first lower power line VPR1 may be disposed on one boundary of the first single height cell SHC1. The second lower power line VPR2 may be disposed on a boundary between the first and second single height cells SHC1 and SHC2. The third lower power line VPR3 may be disposed on one boundary of the second single height cell SHC2. For example, the first single height cell SHC1 may be provided between the first lower power line VPR1 and the second lower power line VPR2, and the second single height cell SHC2 may be provided between the second lower power line VPR2 and the third lower power line VPR3.

Figure 7A:
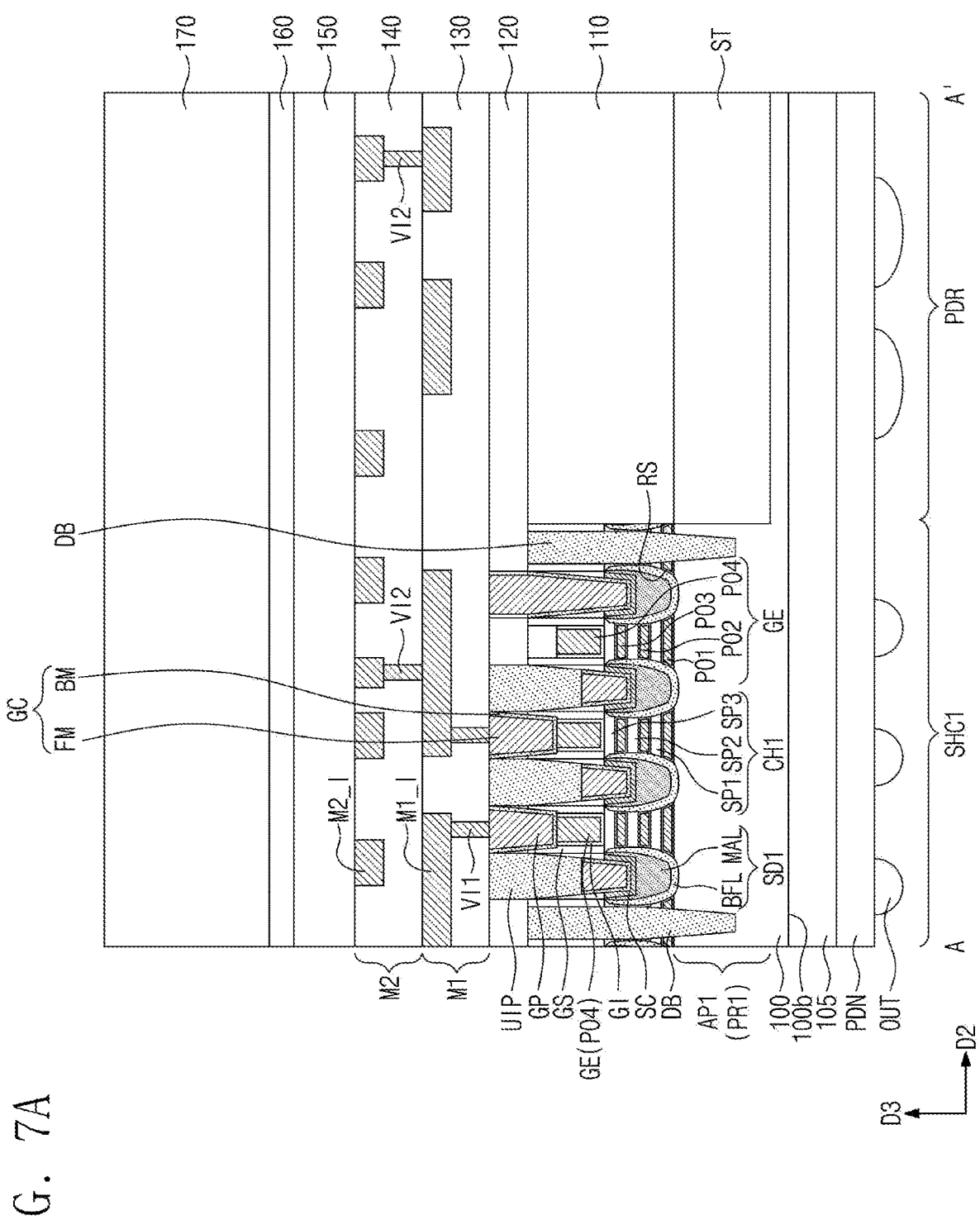
FIGS. 7A, 7B, 7C, 7D, 7E, and 7F illustrate cross-sectional views respectively taken along lines A-A', B-B', C-C', D-D', E-E', and F-F' of FIG. 6.
Figure 7B:
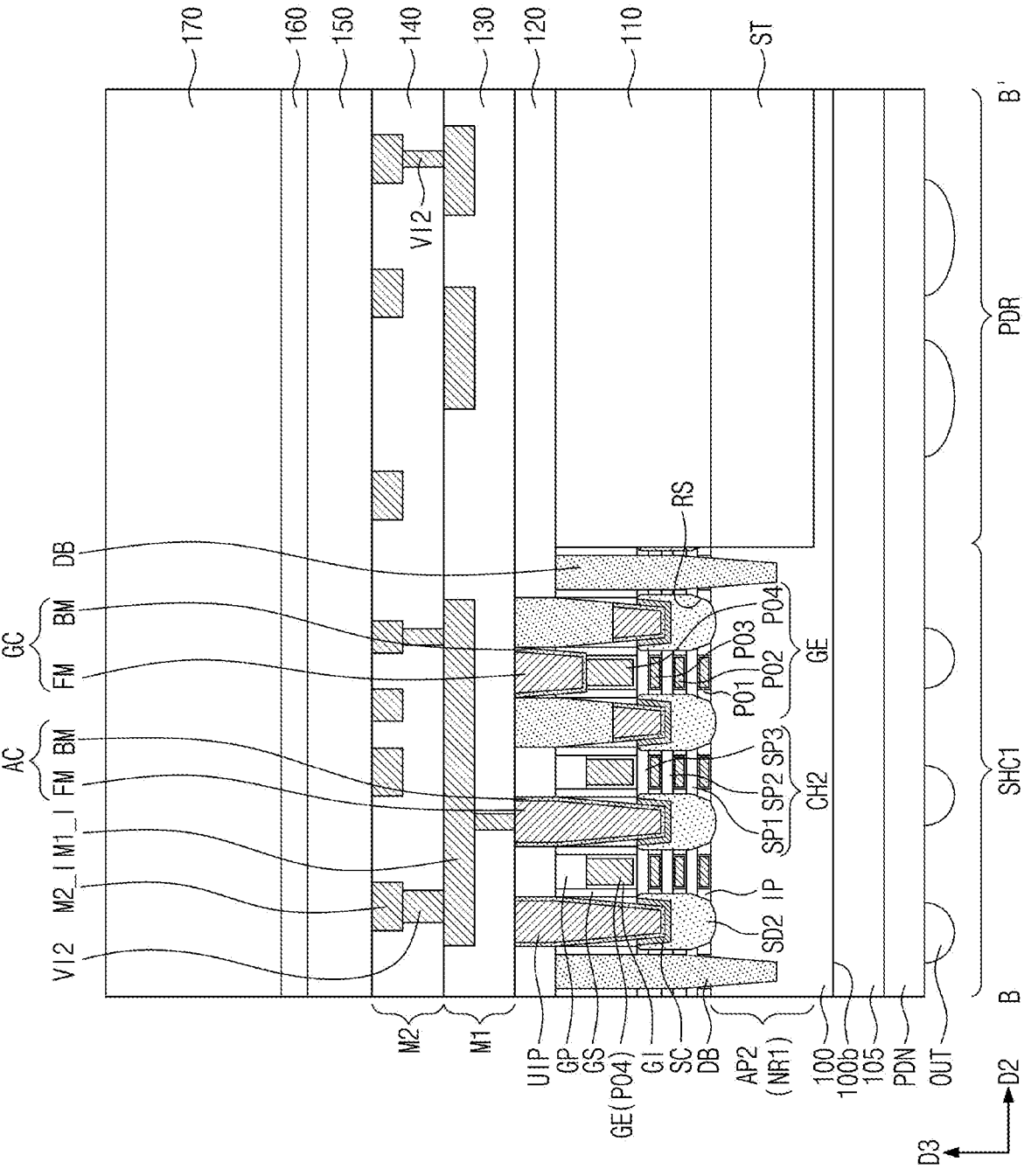
Figure 7C:
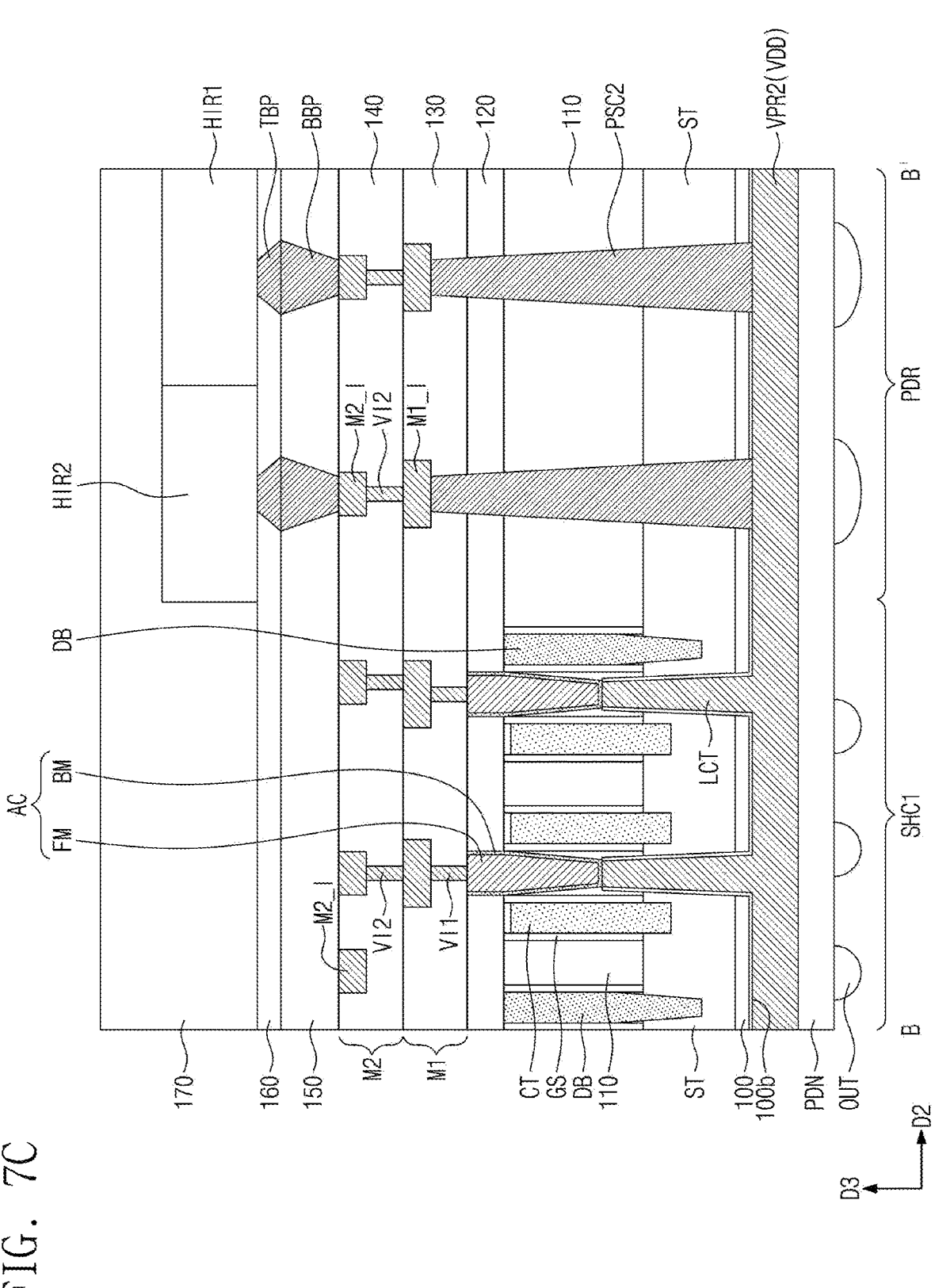
Figure 7D:
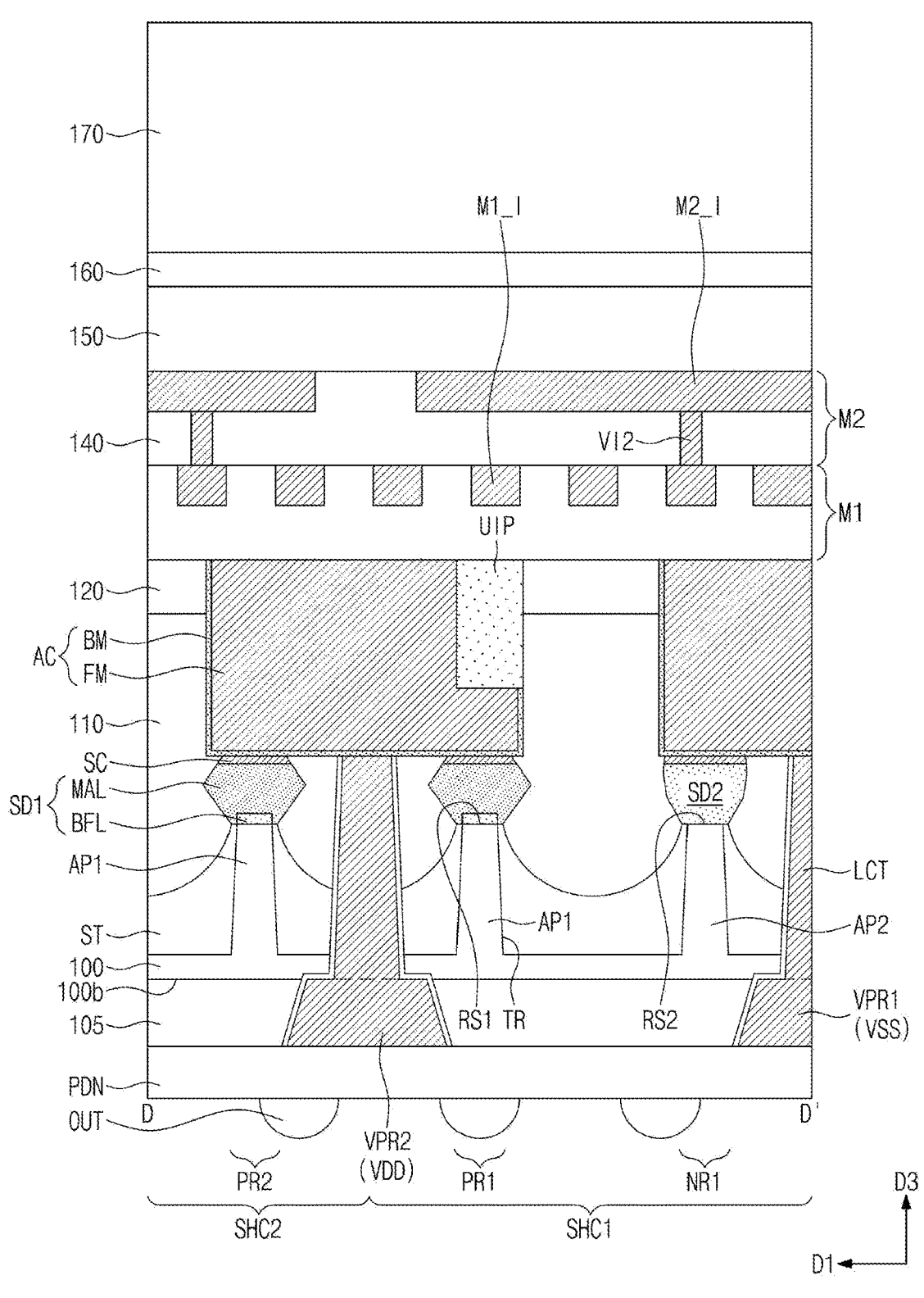
Figure 7E:
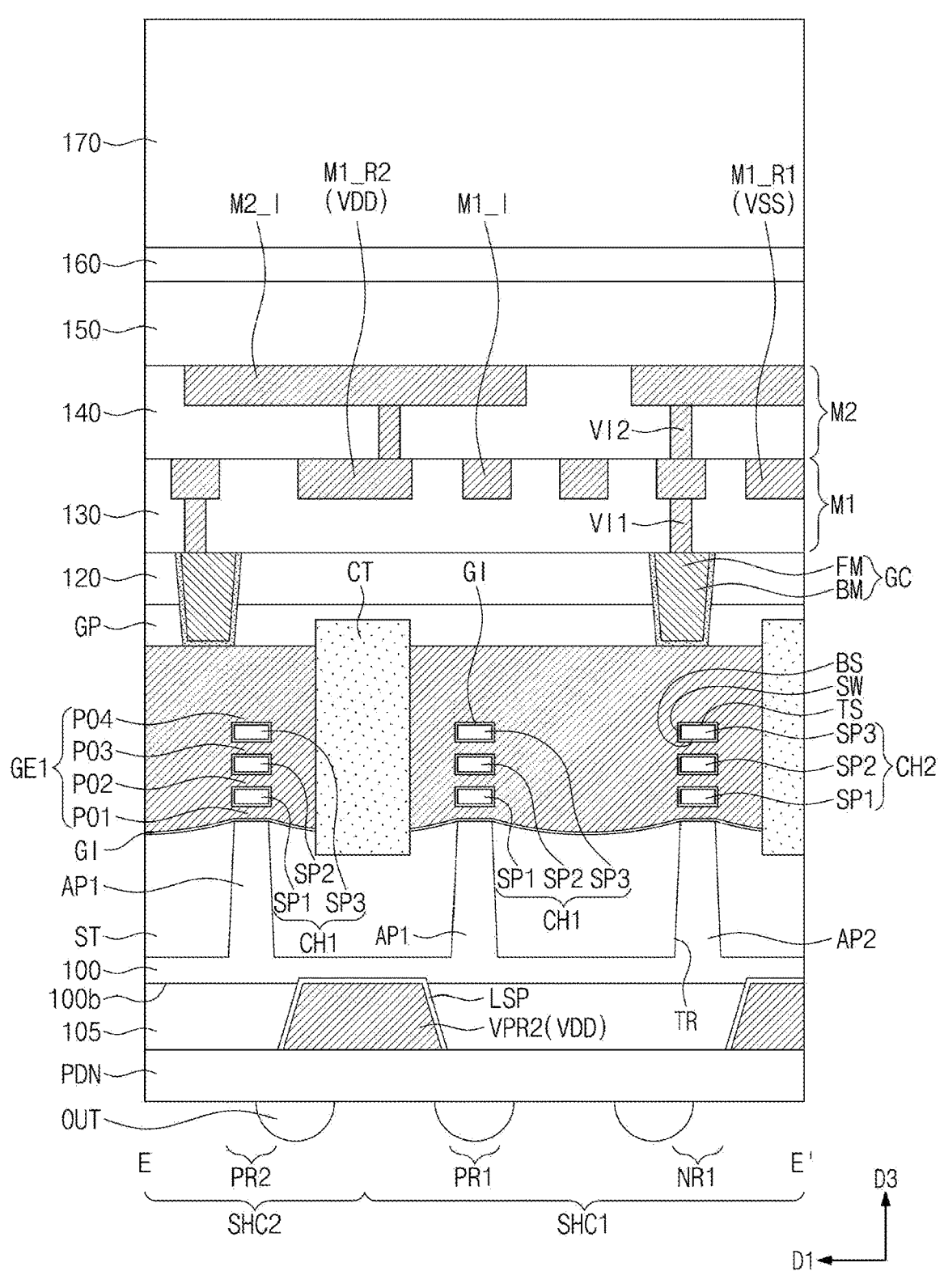
Figure 7F:
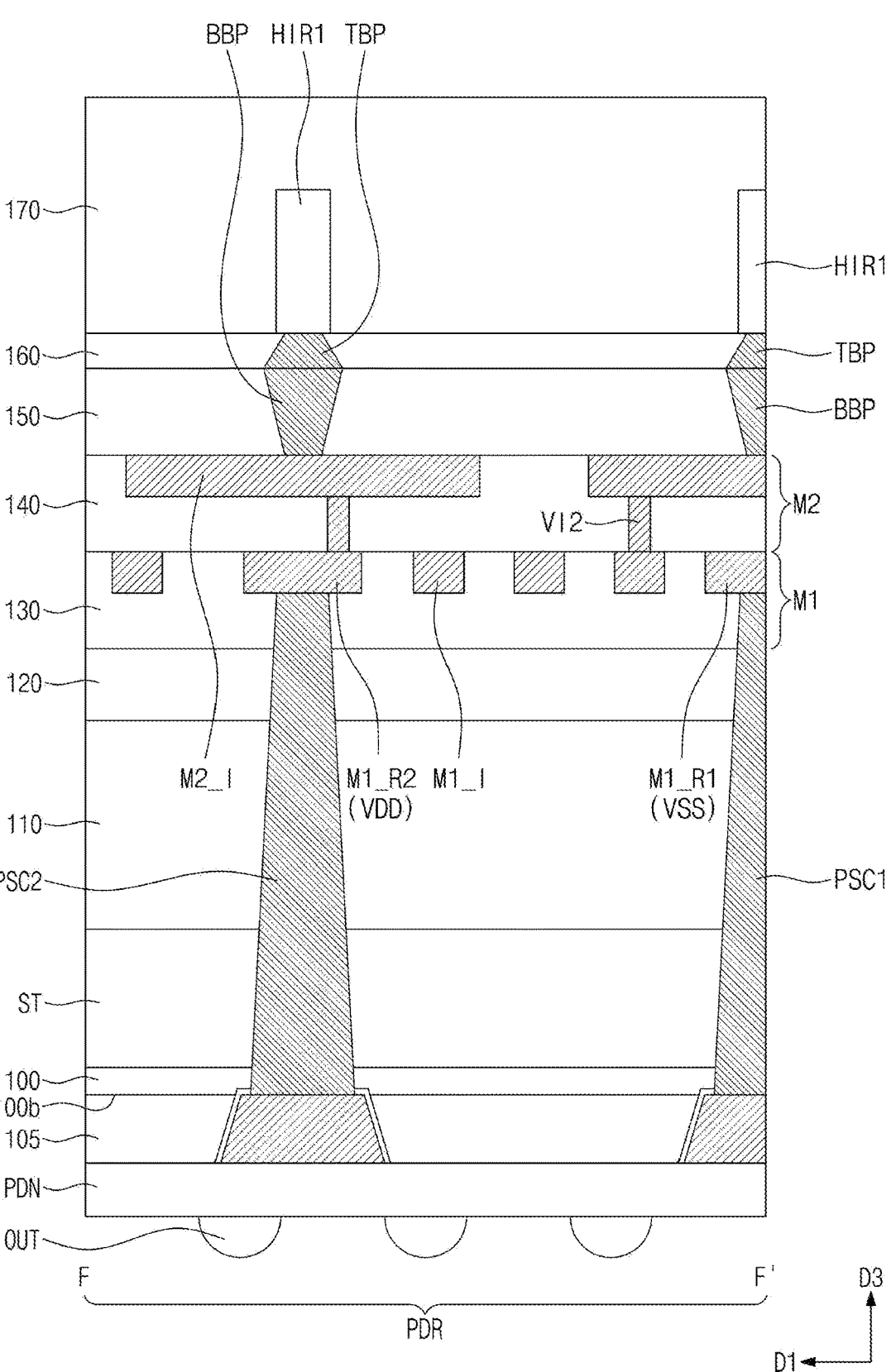

Referring to FIG. 7D, representatively, the second lower power line VPR2 may be electrically connected to at least one active contact AC. A lower contact LCT may be provided on the second lower power line VPR2. The lower contact LCT may penetrate the first substrate 100, the device isolation layer ST, and the first interlayer dielectric layer 110 to vertically extend from the second lower power line VPR2 to the active contact AC. The lower contact LCT may electrically connect the second lower power line VPR2 and the active contact AC to each other. As a result, a semiconductor according to the present inventive concept may be configured such that the lower power lines VPR1, VPR2, and VPR3 may be electrically connected through the lower contacts LCT and the active contacts AC to the source/drain patterns SD1 and SD2.

A lower spacer LSP may be interposed between the first substrate 100 and each of the lower power lines VPR1, VPR2, and VPR3 and between the first substrate 100 and each of the lower contacts LCT. The lower spacer LSP may include, for example, a silicon-based dielectric material (e.g., a silicon oxide layer, a silicon nitride layer, or a silicon oxynitride layer). The lower spacers LSP may insulate the lower power lines VPR1, VPR2, and VPR3 from the first substrate 100.

In an embodiment of the present inventive concept, the lower power lines VPR1, VPR2, and VPR3 may be provided in the lower dielectric layer 105, and may have their bottom surfaces substantially coplanar with that of the lower dielectric layer 105. In an embodiment of the present inventive concept, the lower power lines VPR1, VPR2, and VPR3 may be provided in the first substrate 100, and may have their bottom surfaces substantially coplanar with the bottom surface 100b of the first substrate 100. This configuration may be changed based on design of a semiconductor device. A power delivery network layer PDN may be provided on the bottom surface of the lower dielectric layer 105. In an embodiment of the present inventive concept, the lower power lines VPR1, VPR2, and VPR3 may be provided in the power delivery network layer PDN.

The power delivery network layer PDN may include a plurality of lower wiring lines electrically connected to the first, second, and third lower power lines VPR1, VPR2, and VPR3. For example, the power delivery network layer PDN may include a wiring network for applying a source voltage VSS to the first and third lower power lines VPR1 and VPR3. The power delivery network layer PDN may include a wiring network for applying a drain voltage VDD to the second lower power line VPR2.

Figure 8:
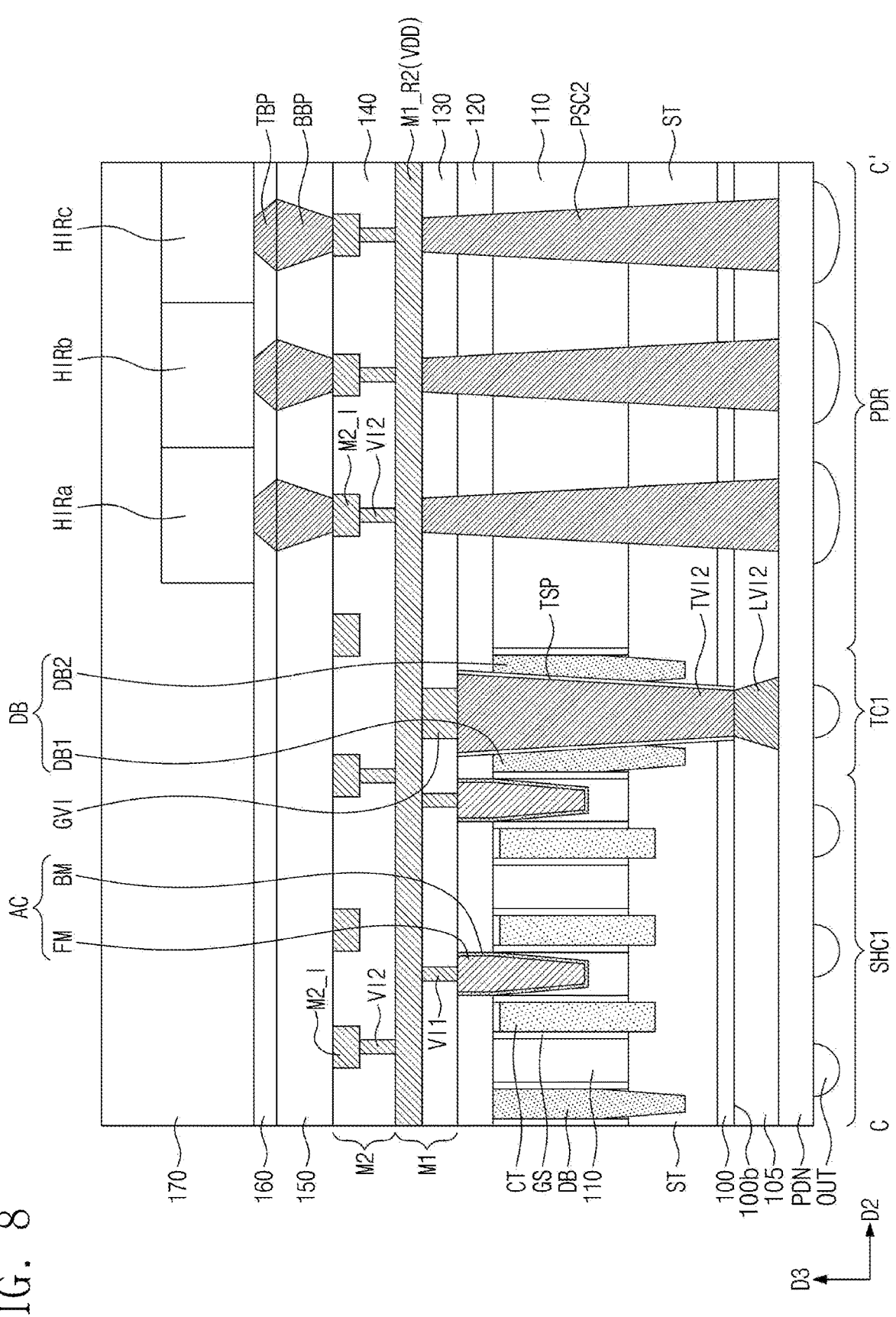
FIG. 8 illustrates a cross-sectional view showing a semiconductor device according to some embodiments of the present inventive concept.
Figures 9A, 9B:
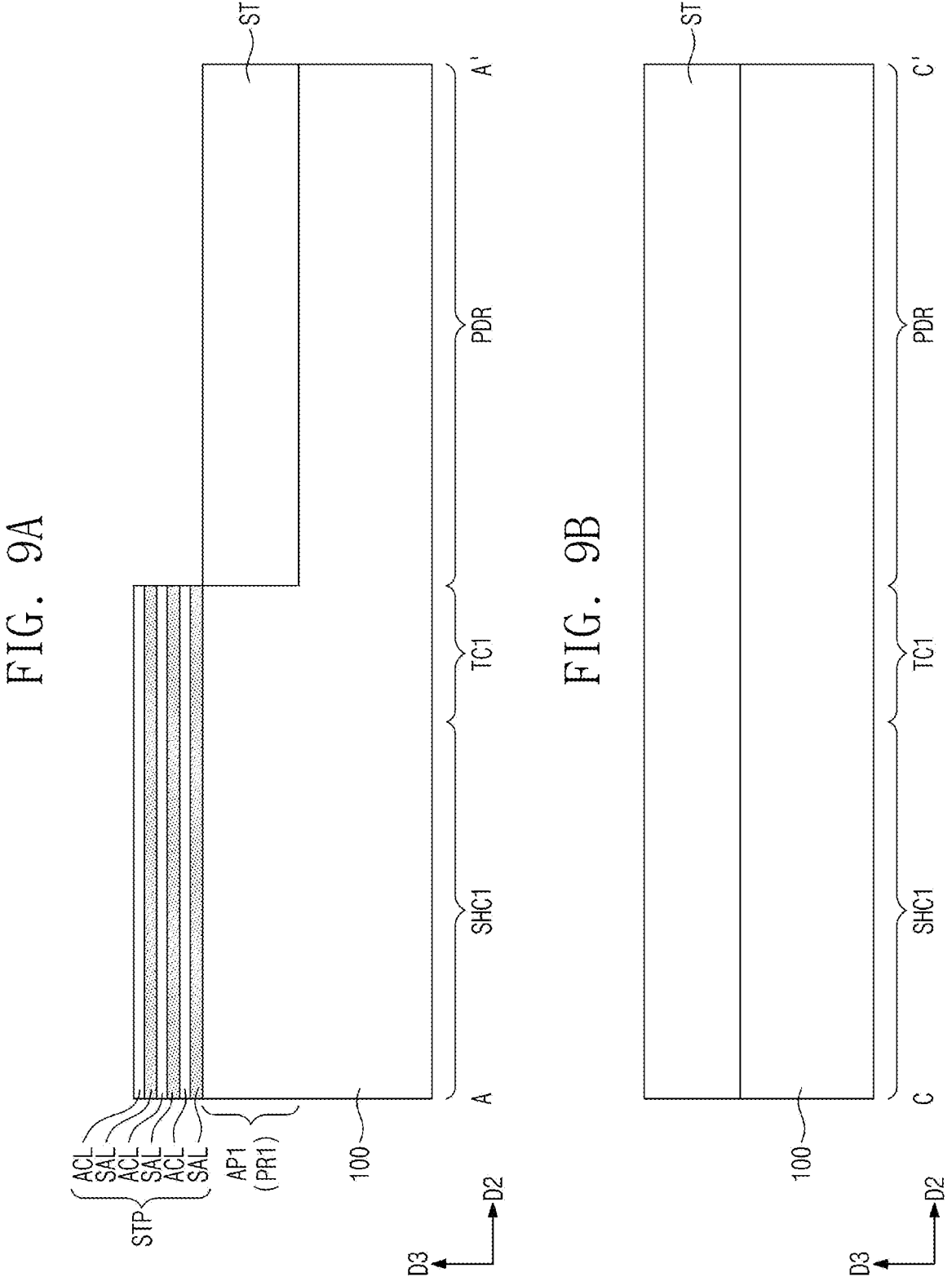
Figure 9C:
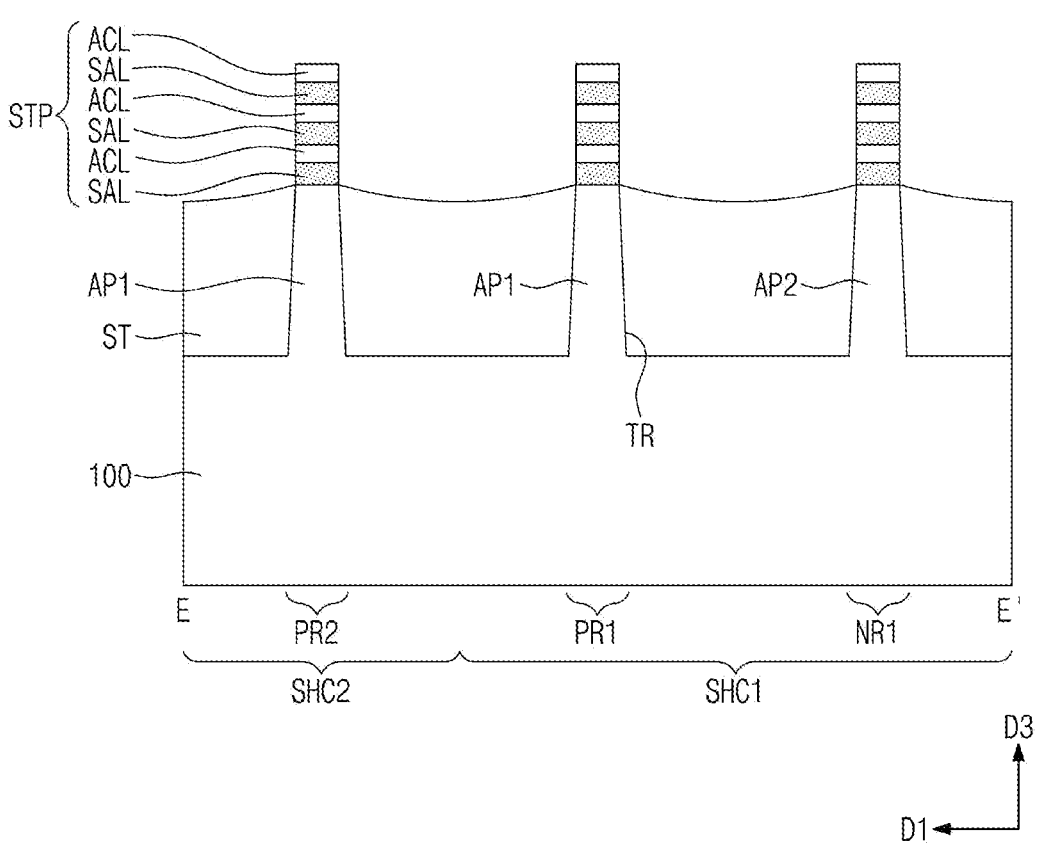
Figure 9D:
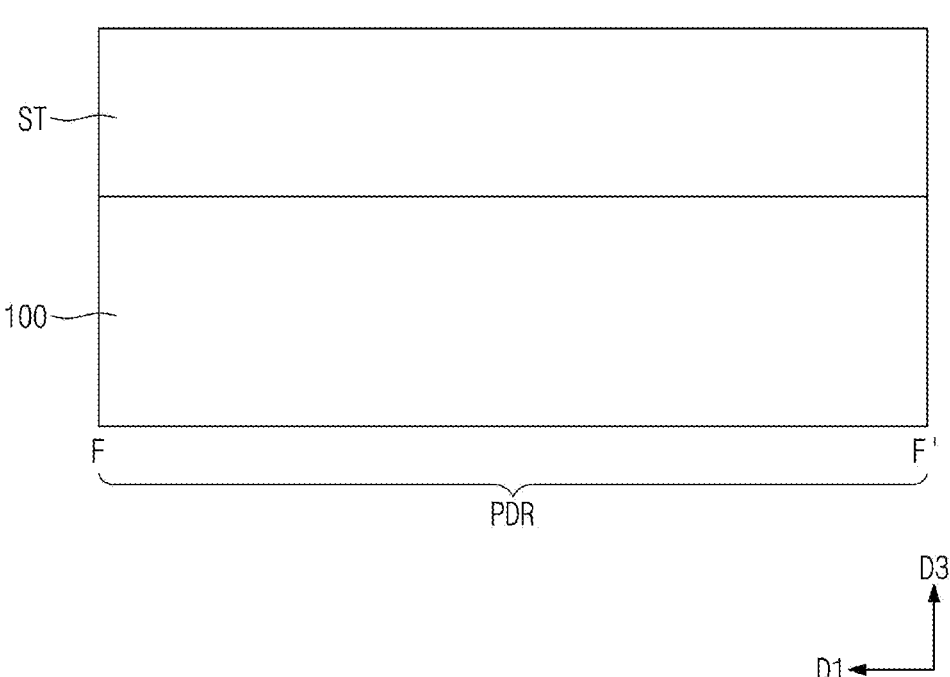

FIG. 8 illustrates a cross-sectional view showing a semiconductor device according to some embodiments of the present inventive concept. In the embodiments that follow, a detailed description of technical features that may be repetitive to those discussed above with reference to FIGS. 4 and 5A to 5F may be omitted, and a difference thereof will be explained in detail.

Referring to FIG. 8, three second through contacts PSC2 may be provided. The second substrate 170 may be provided therein with three impurity regions HIRa. HIRb, and HIRc electrically connected to the second through contacts PSC2. In this case, there may be omitted the first and second impurity regions HIR1 and HIR2 of FIGS. 4 and 5A to 5F. The three impurity regions HIRa, HIRb, and HIRc of FIG. 8 may include a third impurity region HIRa, a fourth impurity region HIRb, and a fifth impurity region HIRc.

For example, when the third impurity region HIRa is doped with impurities having a first conductivity type (e.g., p-type), the fourth impurity region HIRb may be doped with impurities having a second conductivity type (e.g., n-type). The fifth impurity region HIRc may be doped with impurities whose conductivity type is the same as that of impurities doped in the third impurity region HIRa. The third impurity region HIRa and the fourth impurity region HIRb may be adjacent to each other to constitute a PNP or NPN junction, and the fourth impurity region HIRb and the fifth impurity region HIRc may be adjacent to each other to constitute a PNP or NPN junction. The third, fourth, and fifth impurity regions HIRa, HIRb, and HIRc may each be electrically connected through its corresponding upper bonding pad TBP to the power delivery network layer PDN. The third, fourth, and fifth impurity regions HIRa, HIRb, and HIRc, the upper bonding pads TBP, the lower bonding pads BBP, and the second through contacts PSC2 may be electrically connected to each other to serve as a bipolar junction transistor.

Figure 15A:
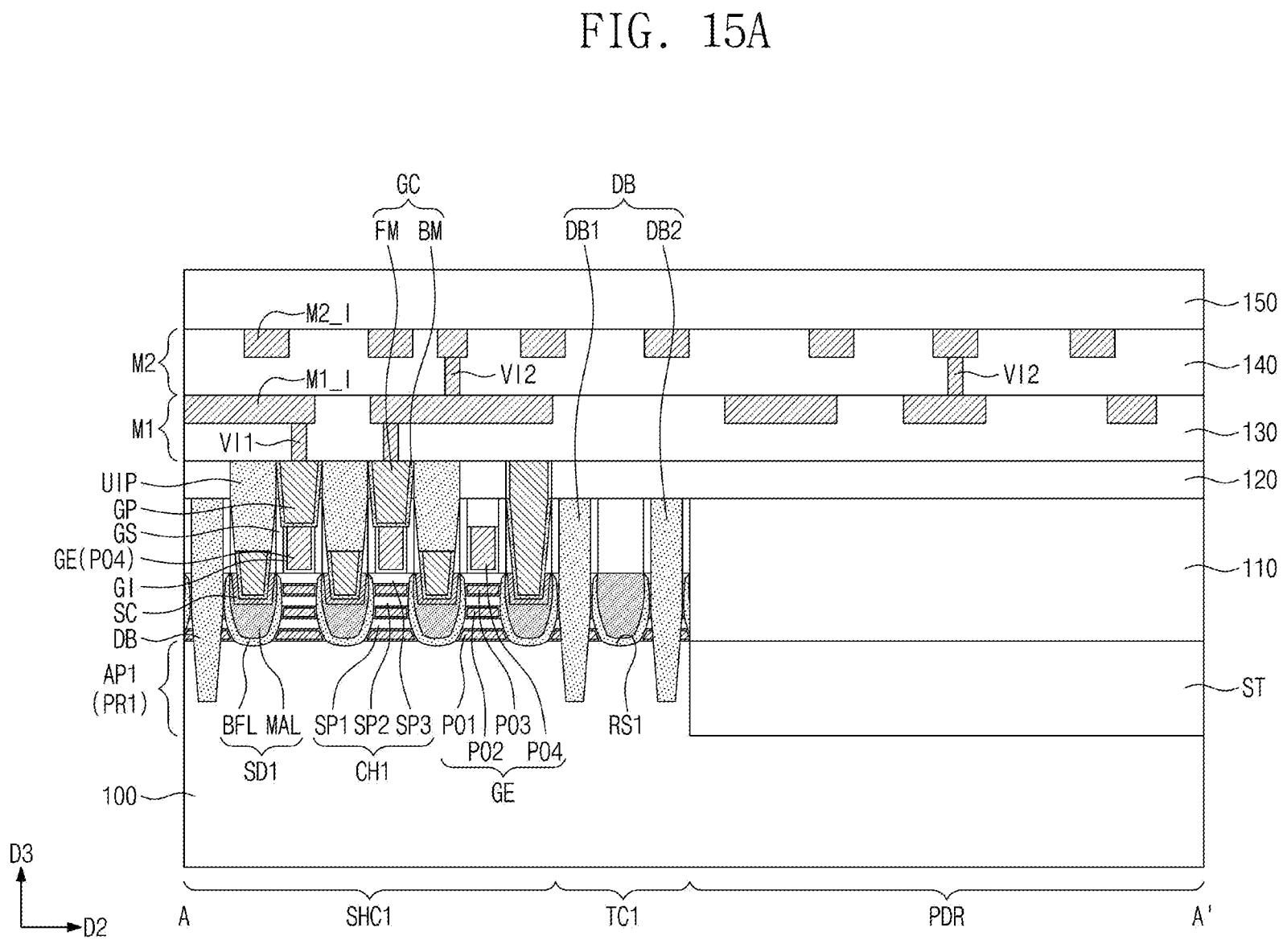
Figure 15B:
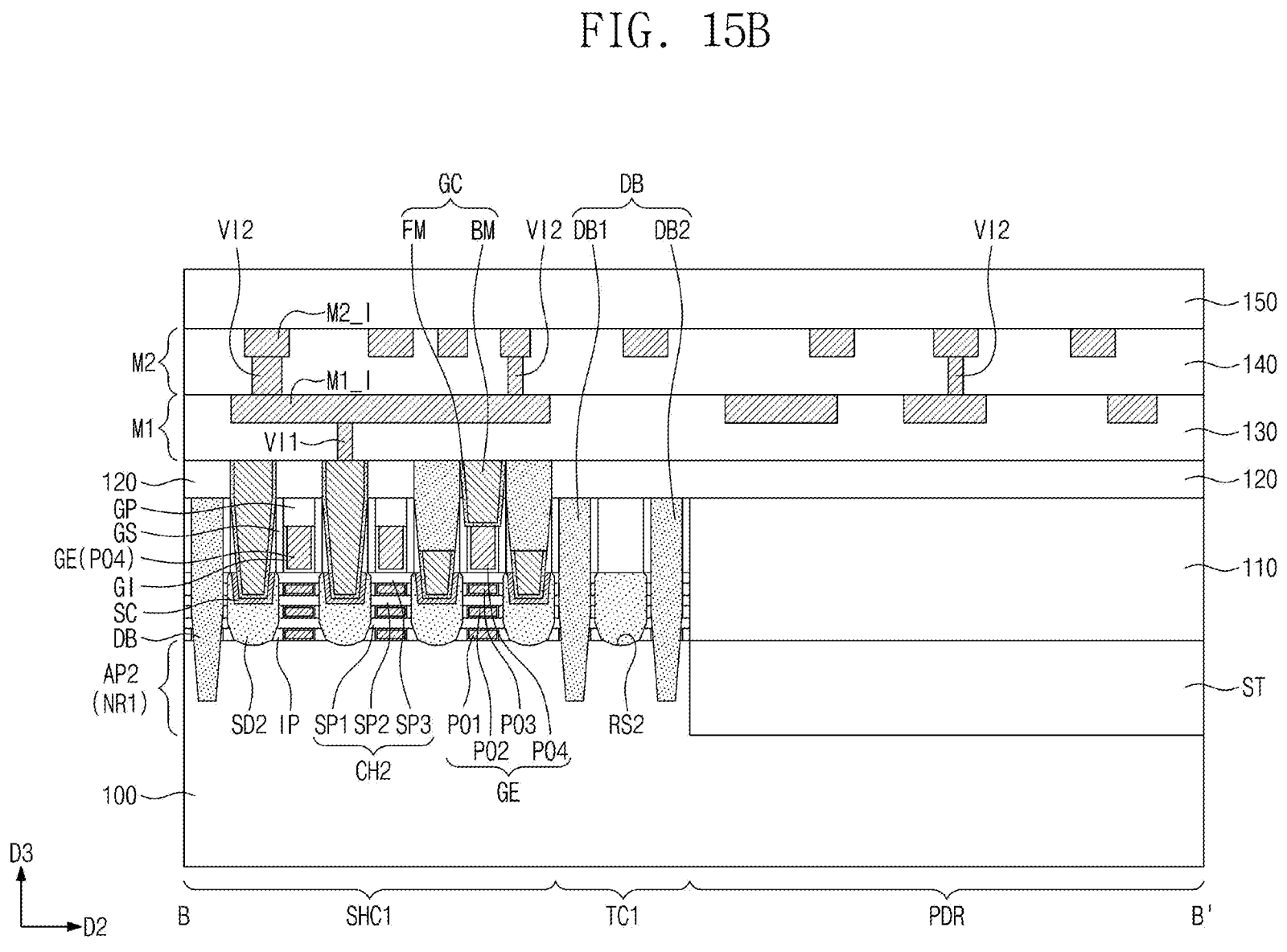

FIGS. 9A to 17B illustrate cross-sectional views showing a method of fabricating a semiconductor device according to some embodiments of the present inventive. In detail, FIGS. 9A, 10A, 11A, 12A, 13A, 14A, 15A, and 16A illustrate cross-sectional views taken along line A-A' of FIG. 4. FIGS. 11B, 12B, 13B, 14B, 15B, and 16B illustrate cross-sectional views taken along line B-B' of FIG. 4. FIGS. 9B, 10B, 13C, 14C, 15C, 16C, and 17A illustrate cross-sectional views taken along line C-C' of FIG. 4. FIGS. 11C, 12C, 15D, and 16D illustrate cross-sectional views taken along line D-D' of FIG. 4. FIGS. 9C, 10C, 13D, 14D, 15E, and 16E illustrate cross-sectional views taken along line E-E' of FIG. 4. FIGS. 9D, 13E, 14E, 15F, 16F, and 17B illustrate cross-sectional views taken along line F-F' of FIG. 4.

Referring to FIGS. 9A to 9D, a first substrate 100 may be provided, and the first substrate 100 may include first and second PMOSFET regions PR1 and PR2 and first and second NMOSFET regions NR1 and NR2. On first and second single height cells SHC1 and SHC2 and first and second tap cells TC1 and TC2, first semiconductor layers ACL and second semiconductor layers SAL may be alternately formed on the first substrate 100. The first semiconductor layers ACL may include one of, for example, silicon (Si), germanium (Ge), and silicon-germanium (SiGe), and the second semiconductor layers SAL may include another of silicon (Si), germanium (Ge), and silicon-germanium (SiGe). Neither the first semiconductor layers ACL nor the second semiconductor layers SAL may be provided on a passive element cell PDR.

The second semiconductor layer SAL may include a material having an etch selectivity with respect to the first semiconductor layer ACL. For example, the first semiconductor layers ACL may include silicon (Si), and the second semiconductor layers SAL may include silicon-germanium (SiGe). A concentration of germanium (Ge) in each of the second semiconductor layers SAL may range from about 10 at % to about 30 at %.

Mask patterns may be formed on the first and second PMOSFET regions PR1 and PR2 and the first and second NMOSFET regions NR1 and NR2 of the first substrate 100. The mask pattern may have a linear, rectangular, or bar shape that extends in a second direction D2.

A patterning process may be performed in which the mask patterns are used as an etching mask to form a trench TR that defines a first active pattern AP1 and a second active pattern AP2. The first active pattern AP1 may be formed on each of the first and second PMOSFET regions PR1 and PR2. The second active pattern AP2 may be formed on each of the first and second NMOSFET regions NR1 and NR2. When viewed in plan, each of the first and second active patterns AP1 and AP2 may have linear shapes that extend parallel to each other in the second direction D2.

A stack pattern STP may be formed on each of the first and second active patterns AP1 and AP2. The stack pattern STP may include the first semiconductor layers ACL and the second semiconductor layers SAL that are alternately stacked on each other. During the patterning process, the stack pattern STP may be formed together with the first and second active patterns AP1 and AP2.

A device isolation layer ST may be formed to fill the trench TR. For example, a dielectric layer may be formed on a surface of the first substrate 100 to cover the first and second active patterns AP1 and AP2 and the stack patterns STP. For example, the dielectric layer may be formed on an entire surface of the first substrate 100. The dielectric layer may be recessed until the stack patterns STP are exposed, and thus, the device isolation layer ST may be formed. The device isolation layer ST may extend in the second direction D2 to cover a top surface of the first substrate 100 on the passive element cell PDR.

The device isolation layer ST may include a dielectric material, such as a silicon oxide layer. The stack patterns STP may be exposed upwardly from the device isolation layer ST. For example, the stack patterns STP may vertically protrude upwards from the device isolation layer ST.

Figure 10A:
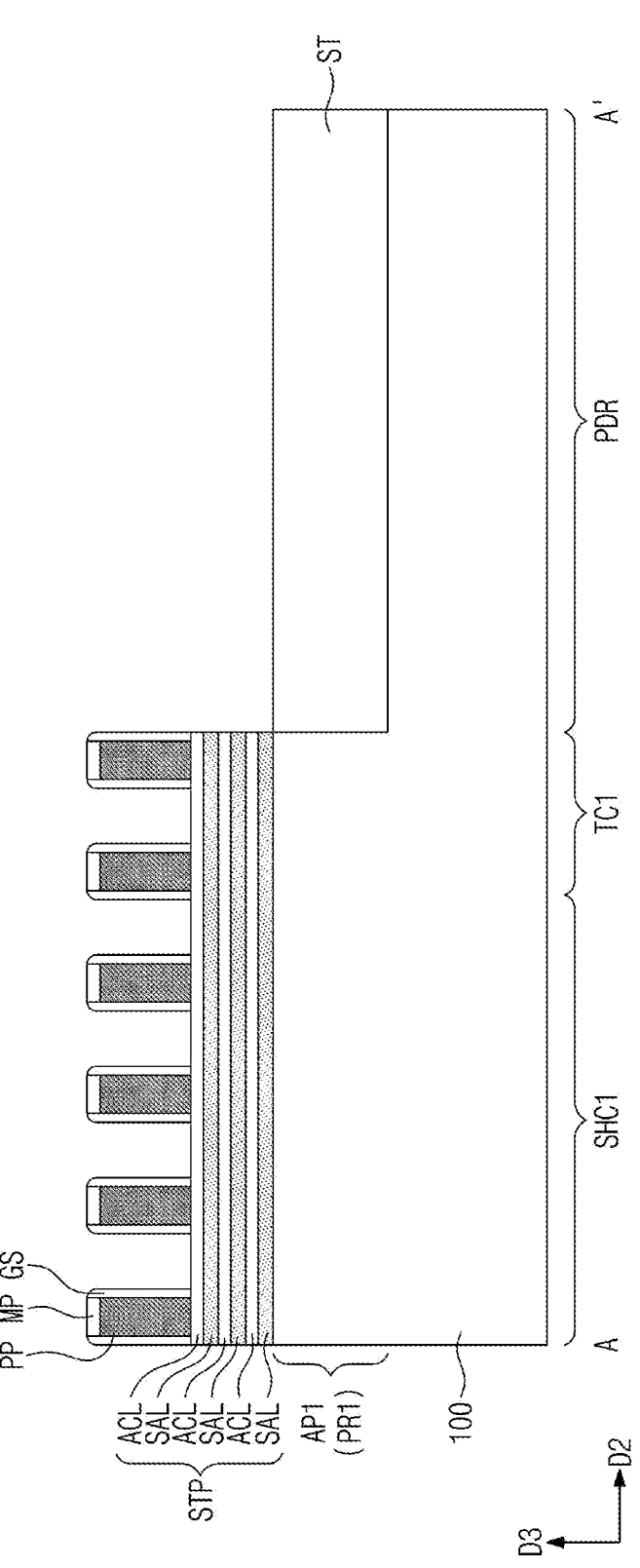
Figure 10B:
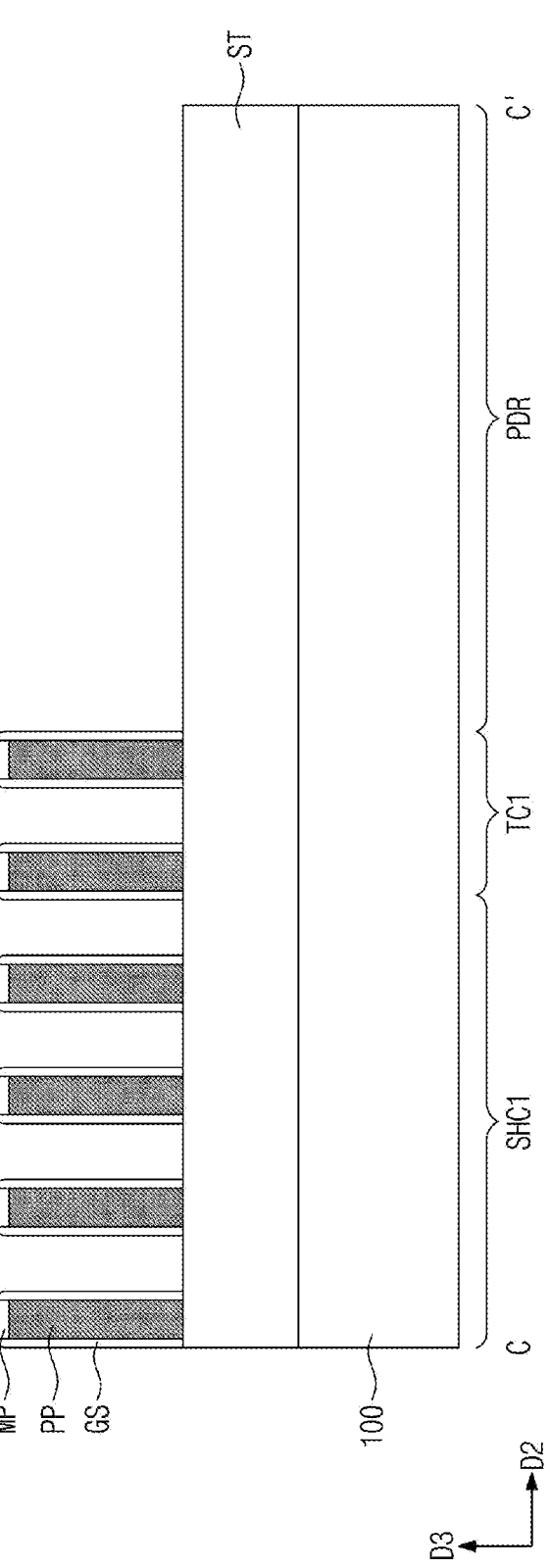
Figure 10C:
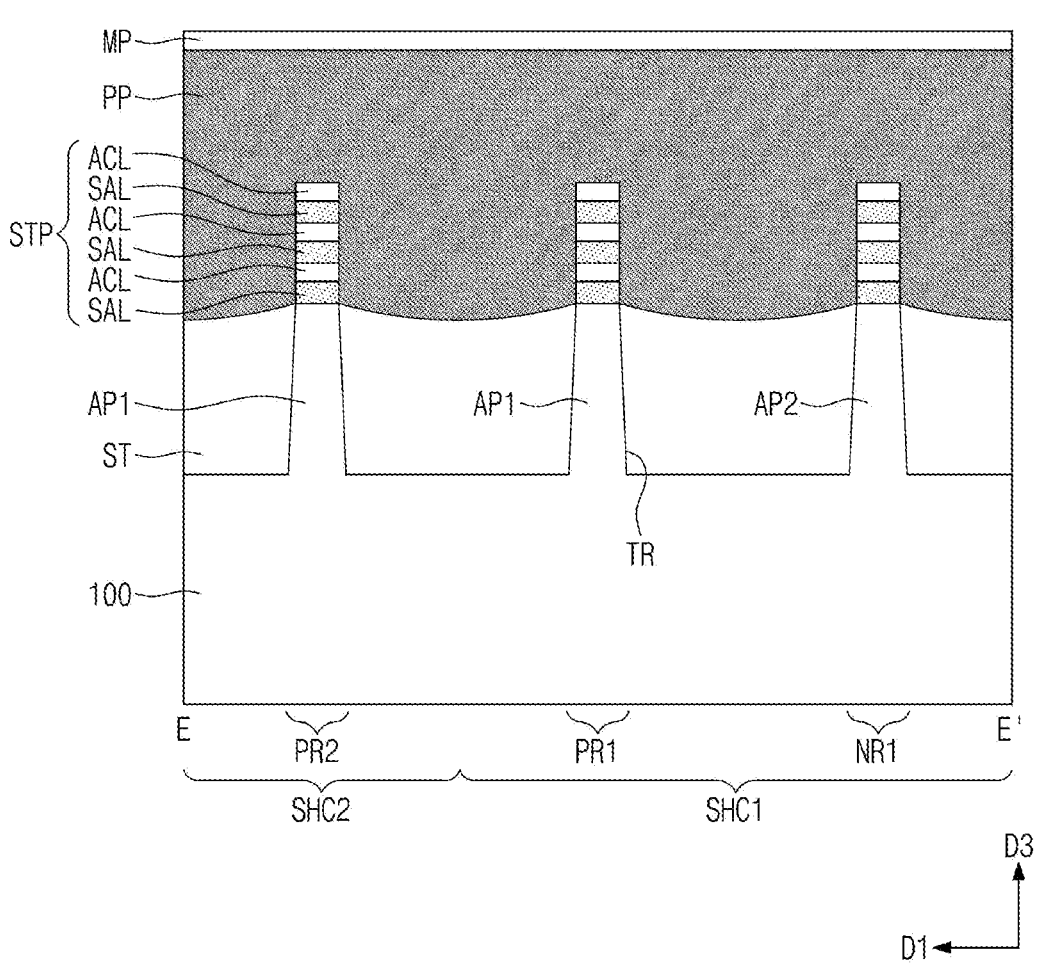

Referring to FIGS. 10A to 10C, sacrificial patterns PP may be formed on the first substrate 100, running across the stack patterns STP. Each of the sacrificial patterns PP may be formed to have a linear or bar shape that extends in a first direction D1. The sacrificial patterns PP may be arranged at a first pitch along the second direction D2.

For example, the formation of the sacrificial patterns PP may include forming a sacrificial layer on the surface of the first substrate 100, forming hardmask patterns MP on the sacrificial layer, and using the hardmask patterns MP as an etching mask to pattern the sacrificial layer. For example, the sacrificial layer may be formed on the entire surface of the first substrate 100. The sacrificial layer may include, for example, polysilicon.

A pair of gate spacers GS may be formed on opposite sidewalls of each of the sacrificial patterns PP. The formation of the gate spacers GS may include conformally forming a gate spacer layer on the surface of the first substrate 100 and anisotropically etching the gate spacer layer. For example, a gate spacer layer may be formed on the entire surface of the first substrate 100. The gate spacer layer may include at least one of, for example, SiCN, SiCON, and/or SiN. For example, the gate spacer layer may be a multiple layer including at least two of, for example, SiCN, SiCON, and/or SiN.

Figure 11A:
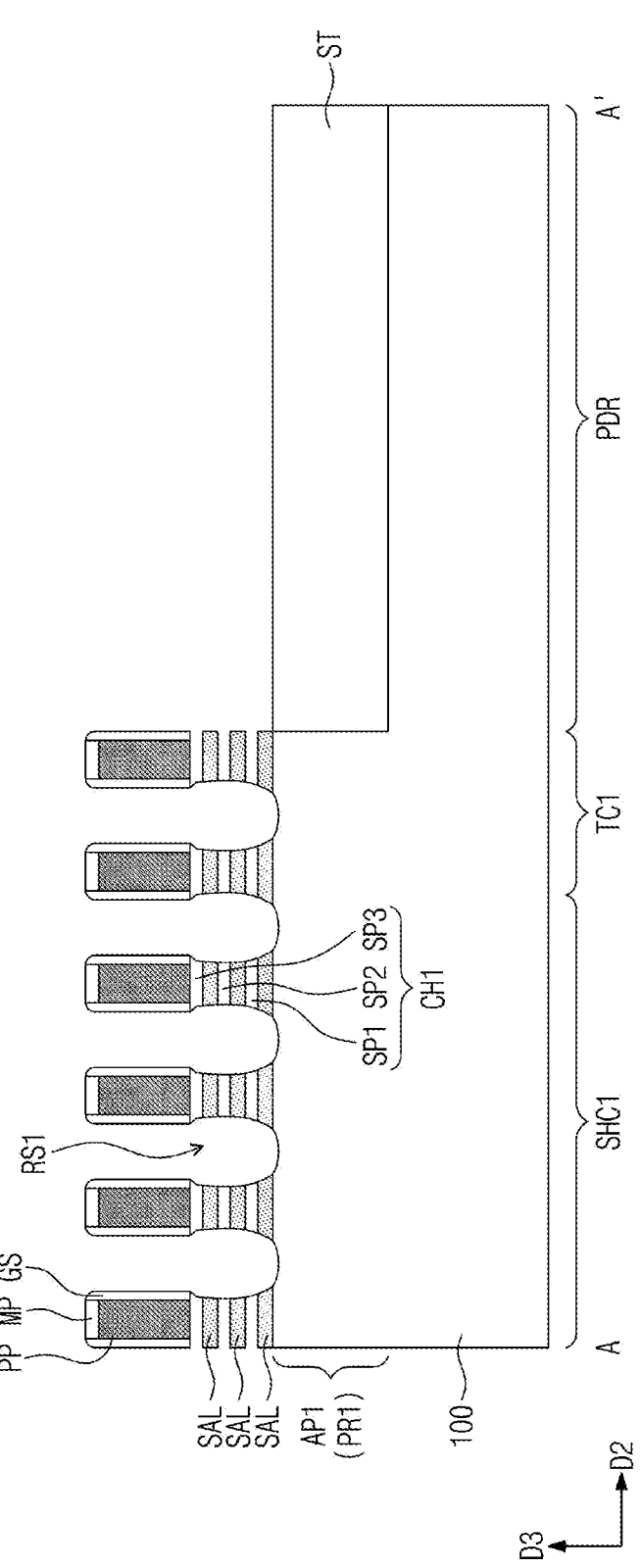
Figure 11B:
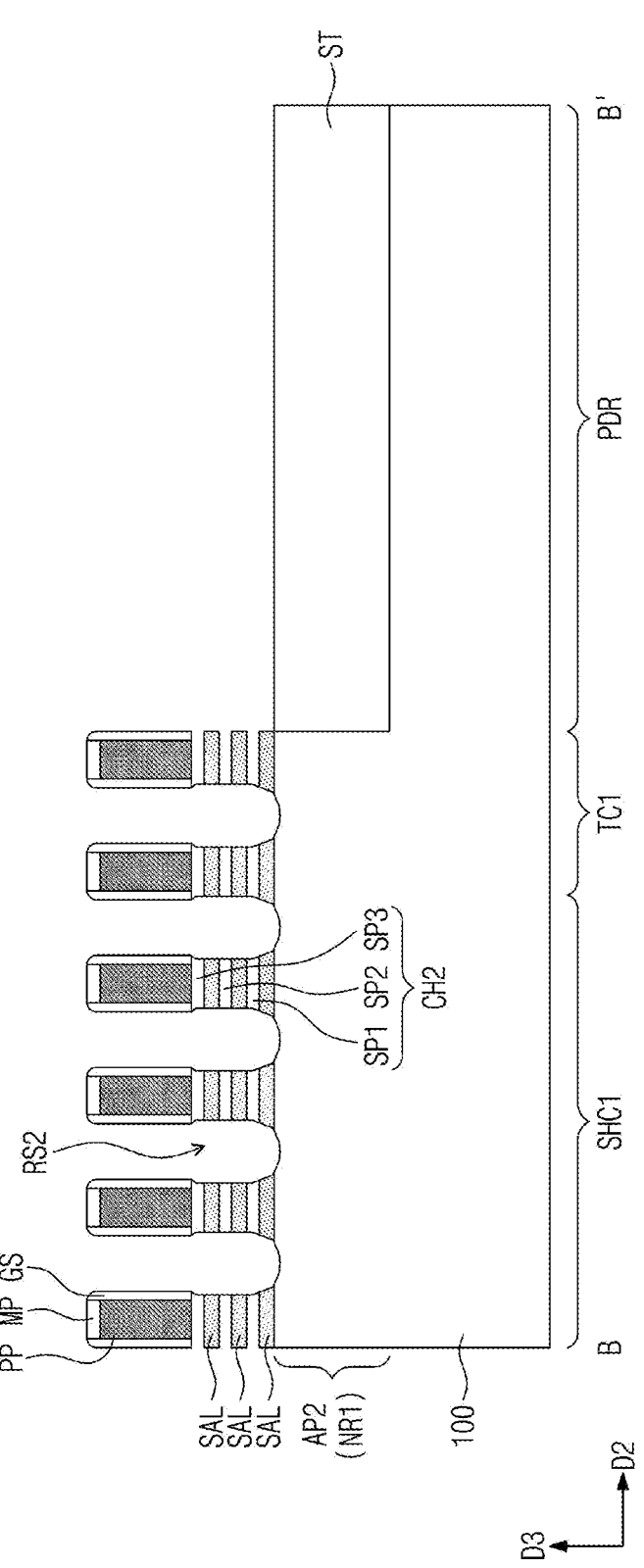
Figure 11C:
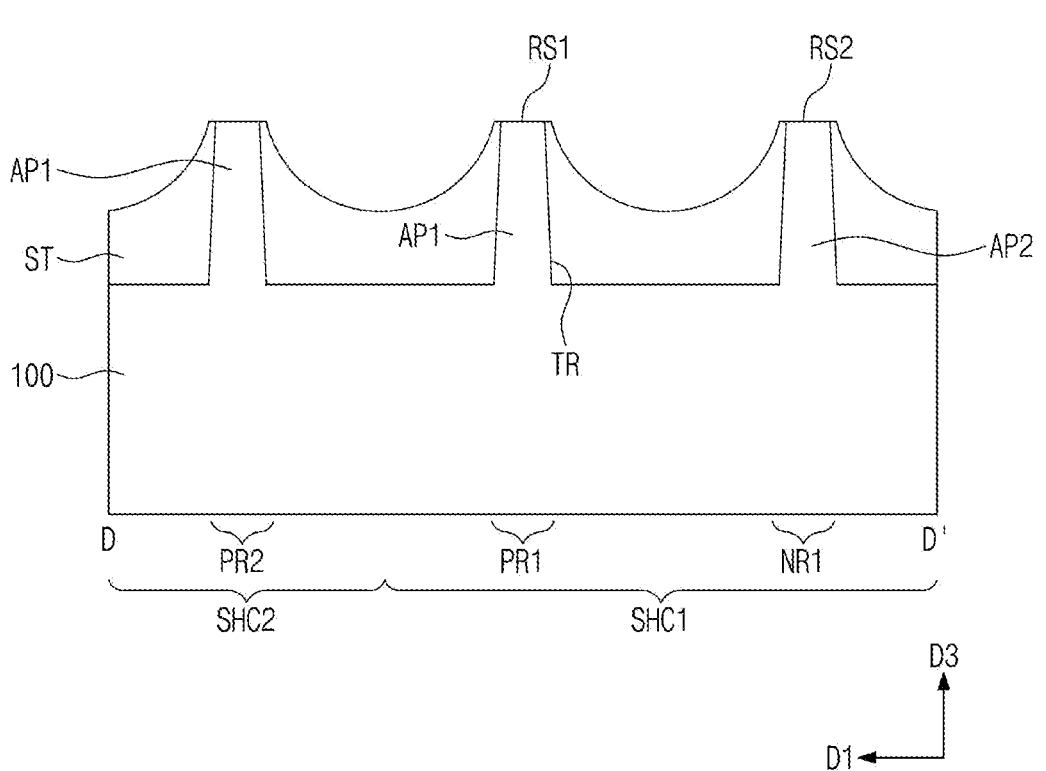

Referring to FIGS. 11A to 11C, first recesses RS1 may be formed in the stack pattern STP that is formed on the first active pattern AP1. Second recesses RS2 may be formed in the stack pattern STP that is formed on the second active pattern AP2.

For example, the hardmask patterns MP and the gate spacers GS may be used as an etching mask to etch the stack pattern STP that is on the first active pattern AP1 so that the first recesses RS1 may be formed. The first recess RS1 may be formed between a pair of sacrificial patterns PP. The second recesses RS2 in the stack pattern STP that is on the second active pattern AP2 may be formed by the same method used for the formation of the first recesses RS1.

The first semiconductor layers ACL may be formed into first, second, and third semiconductor patterns SP1, SP2, and SP3 that are sequentially stacked between neighboring first recesses RS1. The first semiconductor layers ACL may be formed into first, second, and third semiconductor patterns SP1, SP2, and SP3 that are sequentially stacked between neighboring second recesses RS2. A first channel pattern CH1 may include the first, second, and third semiconductor patterns SP1, SP2, and SP3 that are disposed between neighboring first recesses RS1. A second channel pattern CH2 may include the first, second, and third semiconductor patterns SP1, SP2, and SP3 that are disposed between neighboring second recesses RS2.

Figure 12A:
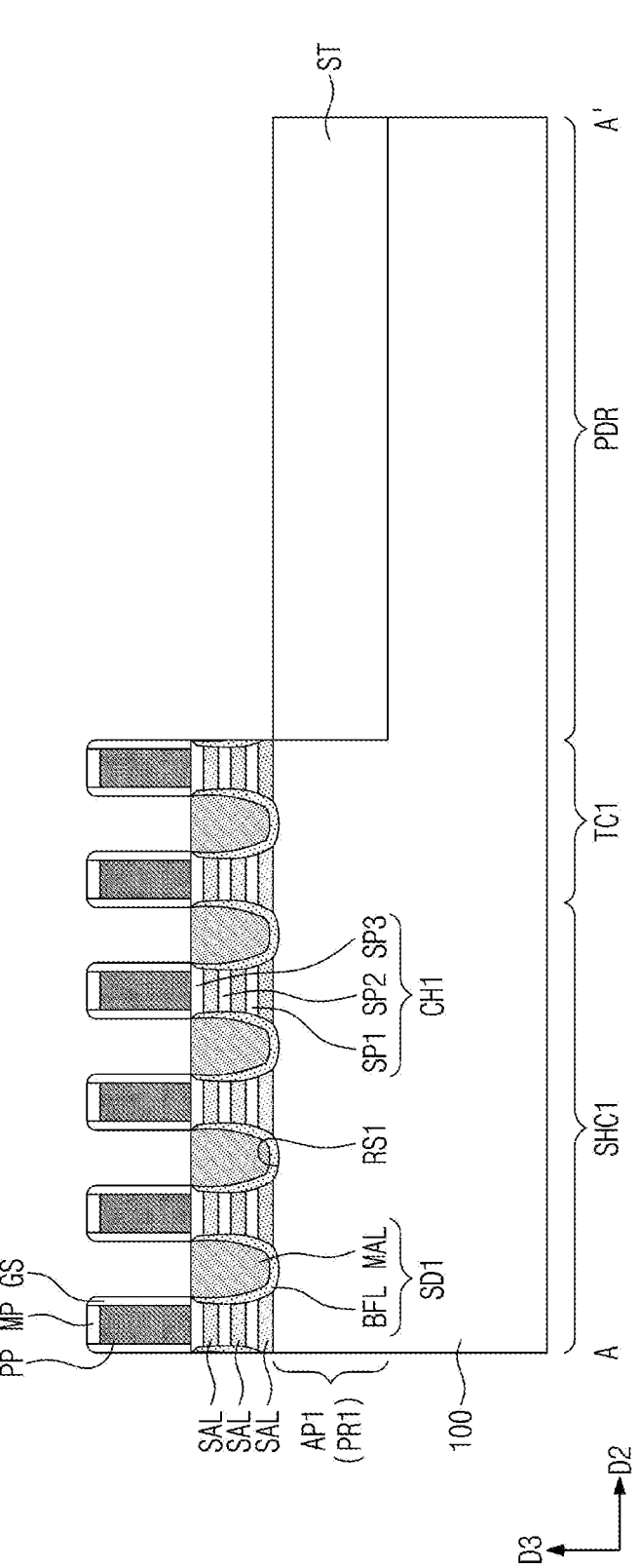
Figure 12B:
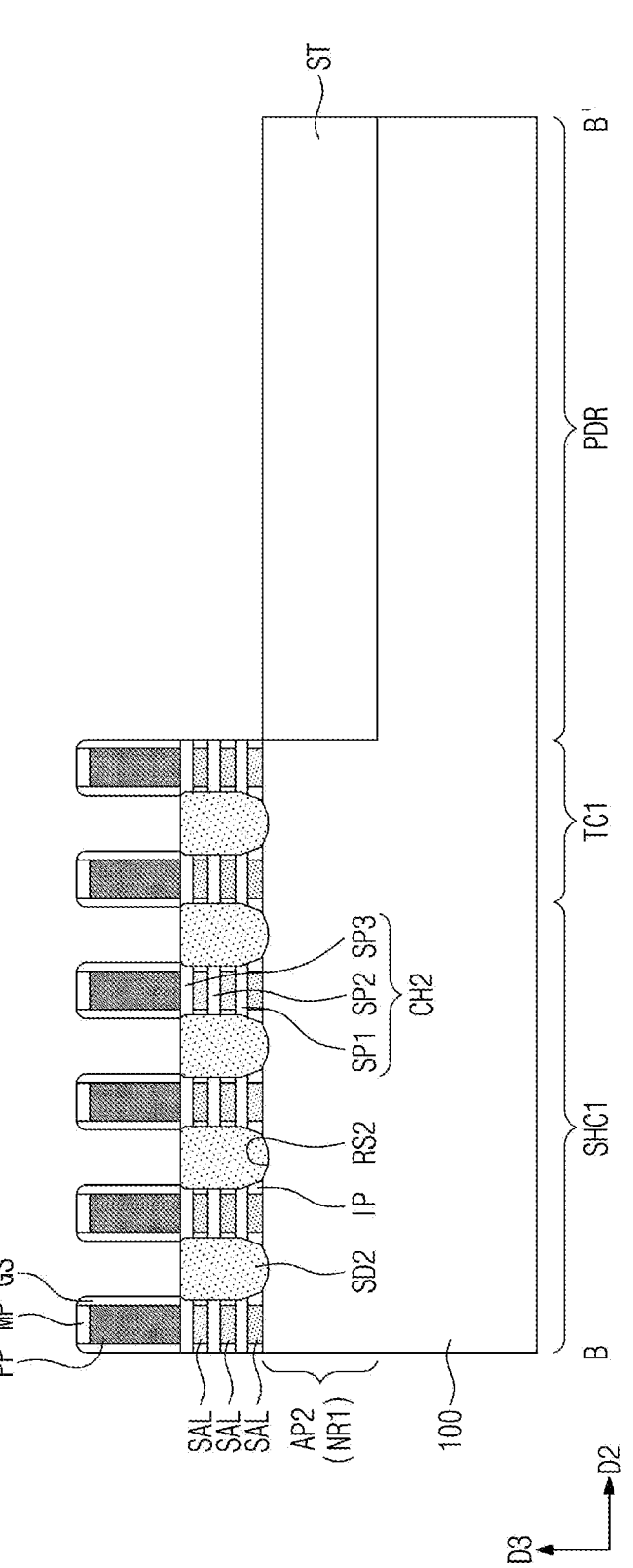
Figure 12C:
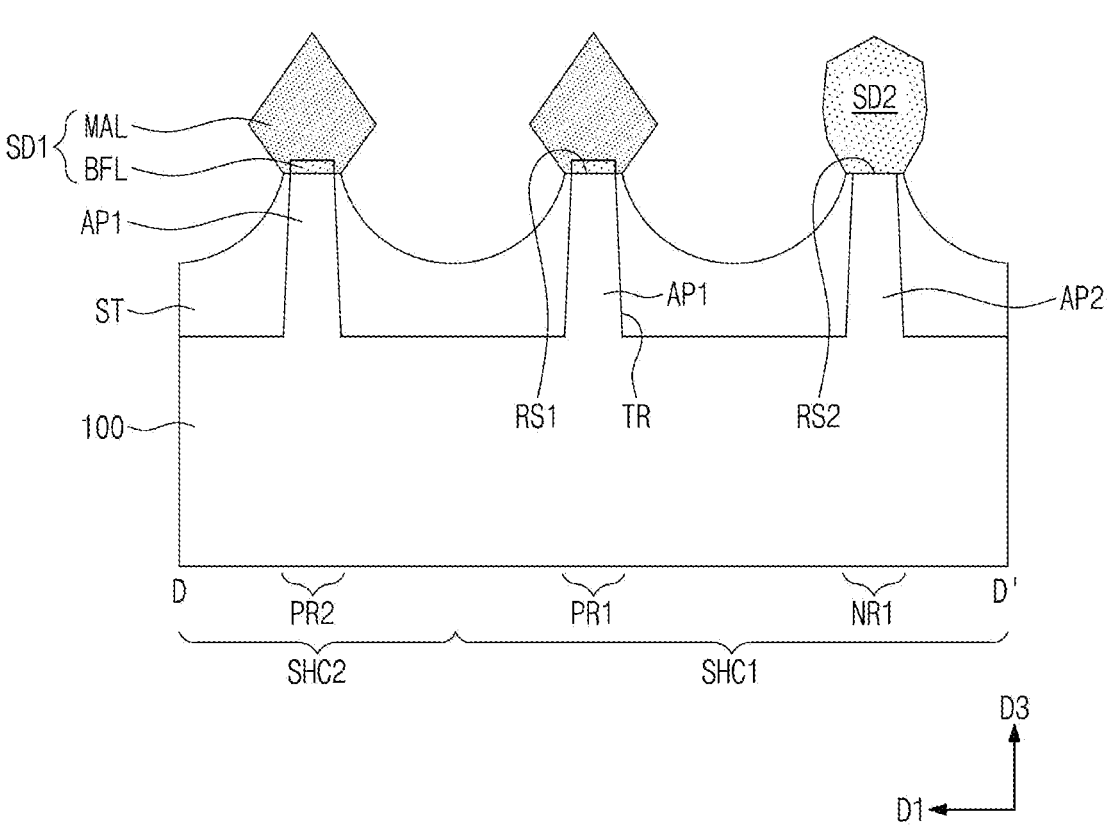

Referring to FIGS. 12A to 12C, first source/drain patterns SD1 may be correspondingly formed in the first recesses RS1. For example, a first selective epitaxial growth (SEG) process may be performed in which an inner wall of the first recess RS1 is used as a seed layer to form a buffer layer BFL. For example, the buffer layer BFL may be grown from a seed, or the first substrate 100 and the first, second, and third semiconductor patterns SP1, SP2, and SP3 exposed by the first recess RS1. For example, the first SEG process may include chemical vapor deposition (CVD) or molecular beam epitaxy (MBE).

The buffer layer BFL may include a semiconductor element (e.g., SiGe) whose lattice constant is greater than that of a semiconductor element of the first substrate 100. The buffer layer BFL may include germanium (Ge) whose concentration is relatively low. In an embodiment of the present inventive concept, the buffer layer BFL might not include germanium (Ge), but include only silicon (Si). The germanium concentration of the buffer layer BFL may range from about 0 at % to about 30 at %.

The buffer layer BFL may undergo a second SEG process to form a main layer MAL. The main layer MAL may be formed to completely or almost completely fill the first recess RS1. The main layer MAL may include germanium (Ge) whose concentration is relatively high. For example, the germanium concentration of the main layer MAL may range from about 30 at % to about 70 at %.

In an embodiment of the present inventive concept, the main layer MAL may undergo a third SEG process to form a capping layer. The capping layer may include silicon (Si). A silicon concentration of the capping layer may range from about 98 at % to about 100 at %.

For example, during the formation of the buffer layer BFL and the main layer MAL, impurities (e.g., boron, gallium, or indium) may be in-situ implanted to allow the first source/drain pattern SD1 to have a p-type conductivity. In addition, after the formation of the first source/drain pattern SD1, impurities may be implanted into the first source/drain pattern SD1.

Second source/drain patterns SD2 may be correspondingly formed in the second recesses RS2. For example, the formation of the second source/drain pattern SD2 may include performing a selective epitaxial growth process in which an inner wall of the second recess RS2 is used as a seed layer. For example, the second source/drain pattern SD2 may be formed of the same semiconductor element (e.g., Si) as that of the first substrate 100.

For example, during the formation of the second source/drain pattern SD2, impurities (e.g., phosphorus, arsenic, or antimony) may be in-situ implanted to allow the second source/drain pattern SD2 to have an n-type conductivity. In addition, after the formation of the second source/drain pattern SD2, impurities may be implanted into the second source/drain pattern SD2.

In an embodiment of the present inventive concept, before the formation of the second source/drain pattern SD2, a portion of the second semiconductor layer SAL exposed through the second recess RS2 may be replaced with a dielectric material to form an inner spacer IP. Thus, the inner spacers IP may be correspondingly formed between the second source/drain pattern SD2 and the second semiconductor layers SAL.

Referring to FIGS. 13A to 13E, a first interlayer dielectric layer 110 may be formed to cover the first and second source/drain patterns SD1 and SD2, the hardmask patterns MP, and the gate spacers GS. The first interlayer dielectric layer 110 may cover a top surface of the device isolation layer ST that is on the passive element cell PDR. For example, the first interlayer dielectric layer 110 may include a silicon oxide layer.

The first interlayer dielectric layer 110 may be planarized until top surfaces of the sacrificial patterns PP are exposed. An etch-back or chemical mechanical polishing (CMP) process may be employed to planarize the first interlayer dielectric layer 110. The hardmask patterns MP may be removed during the planarization process. For example, an entirety of the hardmask patterns MP may be removed. As a result, the first interlayer dielectric layer 110 may have a top surface substantially coplanar with those of the sacrificial patterns PP and those of the gate spacers GS.

A photolithography process may be used to selectively open one region of the sacrificial pattern PP. For example, one region of the sacrificial pattern PP on a boundary between the first and second single height cells SHC1 and SHC2 may be selectively opened. The opened portion of the sacrificial pattern PP may be selectively etched and removed. A space where the sacrificial pattern PP is removed may be filled with a dielectric material to form a gate cutting pattern CT (see FIG. 13C).

The exposed sacrificial patterns PP may be selectively removed. The removal of the sacrificial patterns PP may form an outer region ORG that exposes the first and second channel patterns CH1 and CH2 (see FIG. 13D). The removal of the sacrificial patterns PP may include performing a wet etching process using an etchant that selectively etches polysilicon.

Figure 13A:
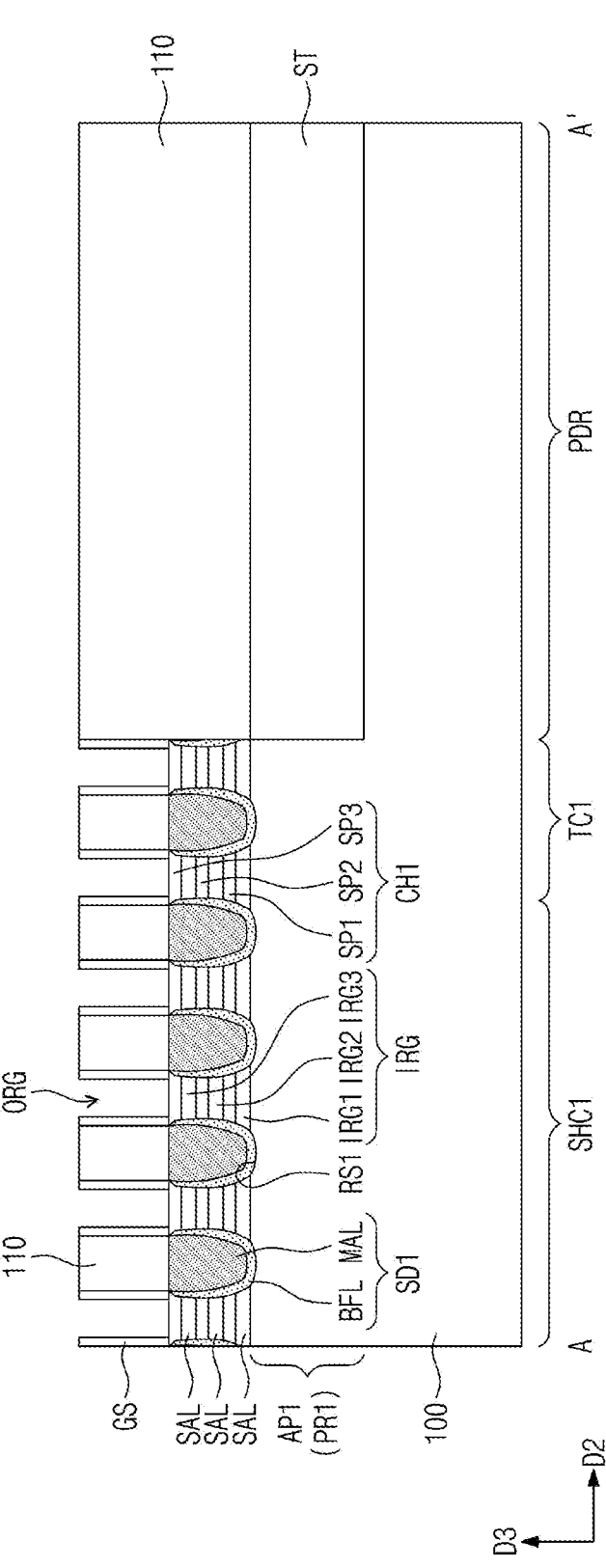
Figure 13B:
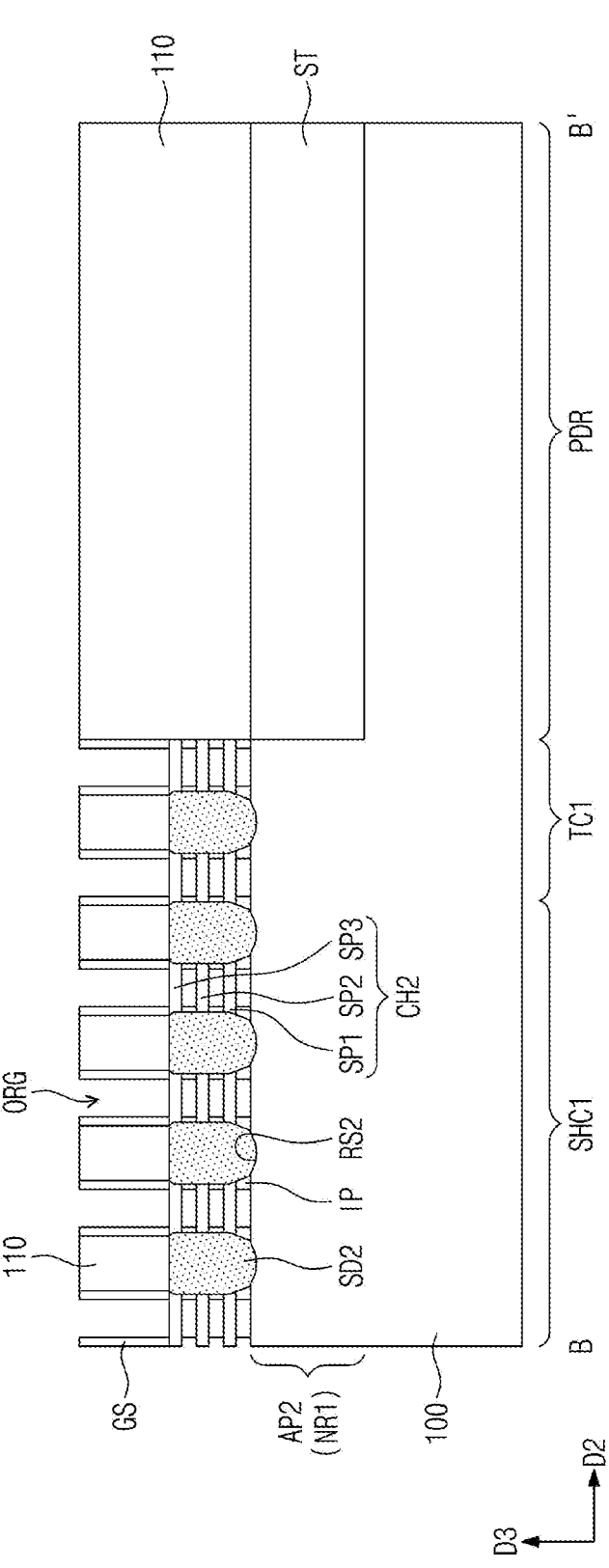
Figure 13C:
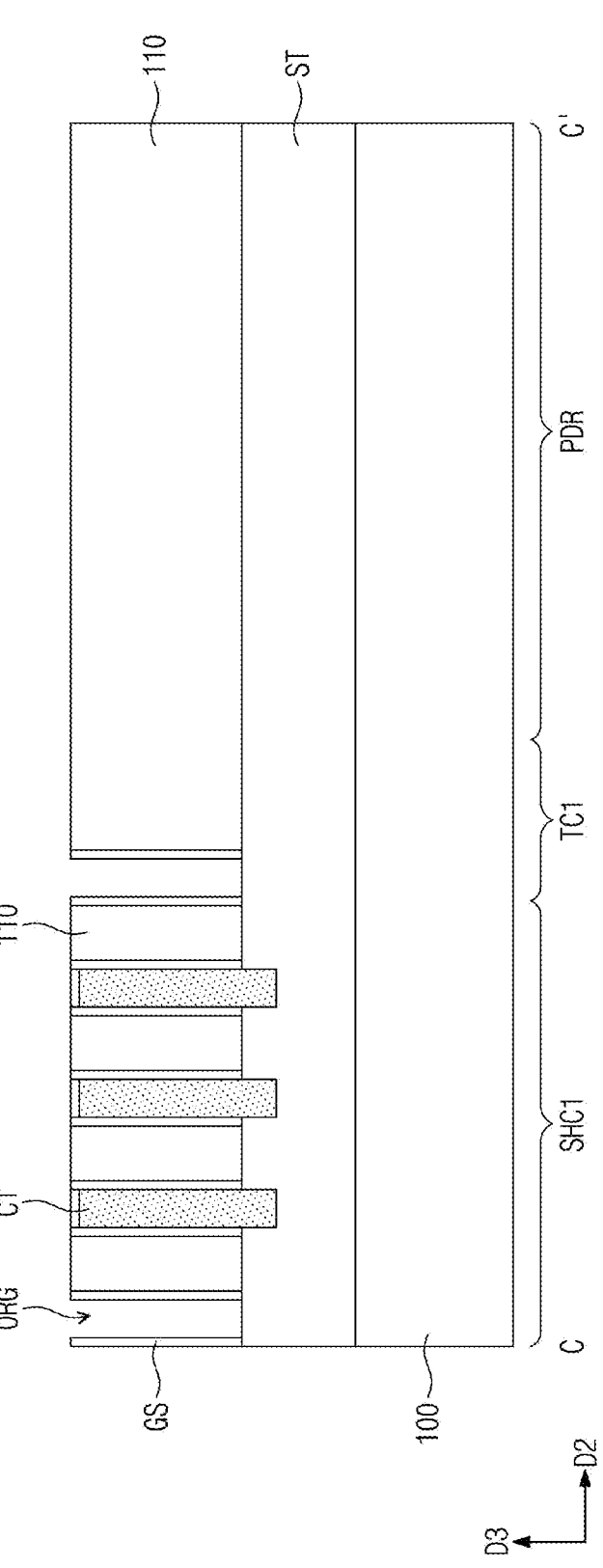
Figure 13D:
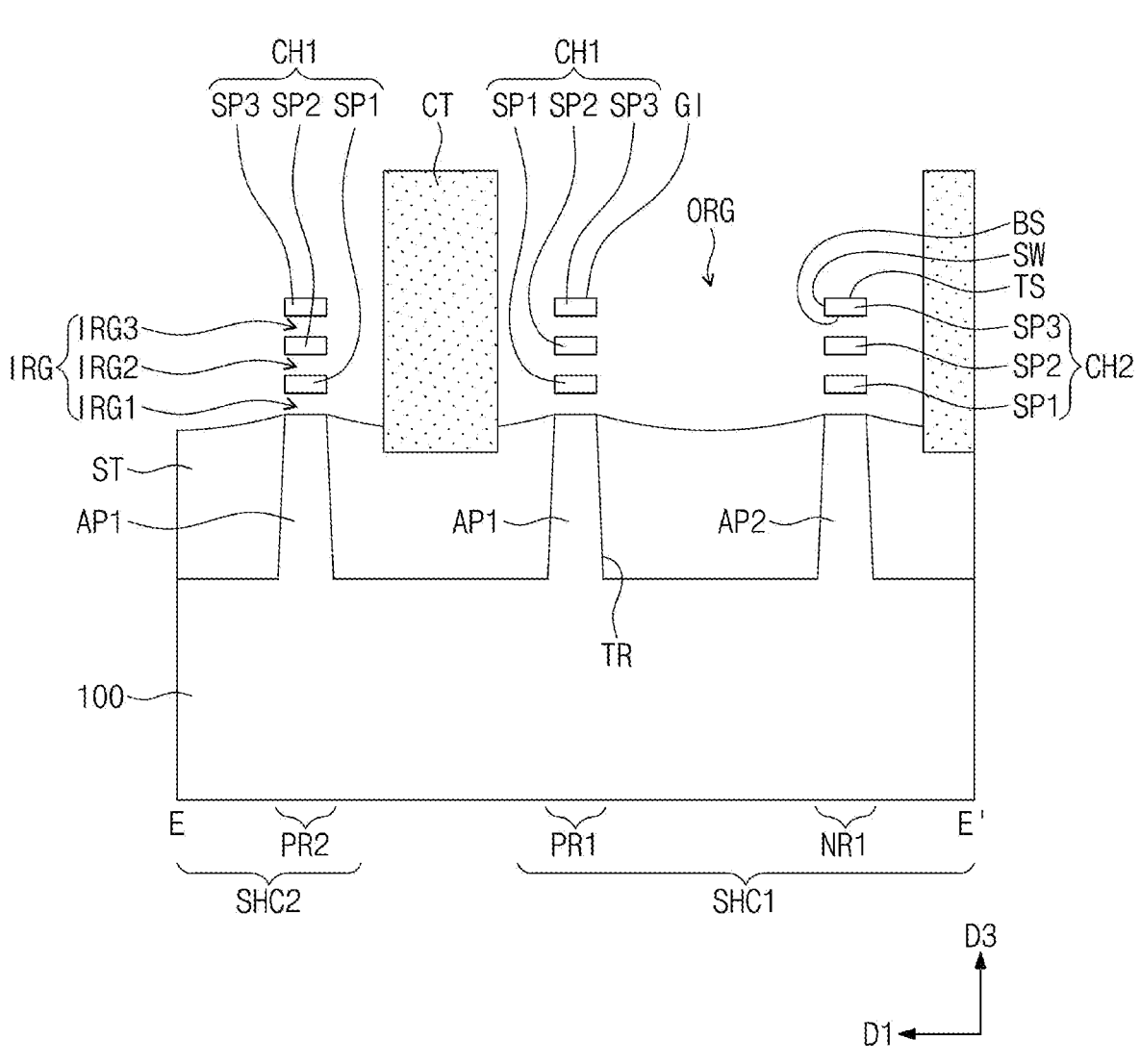
Figure 13E:
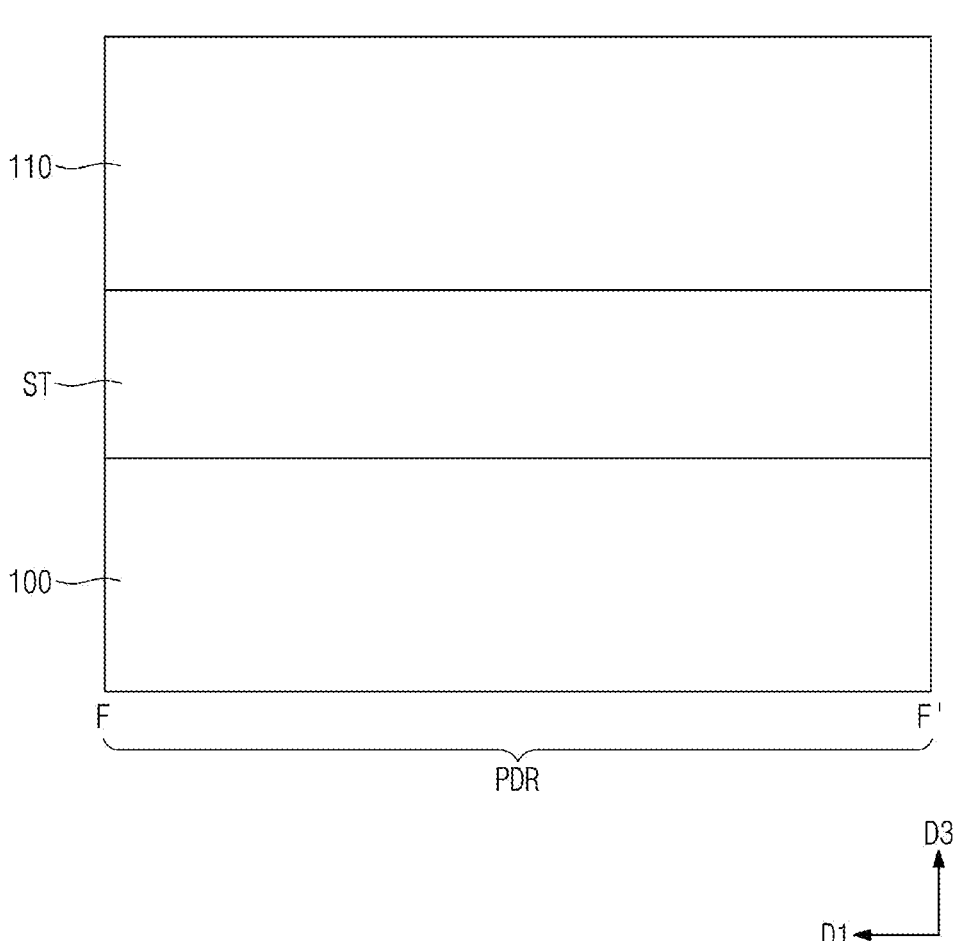
Figure 14A:
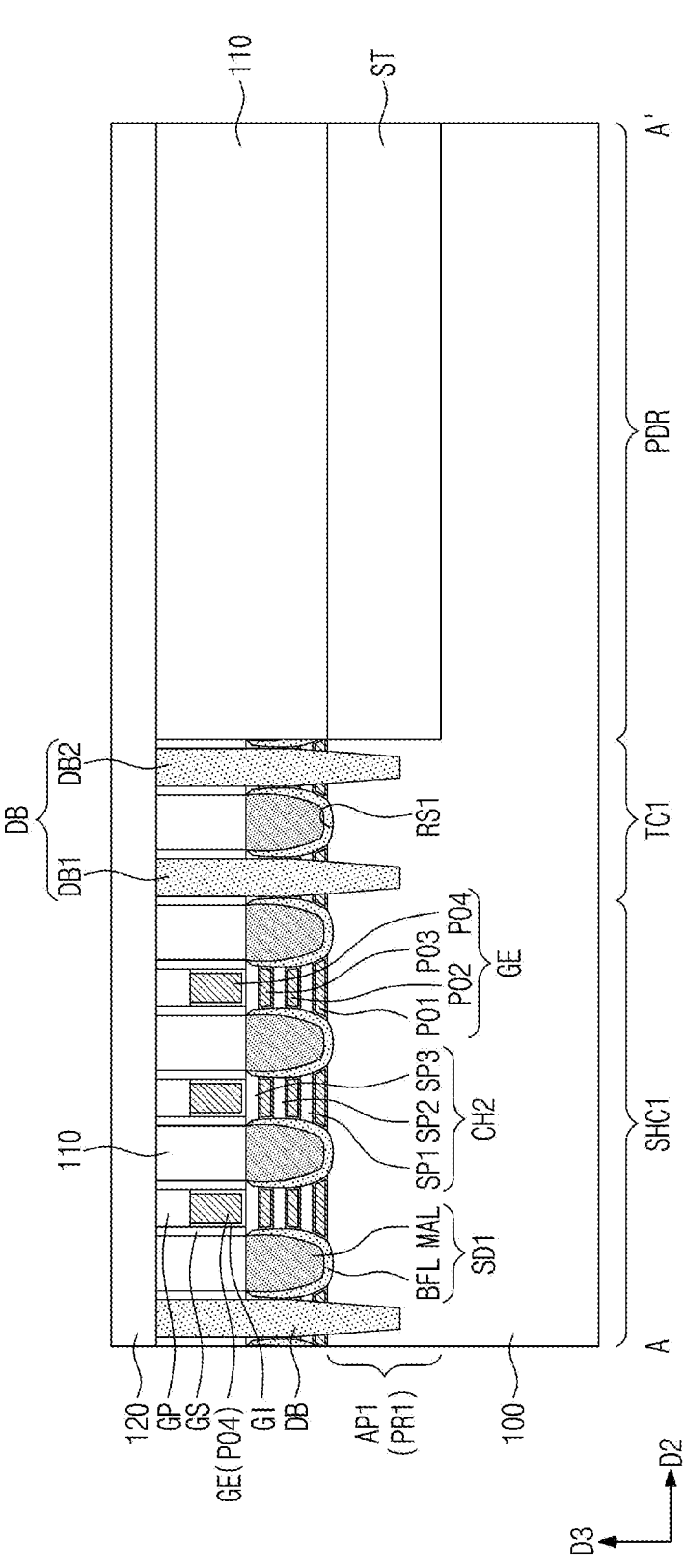
Figure 14B:
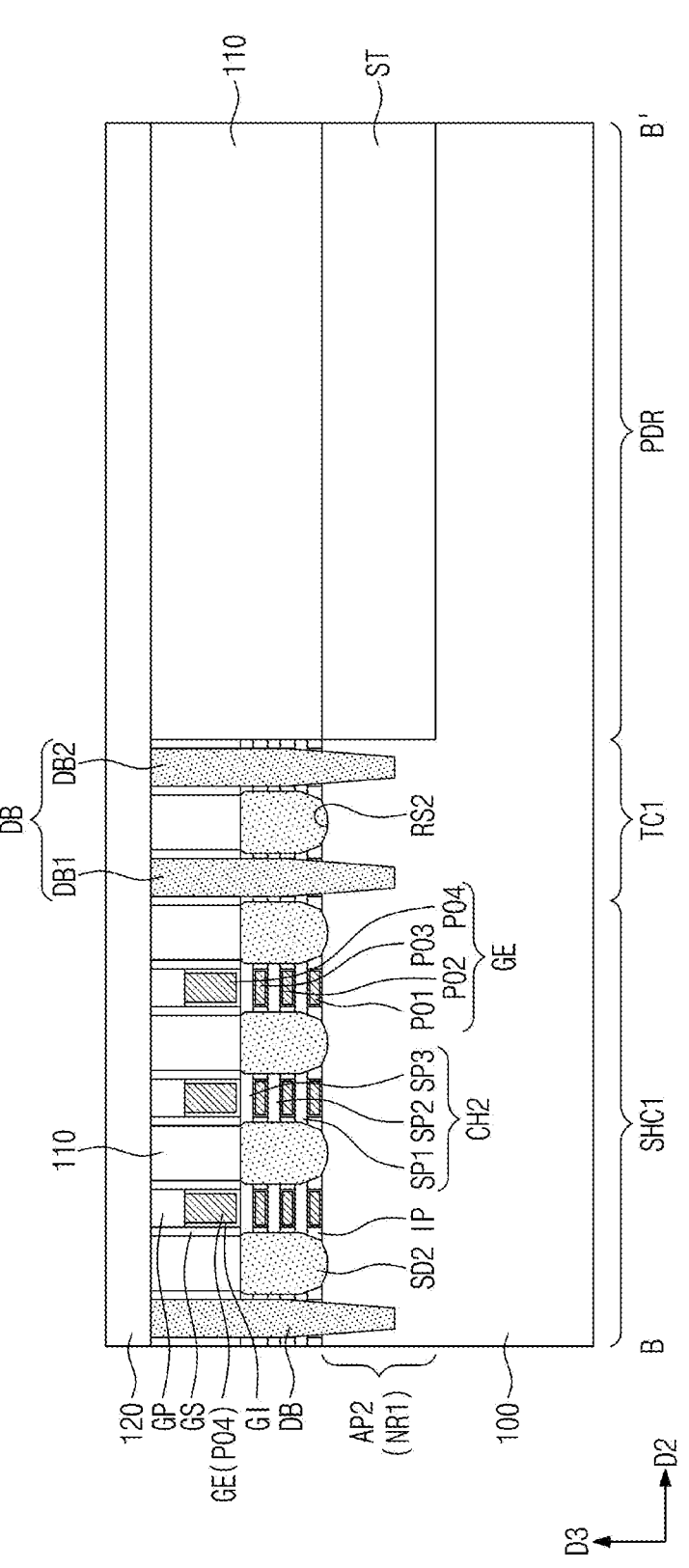
Figure 14C:
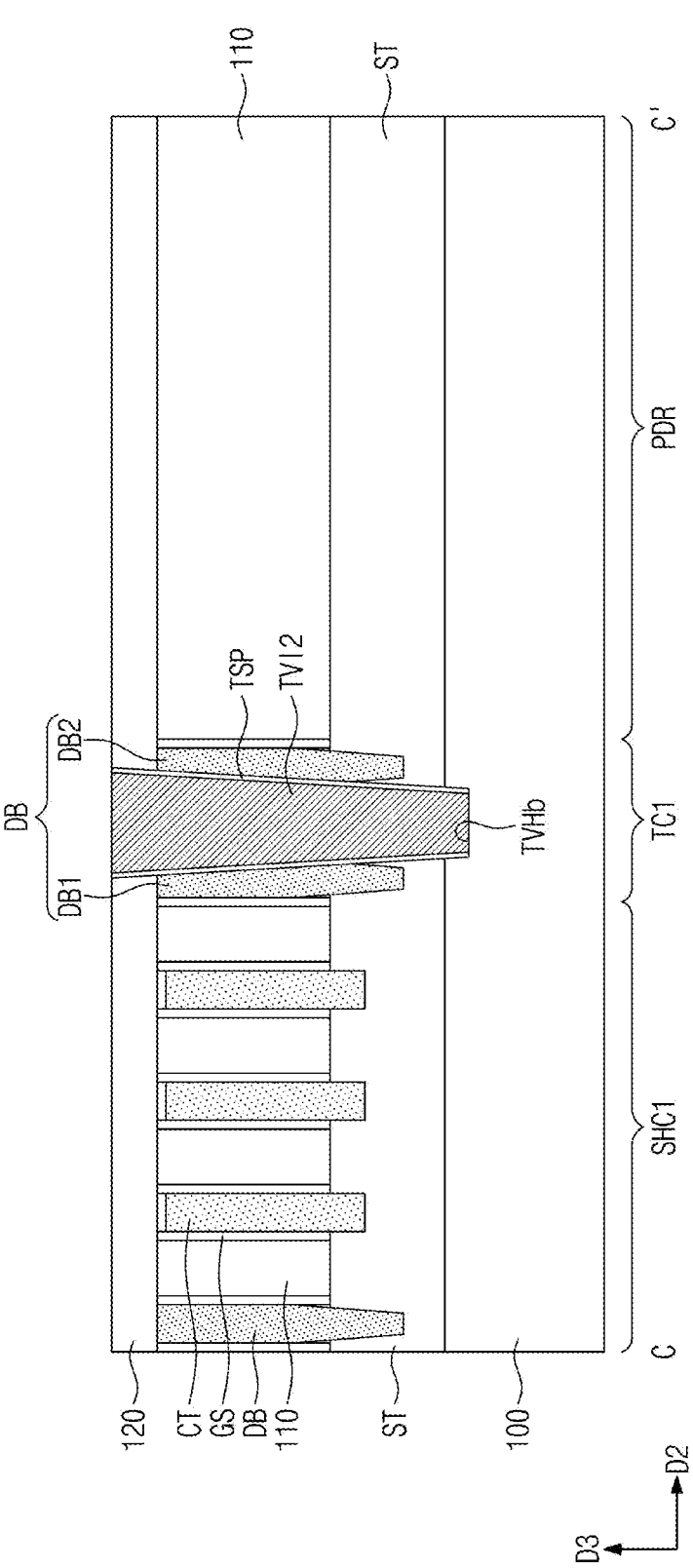
Figure 14D:
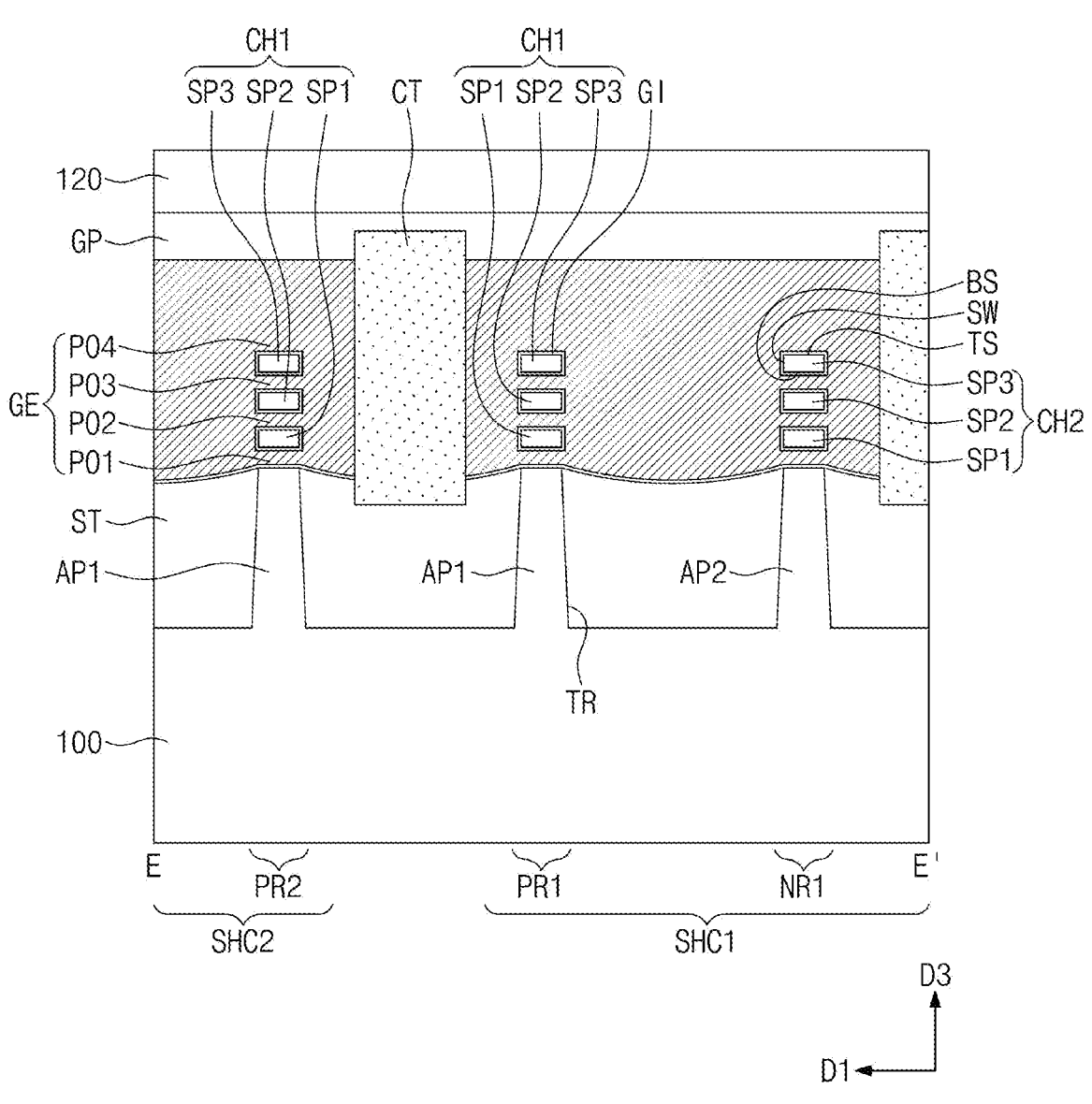
Figure 14E:
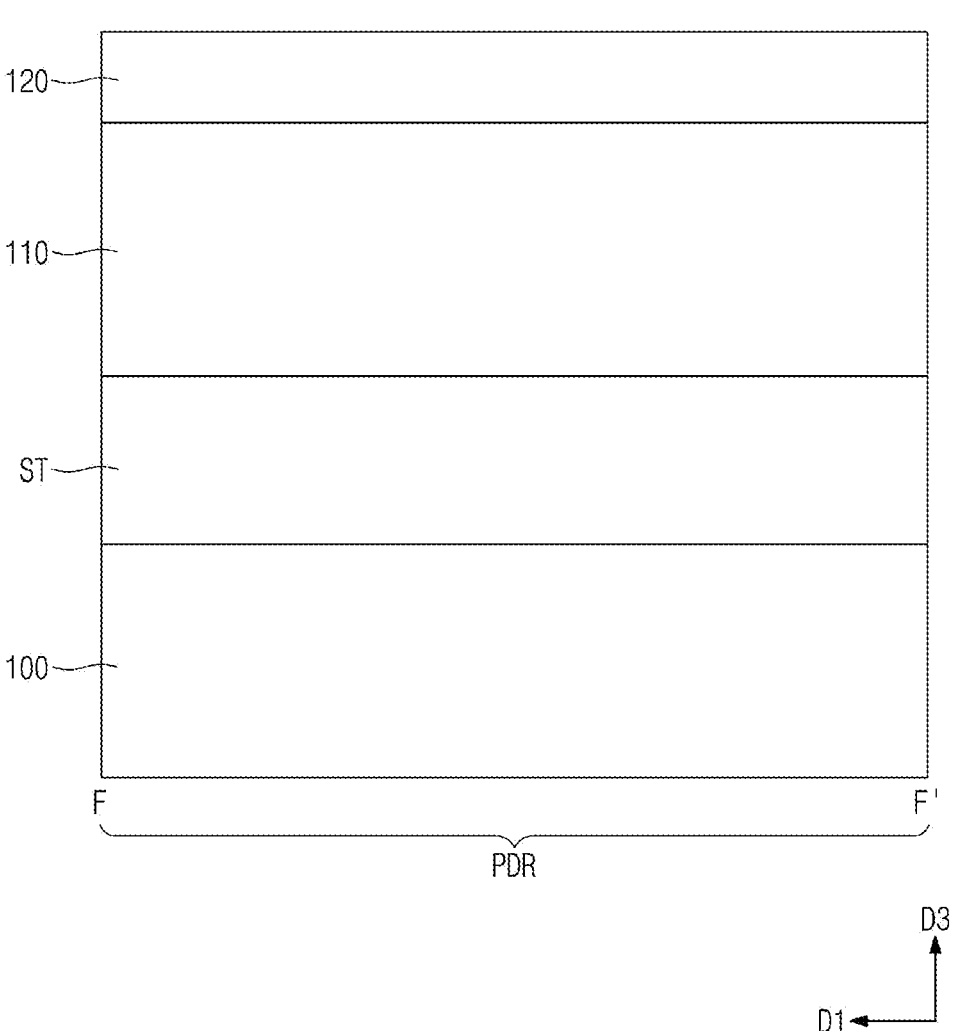
Figure 15C:
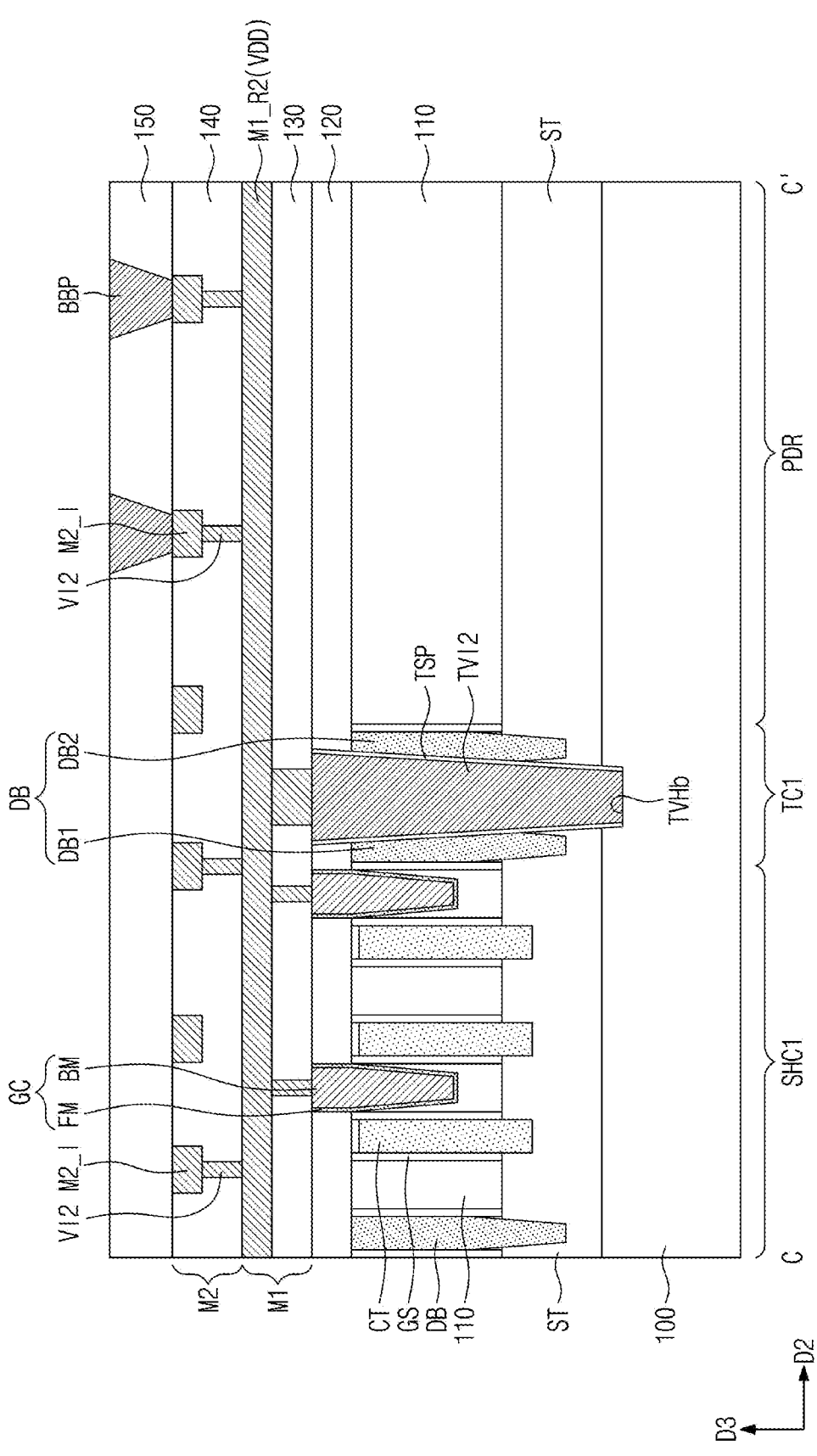
Figure 15D:
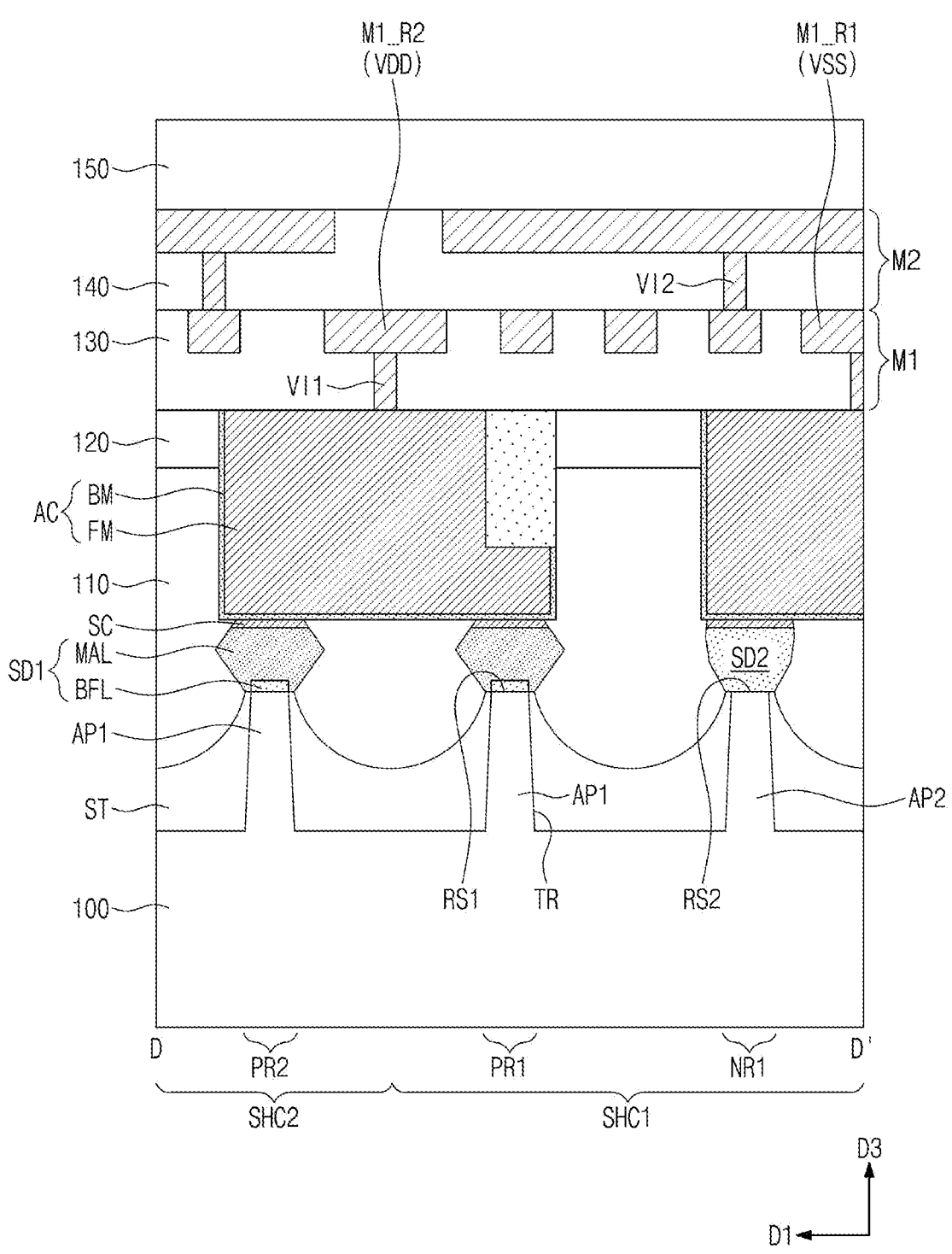
Figure 15E:
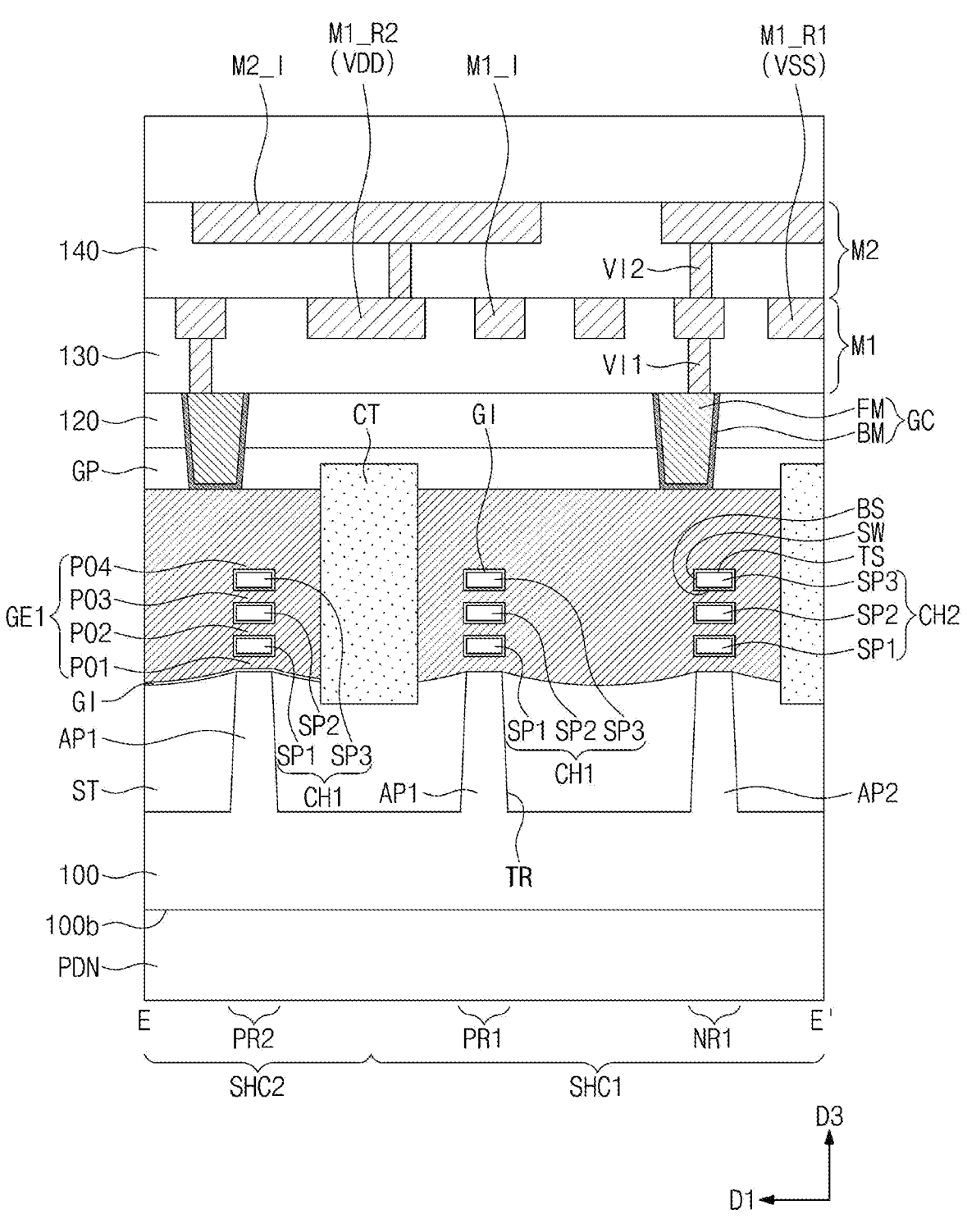
Figure 15F:
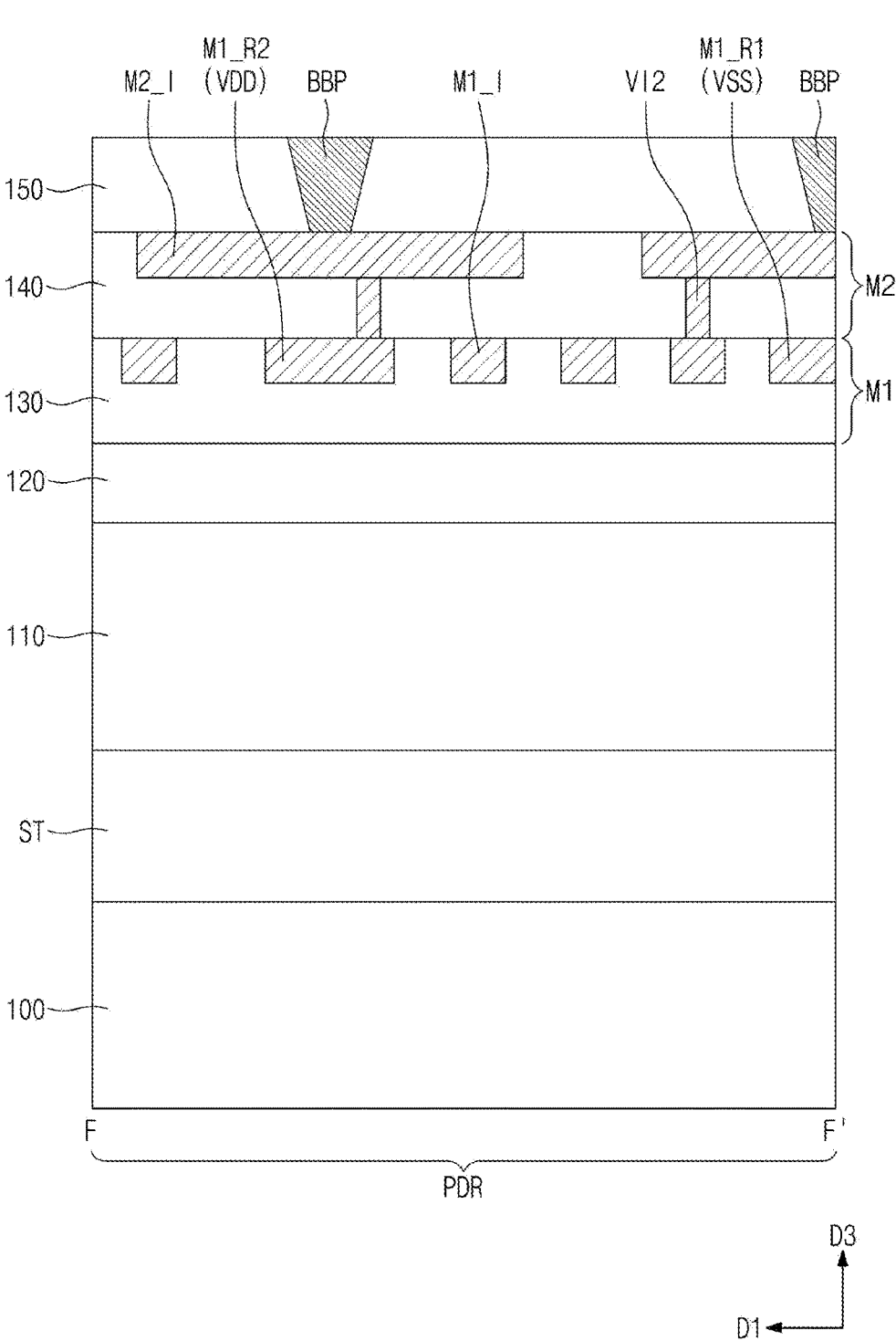
Figure 16A:
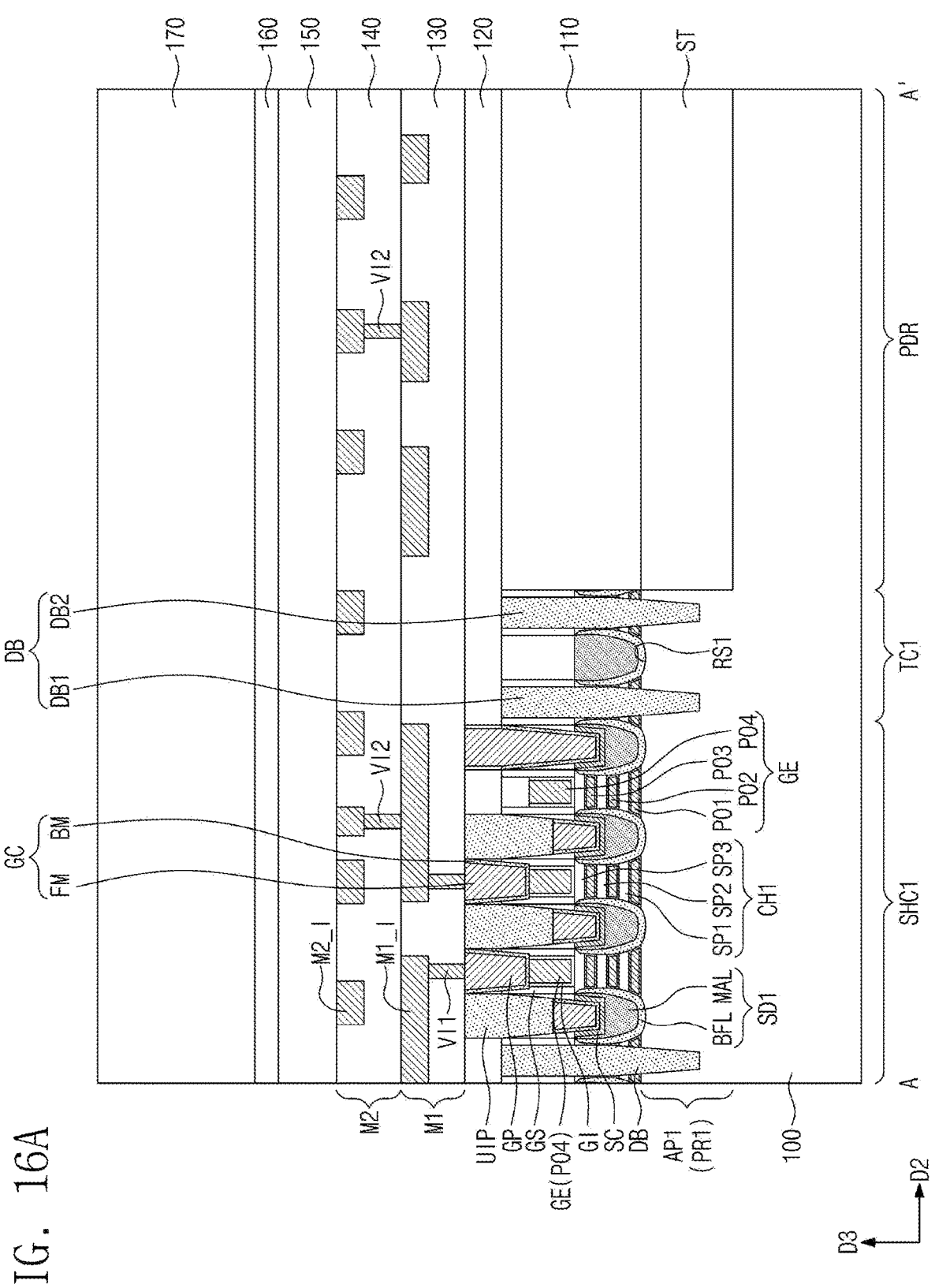
Figure 16B:
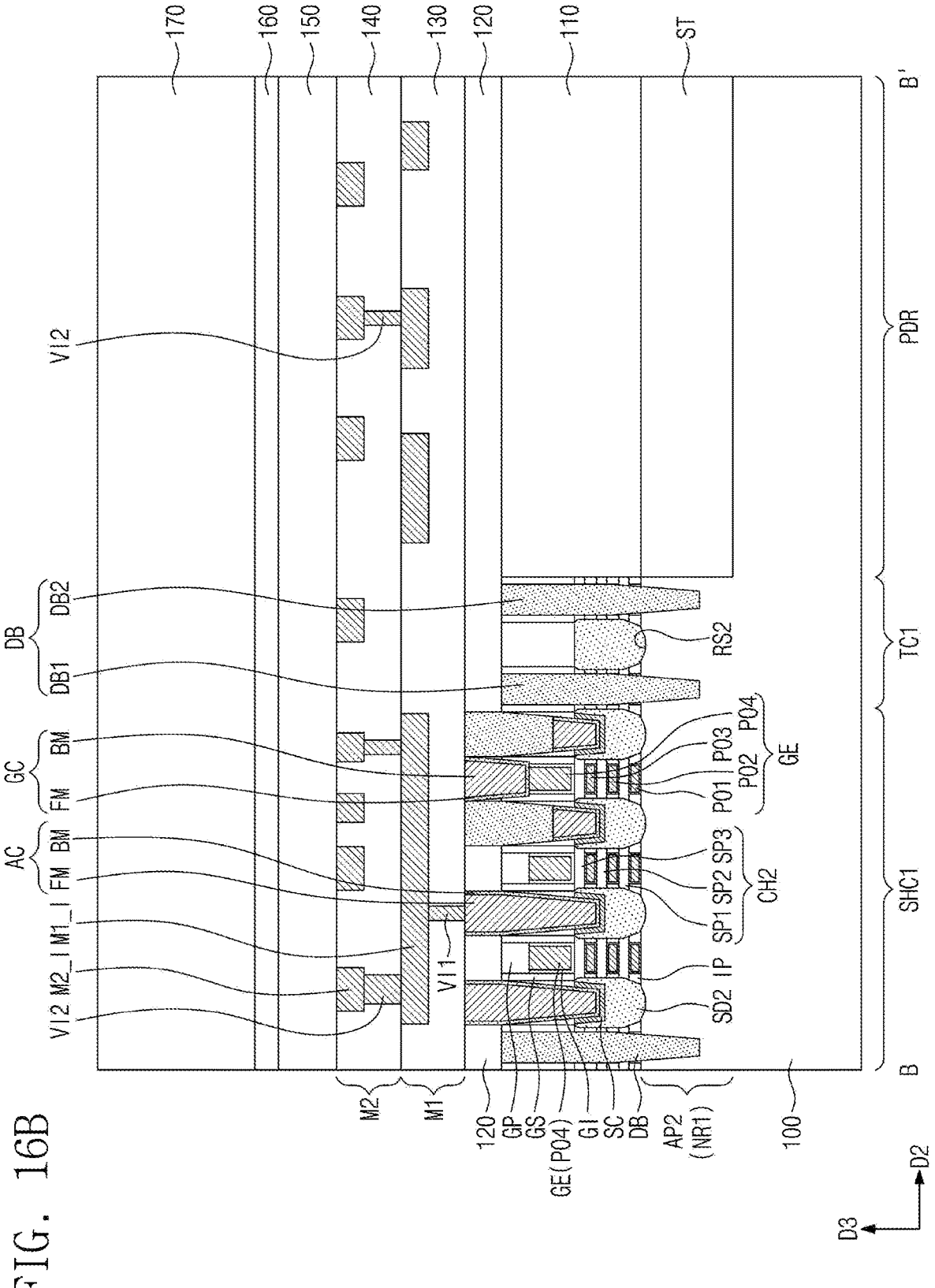
Figure 16C:
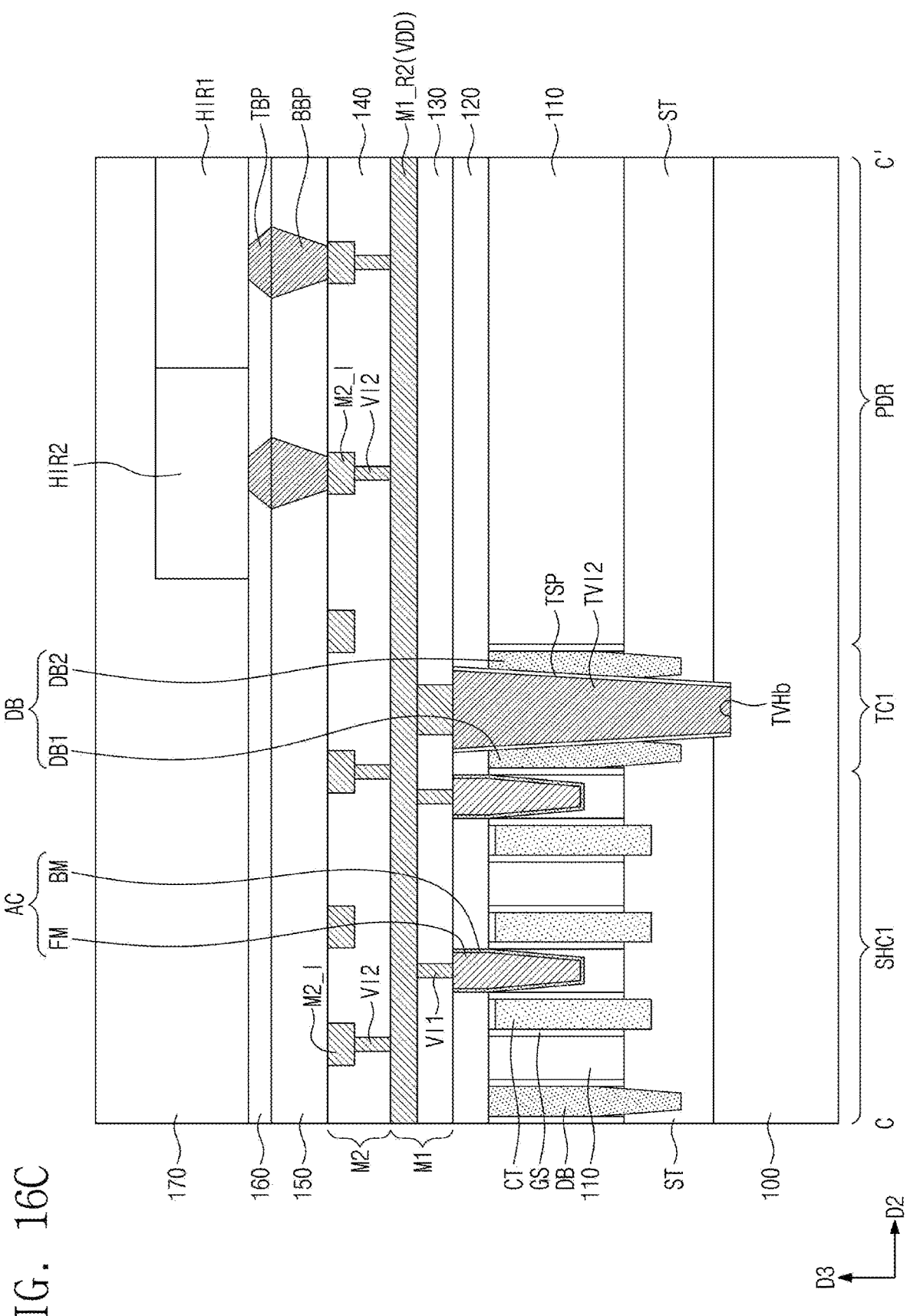
Figure 16D:
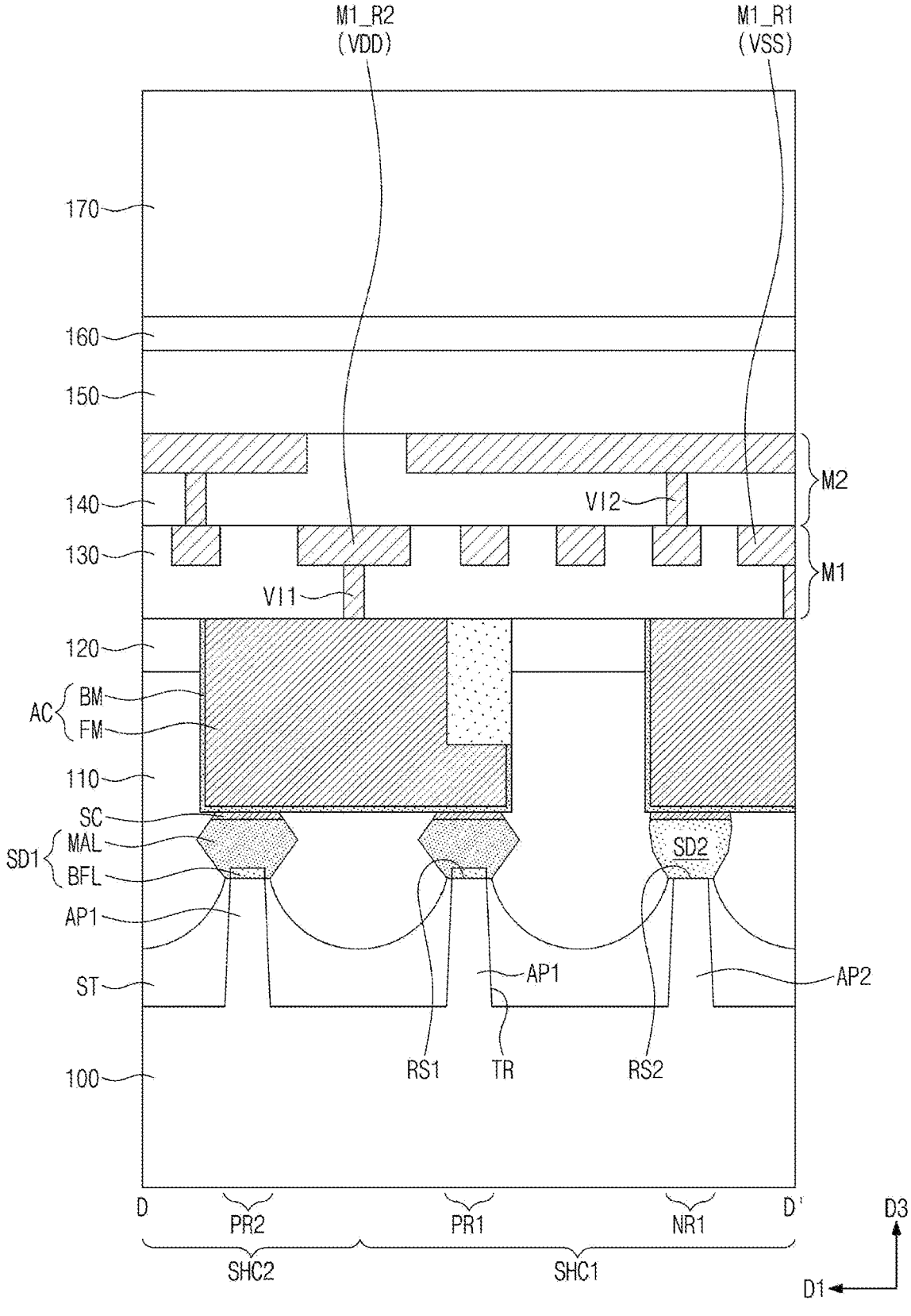
Figure 16E:
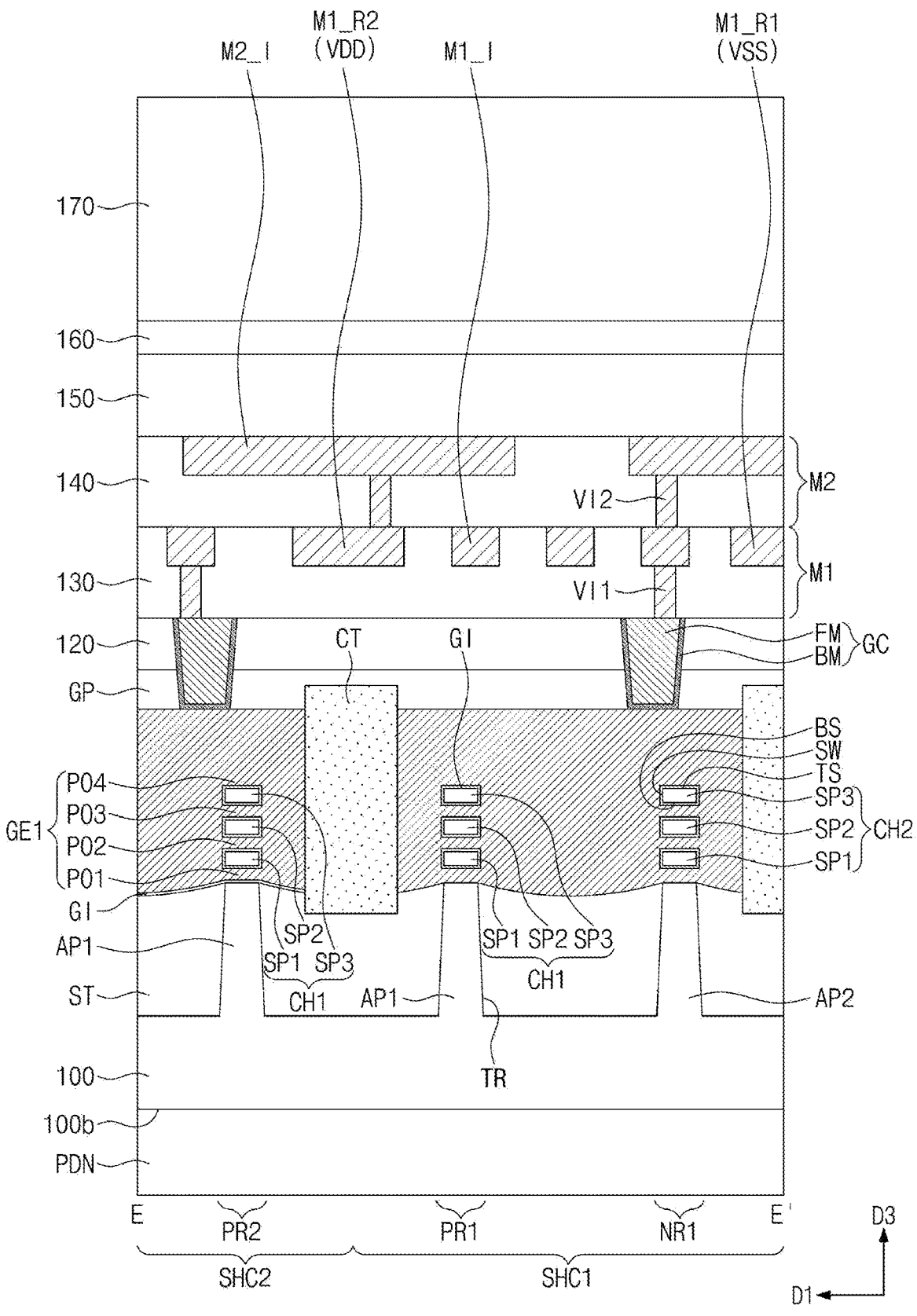
Figure 16F:
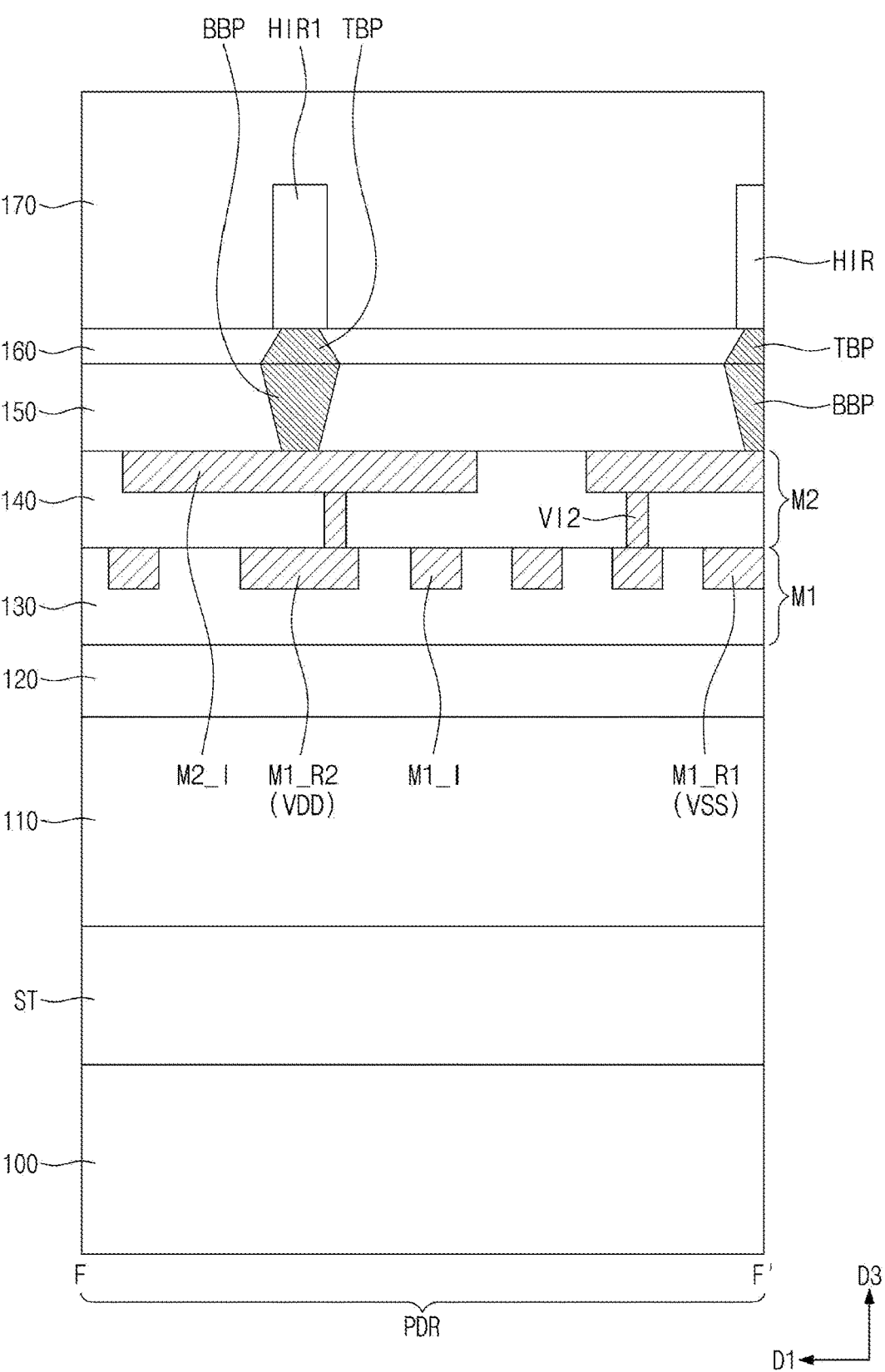

The second semiconductor layers SAL exposed through the outer region ORG may be selectively removed to form inner regions IRG (see FIG. 13D). For example, an etching process that selectively etches the second semiconductor layers SAL may be performed such that only the second semiconductor layers SAL may be removed while leaving the first, second, and third semiconductor patterns SP1, SP2, and SP3. The etching process may have a high etch rate with respect to silicon-germanium having a relatively high germanium concentration. For example, the etching process may have a high etch rate with respect to silicon-germanium whose germanium concentration is greater than about 10 at %.

During the etching process, the second semiconductor layers SAL may be removed from the first and second PMOSFET regions PR1 and PR2 and from the first and second NMOSFET regions NR1 and NR2. For example, the second semiconductor layers SAL may be completely removed from the first and second PMOSFET regions PR1 and PR2 and from the first and second NMOSFET regions NR1 and NR2. The etching process may be, for example, a wet etching process. An etching material used for the etching process may promptly etch the second semiconductor layer SAL whose germanium concentrate is relatively high. During the etching process, the first source/drain pattern SD1 on the first and second PMOSFET regions PR1 and PR2 may be protected by the buffer layer BFL whose germanium concentration is relatively low.

Referring back to FIG. 13D, as the second semiconductor layers SAL are selectively removed, only the stacked first, second, and third semiconductor patterns SP1, SP2, and SP3 may remain on each of the first and second active patterns AP1 and AP2. The removal of the second semiconductor layers SAL may form first, second, and third inner regions IRG1, IRG3, and IRG3.

For example, the first inner region IRG1 may be formed between the active pattern AP1 or AP2 and the first semiconductor pattern SP1. For example, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Referring to FIGS. 14A to 14E, a gate dielectric layer GI may be conformally formed on the exposed first, second, and third semiconductor patterns SP1, SP2, and SP3. A gate electrode GE may be formed on the gate dielectric layer GI. The gate electrode GE may include first, second, and third inner electrodes PO1, PO2, and PO3 that are respectively formed in the first, second, and third inner regions IRG1, IRG2, and IRG3, and may also include an outer electrode PO4 formed in the outer region ORG.

The gate electrode GE may be recessed to have a reduced height. While the gate electrode GE is recessed, an upper portion of the gate cutting pattern CT may also be slightly recessed. A gate capping pattern GP may be formed on the recessed gate electrode GE.

A separation structure DB may be formed on a boundary between cells. The separation structure DB may penetrate the gate capping pattern GP and the gate electrode GE to extend into the active pattern AP1 or AP2. The separation structure DB may include a dielectric material, such as a silicon oxide layer or a silicon nitride layer. A second interlayer dielectric layer 120 may be formed on the first interlayer dielectric layer 110. The second interlayer dielectric layer 120 may include, for example, a silicon oxide layer.

Referring back to FIG. 14C, through holes may be formed to penetrate the first and second interlayer dielectric layers 110 and 120 to expose the first substrate 100. For example, at least one through hole may be formed on a boundary between the first and second tap cells TC1 and TC2. A width of the through hole may decrease with decreasing distance from the first substrate 100. For example, the through hole may have a tapered shape.

A bottom surface of the through hole may be lower than that of the trench TR. An upper spacer TSP may be formed on an inner sidewall of the through hole. The upper spacer TSP may be formed of a silicon-based dielectric material (e.g., silicon oxide, silicon nitride, or silicon oxynitride).

First, second, and third through vias TVI1, TVI2, and TVI3 may be formed in the through holes. The formation of the first, second, and third through vias TVI1, TVI2, and TVI3 may include performing at least one deposition process selected from physical vapor deposition (PVD), chemical vapor deposition (CVD), and atomic layer deposition (ALD).

The first, second, and third through vias TVI1, TVI2, and TVI3 may include at least one of, for example, tungsten (W), molybdenum (Mo), ruthenium (Ru), aluminum (Al), titanium (Ti), and/or tantalum (Ta).

Referring to FIGS. 15A to 15F, active contacts AC may be formed to penetrate the second and first interlayer dielectric layers 120 and 110 to come into electrical connection with the first and second source/drain patterns SD1 and SD2. A gate contact GC may be formed to penetrate the second interlayer dielectric layer 120 and the gate capping pattern GP to be electrically connected with the gate electrode GE. A third interlayer dielectric layer 130 may be formed on the active contacts AC and the gate contacts GC. A first metal layer M1 may be formed in the third interlayer dielectric layer 130. The first metal layer M1 may include first, second, and third power lines M1_R1, M1_R2, and M1_R3 that are electrically connected to the first, second, and third through vias TVI1, TVI2, and TVI3, respectively. A fourth interlayer dielectric layer 140 may be formed on the third interlayer dielectric layer 130. A second metal layer M2 may be formed in the fourth interlayer dielectric layer 140.

A fifth interlayer dielectric layer 150 may be formed on the fourth interlayer dielectric layer 140. The fifth interlayer dielectric layer 150 may include, for example, a silicon-based dielectric material (e.g., silicon oxide, silicon nitride, or silicon oxynitride). Lower bonding pads BBP may be formed in the fifth interlayer dielectric layer 150. The lower bonding pads BBP may penetrate the fifth interlayer dielectric layer 150. The formation of the lower bonding pads BBP may include using a photolithography process to open one region on the passive element cell PDR, forming a metal layer that fills the open space, and performing a planarization process on the metal layer. Each of the lower bonding pads BBP may be connected to a corresponding second wiring line M2_I.

Referring to FIGS. 16A to 16F, a sixth interlayer dielectric layer 160 and a second substrate 170 may be formed on the fifth interlayer dielectric layer 150. The second substrate 170 and the sixth interlayer dielectric layer 160 may be manufactured in a space different from that in which the first substrate 100 is present, and then may be attached onto the fifth interlayer dielectric layer 150.

For example, first and second impurity regions HIR1 and HIR2 may be formed in the second substrate 170. A sixth interlayer dielectric layer 160 may be formed on the second substrate 170, and upper bonding pads TBP may be formed, which are connected to the first and second impurity regions HIR1 and HIR2, in the sixth interlayer dielectric layer 160. For example, the upper bonding pads TBP may penetrate the sixth interlayer dielectric layer 160, and may be exposed by opposing surfaces of the sixth interlayer dielectric layer 160. Afterwards, the second substrate 170, the sixth interlayer dielectric layer 160, and the upper bonding pads TBP may be overturned to reside on the fifth interlayer dielectric layer 150. The sixth interlayer dielectric layer 160 and the fifth interlayer dielectric layer 150 may be attached to connect the upper bonding pads TBP to corresponding lower bonding pads BBP.

Figure 17A:
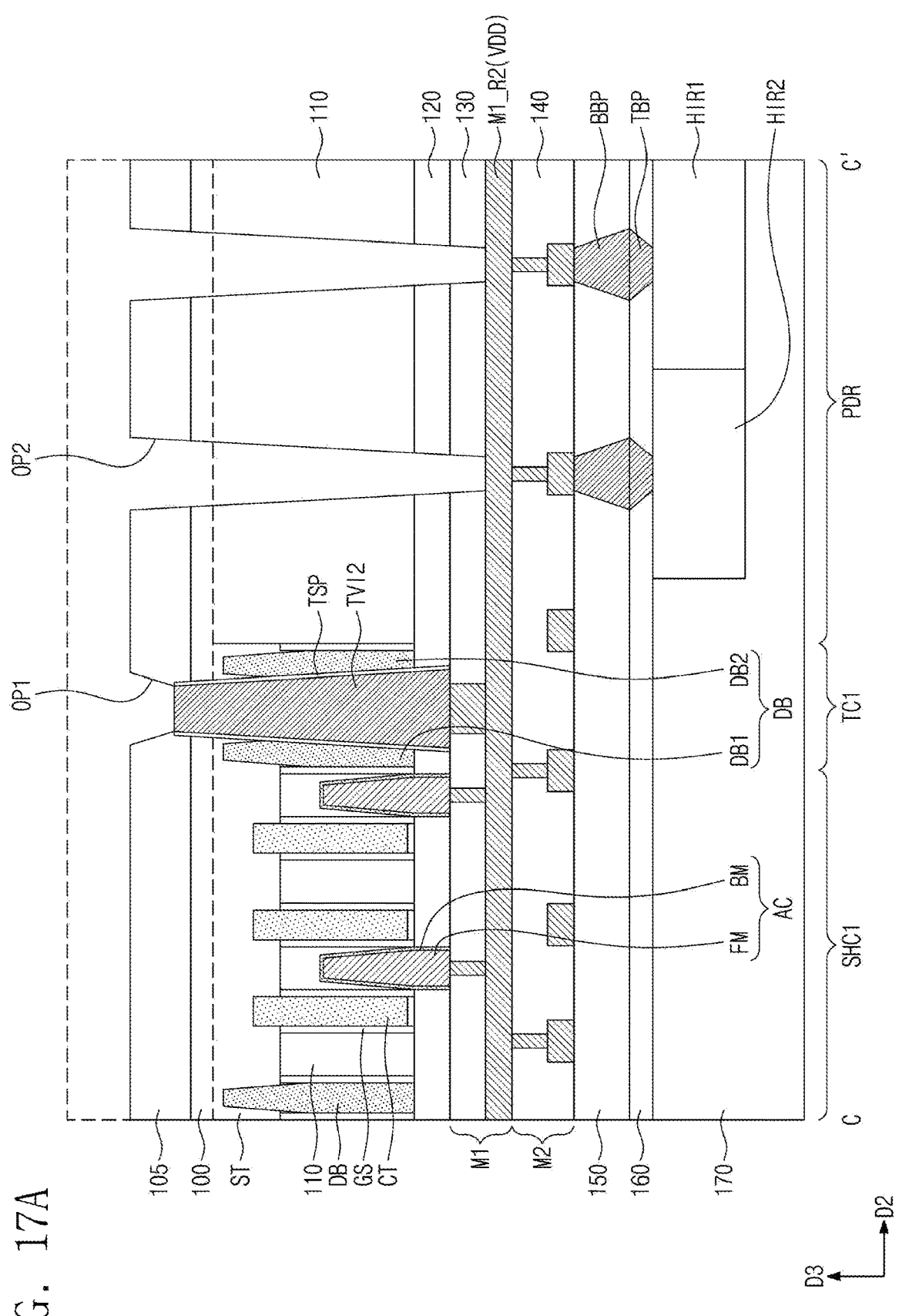
Figure 17B:
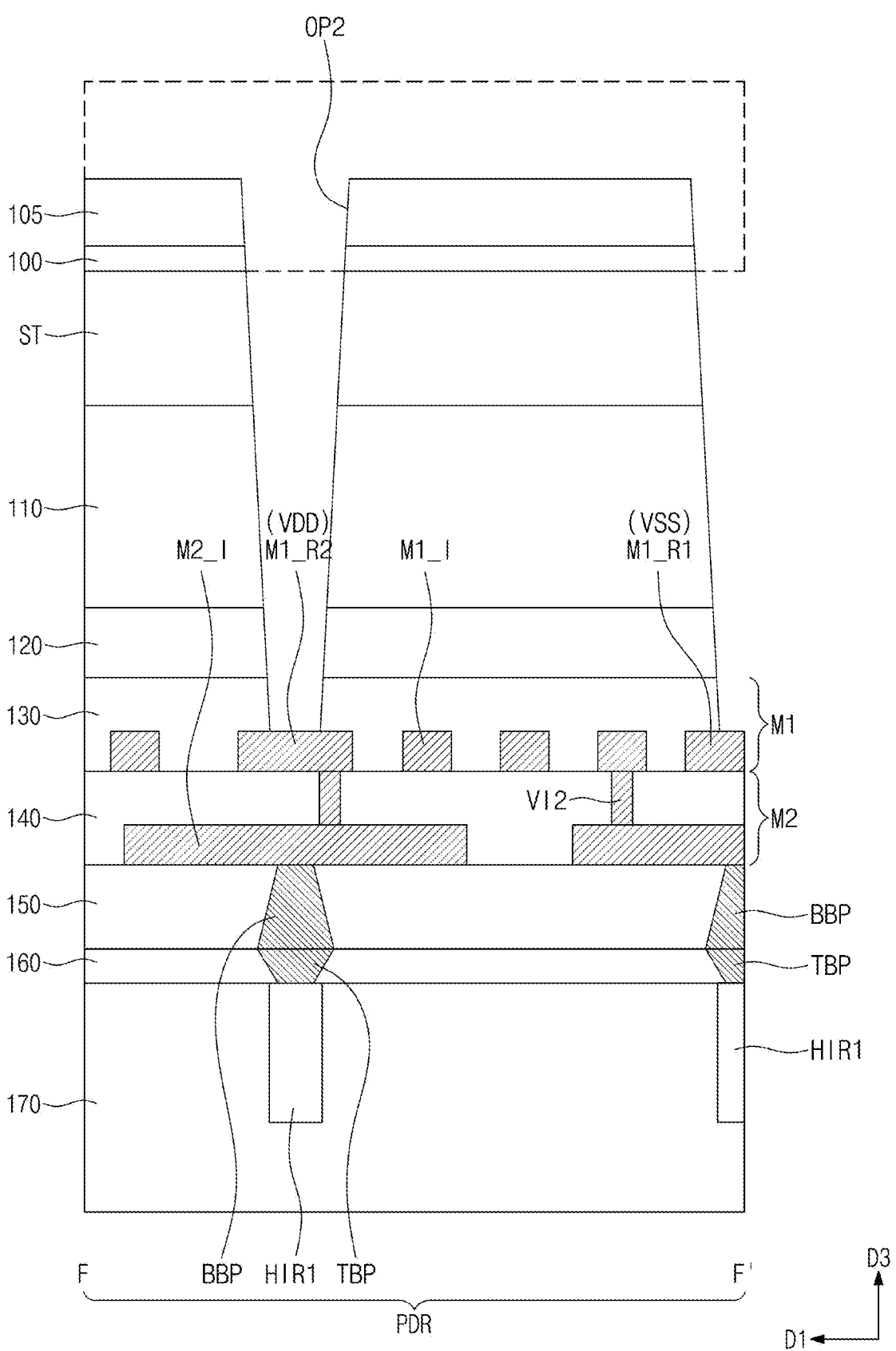

Referring to FIGS. 17A and 17B, the first substrate 100 may be turned upside down to expose a bottom surface 100b of the first substrate 100. The bottom surface 100b of the first substrate 100 may undergo a planarization process to reduce a thickness of the first substrate 100. The planarization process may continue until the through vias TVI1 to TVI3 are exposed.

A lower dielectric layer 105 may be formed on the bottom surface 100b of the first substrate 100. The lower dielectric layer 105 may be patterned to form first openings OP1 and second openings OP2. The first openings OP1 may penetrate the lower dielectric layer 105 to expose top surfaces of the through vias TVI1 to TVI3. The top surfaces of the through vias TVI1 to TVI3 depicted in FIG. 17A may indicate bottom surfaces of the through vias TVI1 to TVI3 depicted in FIG. SC. The second openings OP2 may penetrate the lower dielectric layer 105, the first substrate 100, the device isolation layer ST, and the first, second, and third interlayer dielectric layers 110, 120, and 130 to correspondingly expose the first, second, and third power lines M1_R1, M1_R2, and M1_R3.

Referring back to FIGS. 5A to 5F, the first openings OP1 may be filled with metal to form lower through vias LVI1, LVI2, and LVI3. The lower through vias LVI1 to LVI3 may be connected to the through vias TVI1 to TVI3, respectively. For example, the lower through vias LVI1 to LVI3 may be directly connected to the through vias TVI1 to TVI3, respectively.

The second openings OP2 may be filled with metal to form first, second, and third through contacts PSC1, PSC2, and PSC3. The first, second, and third through contacts PSC1, PSC2, and PSC3 may be connected to the first, second, and third power lines M1_R1, M1_R2, and M1_R3, respectively. For example, the first, second, and third through contacts PSC1, PSC2, and PSC3 may be directly connected to the first, second, and third power lines M1_R1, M1_R2, and M1_R3, respectively.

After that, a power delivery network layer PDN may be formed on the lower dielectric layer 105. The power delivery network layer PDN may be formed to apply a source voltage or a drain voltage to the first, second, and third power lines M1_R1, M1_R2, and M1_R3. An external connection terminal OUT may be formed on the power delivery network layer PDN. Thereafter, the first substrate 100 and the second substrate 170 may be turned upside down again.

In a semiconductor device according to embodiments of the present inventive concept, a second substrate may be disposed on a first substrate, and the second substrate may be provided with an impurity region that constitutes a passive element. As the impurity region is provided in the second substrate, it may be possible to reduce a thickness of the first substrate including logic cells. In conclusion, the semiconductor device may improve in electrical properties.

While the present inventive concept has been particularly shown and described with reference to example embodiments thereof, it will be apparent to those of ordinary skill in the art that various changes in form and detail may be made thereto without departing from the spirit and scope of the present inventive concept.

What is claimed is:

1. A semiconductor device, comprising:
a first substrate that includes a first region and a second region;
an active pattern disposed on the first region;

a source/drain pattern disposed on the active pattern;
a through contact disposed on the second region;
a first metal layer disposed on the through contact;
a second substrate disposed on the first metal layer, wherein the second substrate includes an impurity region;
a lower bonding pad disposed between the first metal layer and the second substrate;
an upper bonding pad disposed on the lower bonding pad; and
a power delivery network layer disposed on a bottom surface of the first substrate,
wherein the lower bonding pad and the upper bonding pad are in contact with each other,
wherein the through contact is connected to the lower bonding pad, and
wherein the impurity region is connected to the upper bonding pad.

2. The semiconductor device of claim 1, wherein the first metal layer includes a power line, and the through contact is connected to the power line.

3. The semiconductor device of claim 2, further comprising a second metal layer disposed on the first metal layer,
wherein the second metal layer includes wiring lines and vias that are connected to the wiring lines,
wherein the wiring lines are connected to the lower bonding pad, and
wherein the vias are connected to the power line.

4. The semiconductor device of claim 2, further comprising a through via disposed on the first region and spaced apart from the source/drain pattern,
wherein the through via is electrically connected to the power line and vertically extends to penetrate the first substrate, and
wherein a top surface of the through contact is higher than a top surface of the through via.

5. The semiconductor device of claim 4, further comprising a lower through via disposed between the through via and the power delivery network layer,
wherein the lower through via is connected to the through via, and
wherein a bottom surface of the through contact is substantially coplanar with a bottom surface of the lower through via.

6. The semiconductor device of claim 1, wherein the source/drain pattern includes a pair of neighboring source/drain patterns,
wherein the semiconductor device further comprises a through via laterally spaced apart from the pair of source/drain patterns, and
wherein the through via penetrates an interlayer dielectric layer that is disposed between the pair of source/drain patterns.

7. The semiconductor device of claim 1, further comprising:
a lower dielectric layer disposed on the bottom surface of the first substrate; and
a lower power line disposed in the lower dielectric layer,
wherein the through contact is connected to the lower power line.

8. The semiconductor device of claim 7, further comprising:
an active contact disposed on the first region and connected to the source/drain pattern; and
a lower contact disposed on the lower power line,
wherein the active contact is connected to the lower power line through the lower contact.

9. The semiconductor device of claim 8, further comprising a second metal layer disposed between the first metal layer and the lower bonding pad, wherein the first metal layer includes a first wiring line, wherein the second metal layer includes a via connected to the first wiring line and a second wiring line, wherein the first wiring line is connected to the through contact, and wherein the second wiring line is connected to the lower bonding pad.

10. The semiconductor device of claim 1, wherein the power delivery network layer includes a lower wiring line connected to the through contact, and the through contact includes a material that is the same as a material of the lower wiring line.

11. A semiconductor device, comprising:

a first substrate that includes a first region and a second region;

an active pattern disposed on the first region;

a source/drain pattern disposed on the active pattern;

a first through contact and a second through contact disposed on the second region, wherein the first through contact and the second through contact are spaced apart from each other;

a first metal layer disposed on the first and second through contacts;

a second substrate disposed on the first metal layer, wherein the second substrate includes a first impurity region and a second impurity region, wherein the first impurity region includes impurities having a first conductivity type, and the second impurity region includes impurities having a second conductivity type;

a plurality of lower bonding pads disposed between the first metal layer and the second substrate;

a plurality of upper bonding pads disposed on the lower bonding pads; and a power delivery network layer disposed on a bottom surface of the first substrate, wherein the first and second through contacts are electrically connected to the first and second impurity regions, respectively, and wherein the impurities having the first conductivity type are different from the impurities having the second conductivity type.

12. The semiconductor device of claim 11, wherein the first metal layer includes a power line, and the first and second through contacts are connected to the power line.

13. The semiconductor device of claim 12, wherein the first and second through contacts are electrically connected to the power delivery network layer.

14. The semiconductor device of claim 12, further comprising a through via disposed on the first region and electrically connected to the power line, wherein the through via is spaced apart from the first and second through contacts and vertically extends to penetrate the first substrate, and wherein top surfaces of the first and second through contacts are at a vertical level that is lower than a vertical level of a top surface of the through via.

15. The semiconductor device of claim 11, wherein the first impurity region and the second impurity region form a PN junction.

16. The semiconductor device of claim 11, further comprising:

a third through contact disposed on the second region and spaced apart from the first and second through contacts; and a third impurity region spaced apart from the first impurity region with the second impurity region disposed therebetween, wherein the third impurity region includes impurities having the first conductivity type.

17. The semiconductor device of claim 16, wherein the third through contact is electrically connected to the third impurity region.

18. The semiconductor device of claim 11, further comprising a lower power line disposed between the first substrate and the power delivery network layer, wherein the first and second through contacts are connected to the lower power line.

19. A semiconductor device, comprising:

a first power line and a second power line disposed on a first substrate and spaced apart from each other in a first direction, wherein the first and second power lines extend parallel to each other in a second direction;

a logic cell and a passive element cell disposed between the first and second power lines and spaced apart from each other in the second direction;

a first active pattern and a second active pattern disposed on the logic cell and spaced apart from each other in the first direction;

a first channel pattern and a first source/drain pattern disposed on the first active pattern;

a second channel pattern and a second source/drain pattern disposed on the second active pattern, wherein the second source/drain pattern has a conductivity type different from a conductivity type of the first source/drain pattern;

a gate electrode disposed on the first and second channel patterns;

a gate dielectric layer disposed between the gate electrode and the first and second channel patterns;

a gate spacer disposed on a sidewall of the gate electrode;

a gate capping pattern disposed on the gate electrode;

an interlayer dielectric layer that covers the first and second source/drain patterns and the gate capping pattern;

an active contact that penetrates the interlayer dielectric layer and is electrically connected to a corresponding one of the first and second source/drain patterns;

a gate contact that penetrates the interlayer dielectric layer and the gate capping pattern and is electrically connected to the gate electrode;

a first through contact and a second through contact disposed on the passive element cell and respectively connected to the first and second power lines;

a second substrate disposed on the first and second through contacts, wherein the second substrate includes a first impurity region and a second impurity region that have different conductivity types from each other;

a plurality of lower bonding pads disposed between the second substrate and the first and second through contacts and a plurality of upper bonding pads disposed on the lower bonding pads; and a power delivery network layer disposed on the first substrate, wherein the lower bonding pads are correspondingly in contact with the upper bonding pads, and wherein the first and second through contacts are electrically connected to the first and second impurity regions, respectively, through the lower and upper bonding pads.

20. The semiconductor device of claim 19, wherein a width of each of the first and second through contacts increases as a distance from the power delivery network layer decreases.

\* \* \* \* \*